US008600927B2

(12) United States Patent
Stergiou et al.

(10) Patent No.: US 8,600,927 B2
(45) Date of Patent: Dec. 3, 2013

(54) WINDOW ALGORITHM USING MAXIMAL PARALLELIZATION

(75) Inventors: Stergios Stergiou, East Palo Alto, CA (US); Jawahar Jain, Los Altos, CA (US)

(73) Assignee: Fujitsu Limited, Kawasaki-shi (JP)

( * ) Notice: Subject to any disclaimer, the term of this patent is extended or adjusted under 35 U.S.C. 154(b) by 381 days.

(21) Appl. No.: 12/901,983

(22) Filed: Oct. 11, 2010

(65) Prior Publication Data

US 2012/0089560 A1 Apr. 12, 2012

(51) Int. Cl.
*G06N 5/02* (2006.01)

(52) U.S. Cl.
USPC ........................................... 706/59

(58) Field of Classification Search
None
See application file for complete search history.

(56) References Cited

U.S. PATENT DOCUMENTS

| | | | |
|---|---|---|---|
| 7,506,278 B1 | 3/2009 | Rjimati | |
| 8,161,268 B2 | 4/2012 | Faraj | |
| 2002/0174405 A1 | 11/2002 | Janssen | |
| 2004/0103378 A1 | 5/2004 | Jain | |
| 2005/0229124 A1 | 10/2005 | Farkash | |
| 2010/0050145 A1 | 2/2010 | Baumgartner | |
| 2011/0078104 A1 | 3/2011 | Honkola | |

OTHER PUBLICATIONS

Felt, York, Brayton, Sangiovanni-Vincentelli, "Dynamic Variable Reorderig for BDD Minimization". Design Automation Conference, with EURO-VHDL '93, Proceedings EURO-DAC '93, European, Sep. 1993, pp. 130-135.*

Snape, "Loopless Functional Algorithms", Computing Laboratory, University of Oxford, Oxford, UK, Thesis submitted for MS, 2005, pp. 1-78.*
Sun, Li, "Medical Image Compression Based on Ordered Binary Decision Diagrams", Education Technology and Computer Science, 2009. ETCS '09. First International Workshop on, 2009, pp. 373-376.*
Jensen, "BDDNOW: A Parallel BDD Package", FMCAD '98 Proceedings of the Second International Conference on Formal Methods in Computer-Aided Design, Springer-Verlag, London, UK, 1998, pp. 501-507.*
Lee, RajaseKaran, "Fast Parallel Deterministic and Randomized Algorithms for Model Checking", University of Pennsylvania Department of Computer and Information Science Technical Report No. MS-CIS-93-09, Jan. 1993, pp. 1-21.*
European Search Report for EP Application No. 11184514.5, Feb. 1, 2012.
European Search Report for EP Application No. 11184752.1, Feb. 24, 2012.
European Search Report for EP Application No. 11184523.6, Feb. 1, 2012.

(Continued)

*Primary Examiner* — Kakali Chaki
*Assistant Examiner* — Walter Hanchak
(74) *Attorney, Agent, or Firm* — Baker Botts L.L.P.

(57) ABSTRACT

One embodiment accesses a binary decision diagram (BDD) representing a function having n variables, where n≥2, wherein the BDD comprises n layers corresponding to the n variables, respectively; and reorders the n variables of the BDD by iteratively and alternating reordering k consecutive layers, where 1<k≤n, until a size of the BDD has reached a desired threshold, wherein each iteration comprises: selects k consecutive layers from the n layers, wherein the k consecutive layers selected during a current iteration differ from the k consecutive layers selected during a previous iteration immediately preceding the current iteration; determines a locally optimum variable order of the k consecutive layers; and reorders the k consecutive layers according to the locally optimum variable order of the k consecutive layers.

28 Claims, 40 Drawing Sheets

(56) References Cited

OTHER PUBLICATIONS

Office Action for U.S. Appl. No. 12/901,685, Apr. 4, 2012.
Milvang-Jensen, Kim et al., "BDDNOW: A Parallel BDD Package," in *Formal Methods in Computer-Aided Design*, v. 1522, pp. 501-507, Jan. 1, 1998.
Fey, Gorchwin et al., "Minimizing the Number of Paths in BODs: Theory and Algorihtm." *IEEE Transactions on Computer-Aided Design of Integrated circuits and systems*. vol. 25, No. 1, http://ieeexplore.ieee.org/stamp/stamp.jsp?tp=&arnumber=1564299, Jan. 2006 Downloaded Jun. 27, 2012.
Jacobi, Ricardo et al. "Incremental Reduction of Binary Decision Diagrams." Circuits and Systems, 1991. *IEEE International Symposium*, http://ieeexplore.ieee.org/stamp/stamp.jsp?tp=&arnumber=176226, Nov. 14, 1991 Downloaded Mar. 27, 2012.
Campos, S. et al., "Timing Analysis of Industrial Real time Systems" *IEEE*, http://ieeexplore. ieee.org/stamp/stamp.jsp?tp=&arnumber=515482, 1995 Downloaded Mar. 27, 2012.
U.S. Appl. No. 12/904,685, filed Oct. 11, 2010, Stergiou.
U.S. Appl. No. 12/901,721, filed Oct. 11, 2010, Stergiou.
U.S. Appl. No. 12/901,779, filed Oct. 11, 2010, Stergiou.
U.S. Appl. No. 12/901,857, filed Oct. 11, 2010, Stergiou.
U.S. Appl. No. 12/901,957, filed Oct. 11, 2010, Stergiou.
U.S. Appl. No. 12/902,037, filed Oct. 11, 2010, Stergiou.
Knuth, D., "The art of computer programming," vol. 4, 2009.
Rudell, R., "Dynamic variable ordering for ordered binary decision diagrams," *Proceedings of IEEE/ACM International Conference on Computer-Aided Design*, pp. 42-47, 1993.
Friedman, S. J. et al., "Finding the optimal variable ordering for binary decision diagrams," *IEEE Transactions on Computers*, No. 39, pp. 710-713, 1990.
Fujita, M. et al., "On variable ordering of binary decision diagrams for the application of multi-level logic synthesis," *Proceedings of the European Conference on Design Automation*, pp. 50-54, Feb. 1991.
Ishiura, N. et al., , "Minimization of binary decision diagrams based on exchange of variables," *International Conference on Computer-Aided Design*, pp. 472-475, 1991.
Nevo, Z. et al., "Distributed Dynamic BDD Reordering", *DAC*, 2006.
European Search Report for EP Application No. 11184753.9, Jul. 19, 2012.
European search report for EP Application No. 11184731.5, Jul. 16, 2012.
Bryant, Randal E et al., "Ordered binary decision diagrams in electronic design automation, Foundations, Applications and Innovations," *Logic Synthesis and Verification*, Jan. 1, 2002.
Felt, Eric et al., Dynamic Variable Reordering for BDD Minimization, *Proceedings European Design Automation Conference*, 1993.
Jain, J. et al., "A survey of techniques for formal verification of combinational circuits", Proceedings of 1997 IEEE International Conference on Computer Design: *VLSI in Computers and Processors*, Oct. 1997.
Lu, Yuan et al: "Efficient variable ordering using aBDD based sampling", Proceedings of the 37th Conference on Design Automation, *DAC '00*, Jan. 2000.
Meinel, C. et al., "Speeding Up Variable Reordering of OBDDs", *1997 IEEE International Conference on Computer design: VLSI in computers and Processors*, ICCD '97, Oct. 1997.
Narayan, A. et al., "Partitioned ROBDDs—a Compact, Canonical and Efficiently Manipulable Representation for Boolean Functions", 1996 IEEE/ACM International Conference on Computer-Aided Design, 1996. *ICCAD-96 Digest of Technical Papers*, Nov. 1996.
Yeh, F-M. et al: "Variable ordering for ordered binary decision diagrams by a divide-and-conquer approach", *IEE Proceedings: Computers and Digital Techniques*, IEE, GB, vol. 144, No. 5, Sep. 23, 1997.
European Search Report for EP Application No. 11184512.9, Feb. 6, 2012.
Mingquan, Wang et al., "BDD Minimization Based on Genetic Tabu Hybrid Strategy," *IEEE*, v. 2, pp. 870-873, Oct. 24, 2005.
Panda, Shipra et al., "Who are the Variables in Your Neighborhood," *International Conference on Computer-Aided Design (ICCAD)*, IEEE, pp. 74-77, Nov. 5, 1995.
Brudaru, Octav et al., "Optimizing Variable Ordering of BDDs with Double Hybridized Embryonic Genetic Algorithm," *12th International Symposium on Symbolic and Numeric Algorithms for Scientific Computing, IEEE*, pp. 167-173, Sep. 23, 2010.
Stergiou, Stergios et al., Dynamically Resizable Binary Decision Diagrams, *Proceedings of the 20th Symposium on Great Lakes Symposium on VLSI, GLSVLSI 10*, pp. 185-188, May 2010.
Stergiou, Stergios, "Implicit Permutation Enumeration Networks and Binary Decision Diagrams Reordering," *Design Automation Conference (DAC), 48th ACM/EDAC/IEEE*, pp. 615-620, Jun. 2011.
Higuchi, Hiroyuki et al. "Lazy Group Sifting for Efficient Symbolic State Traversal of FSMs", IEEE, 1999.
Kunkle, Daniel et al. "Parallel Disk-Based Computation for Large, Monolithic Binary Decision Diagrams", PASCO, Jul. 2010.
Notice of Allowance for U.S. Appl. No. 12/901,779, Mar. 27, 2013.
Office Action for U.S. Appl. No. 12/901,957, Mar. 25, 2013.
Office Action for U.S. Appl. No. 12/902,037, Mar. 21, 2013.
Office Action for European Patent Application No. 11 184 753.9-1951, Apr. 9, 2013.
Office Action for European Patent Application No. 11 184 731.5-1951, Apr. 15, 2013.
Definition of "iteration". The American Heritage College Dictionary, Fourth Edition. pp. 737-738, 2004.
Definition of "iterate". Microsoft Computer Dictionary, Fifth Edition. p. 292, 2002.
Hett, A. et al. "MORE: an alternative implementation of BOD packages by multi-operand synthesis." Proceedings of the conference on European design automation. IEEE Computer Society Press, 1996.
Stornetta, A.L. "Implementation of an efficient parallel BOD package." Thesis, University of California, 1995.
Office Action for U.S. Appl. No. 12/901,721, May 10, 2013.

\* cited by examiner

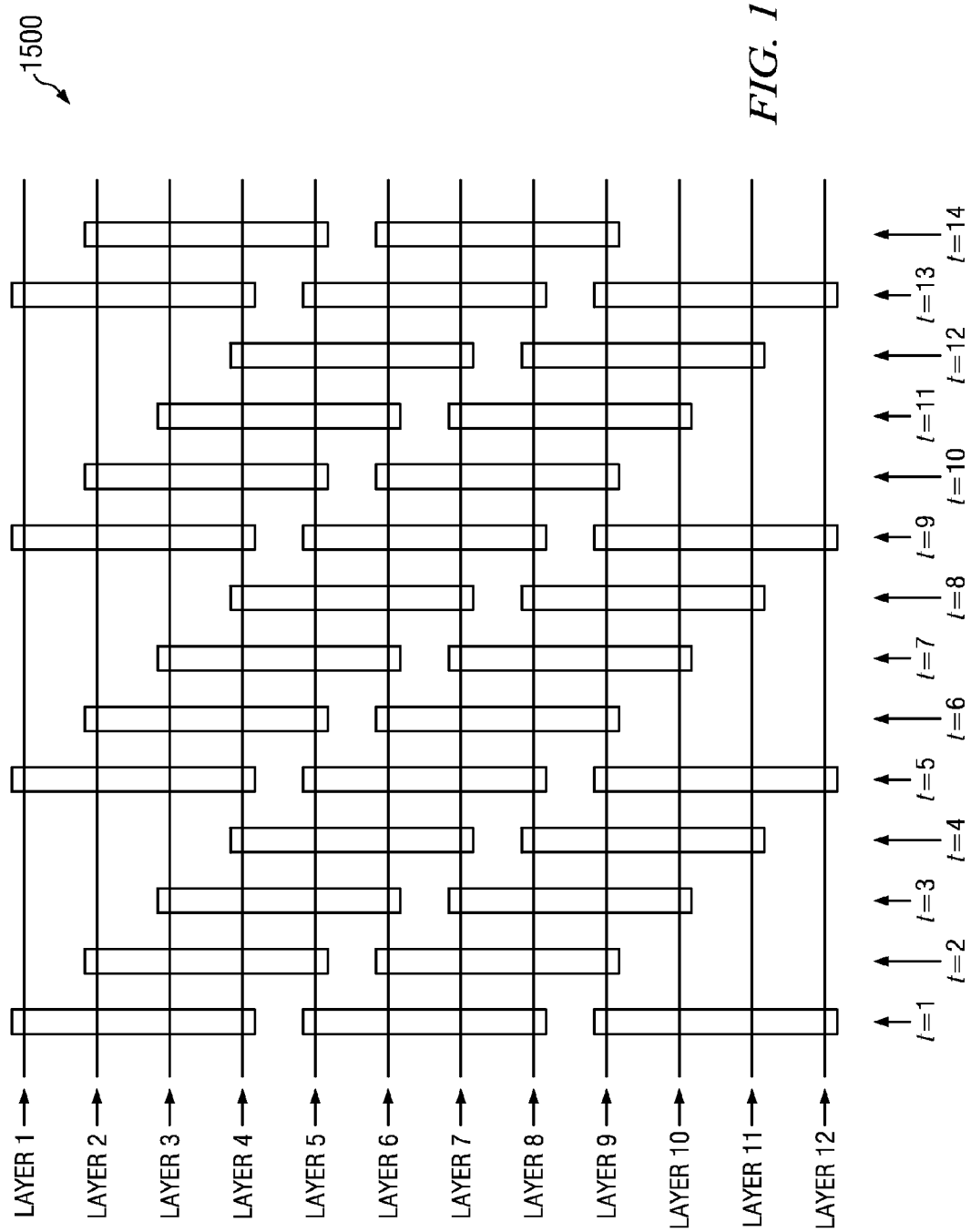

WINDOW ALGORITHM USING MAXIMAL PARALLELIZATION

TECHNICAL FIELD

This disclosure generally relates to binary decision diagrams (BDDs).

BACKGROUND

A Binary Decision Diagram (BDD) is a data structure that may be used to represent a Boolean function. A Reduced Ordered Binary Decision Diagram (ROBDD) is an optimized Binary Decision Diagram (BDD) that has no redundant nodes and isomorphic sub-trees and that the variables appear in the same order along each path from root to a terminal node. The size of a BDD is determined by both the Boolean function it represents and the order of the variables of the function. Consequently, variable ordering exposes a critical optimization problem as the size of a BDD often varies greatly as its variable order changes.

BRIEF DESCRIPTION OF THE DRAWINGS

FIG. 15B illustrates the Parallel Window Algorithm as applied to a BDD having twelve layers corresponding to twelve variables.

DESCRIPTION OF EXAMPLE EMBODIMENTS

A Binary Decision Diagram (BDD) is a data structure that may be used to represent a Boolean function. A BDD may be graphically represented as a rooted, directed, and acyclic graph having one or more internal decision nodes and two terminal nodes. Each decision node represents a different variable of the Boolean function, and is typically denoted as a circle in the graph. The two terminal nodes, a 0 terminal node and a 1 terminal node, are typically denoted as a square each in the graph. Each decision node has two edges, a 0 edge, typically denoted as a dash line or a dotted line in the graph, and a 1 edge, typically denoted as a solid line in the graph. Each edge may be connected to another decision node or to one of the terminal nodes.

Each path in the graph may by formed by one or more decision nodes and their associated edges, and eventually leads to either the 0 terminal node or the 1 terminal node. The decision nodes that form a particular path each represent a different variable of the Boolean function. That is, along a single path, no two decision nodes represent the same variable. A path that leads to the 0 terminal node indicates that the Boolean function evaluates to FALSE for the values assigned to the variables represented by the decision nodes on the path, and a path that leads to the 1 terminal node indicates that the Boolean function evaluates to TRUE for the values assigned to the variables represented by the decision nodes on the path.

Figure 1:
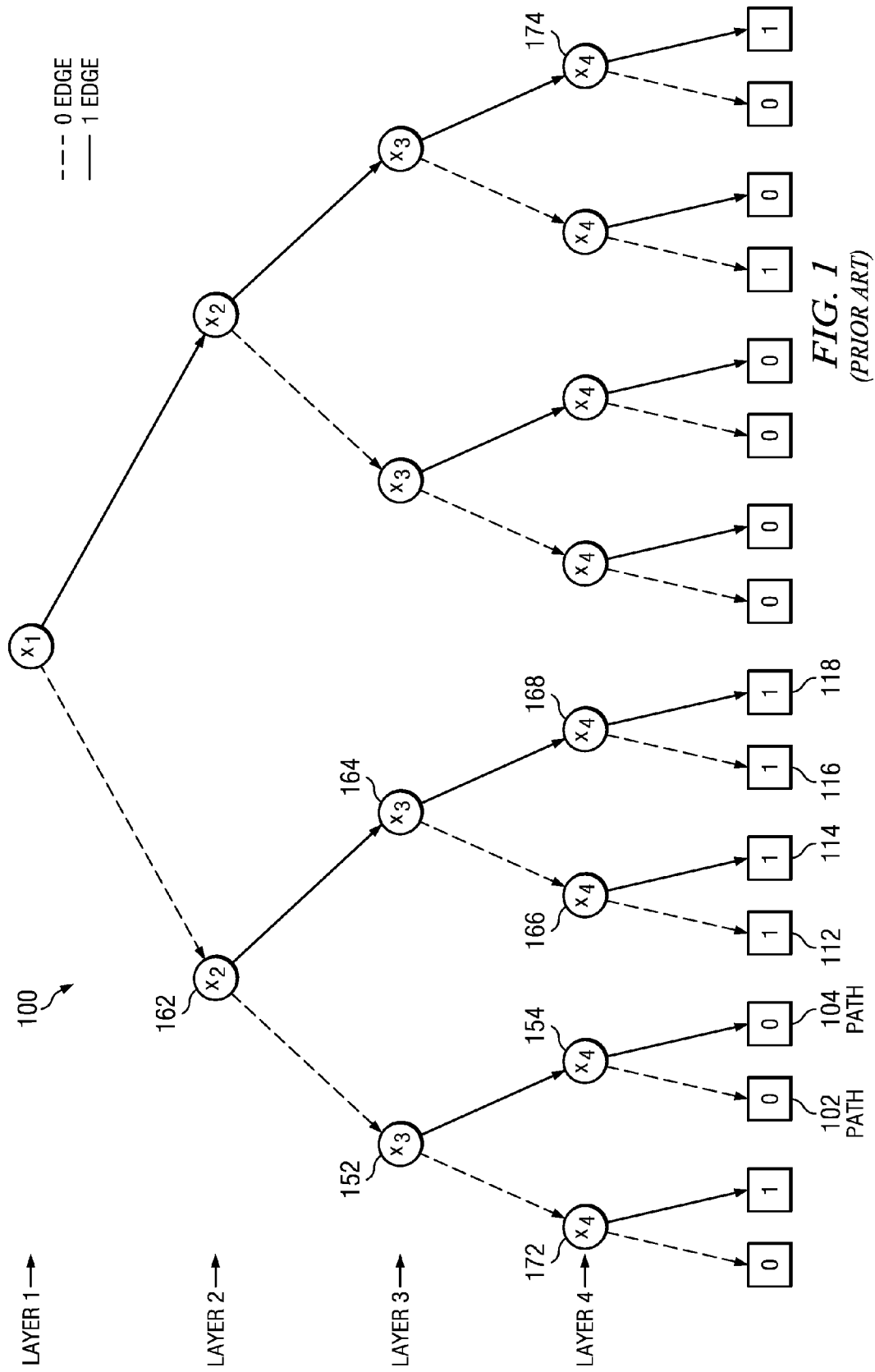
FIG. 1 (prior art) illustrates a BDD that represents a Boolean function that has four variables.

FIG. 1 illustrates an example BDD 100 that represents a Boolean function having four variables: $x_1$, $x_2$, $x_3$ and $x_4$. Since the Boolean function represented by BDD 100 has four variables, BDD 100 has at most four decision-node layers, layers 1-4. That is, there are at most four layers in BDD 100 that each have at least one decision node. More specifically, in FIG. 1, the decision node that represents variable $x_1$ is at layer 1 of BDD 100; the decision nodes that represent variable $x_2$ are at layer 2 of BDD 100; the decision nodes that represent variable $x_3$ are at layer 3 of BDD 100; and the decision nodes that represent variable $x_4$ are at layer 4 of BDD 100. Each path in BDD 100, formed by the decision nodes and their associated edges, leads to either the 0 terminal node or the 1 terminal node, indicating that the Boolean function evaluates to FALSE or TRUE, respectively. Note that for readability, the 0 terminal node and the 1 terminal node are duplicated multiple times in FIG. 1.

Figure 2:
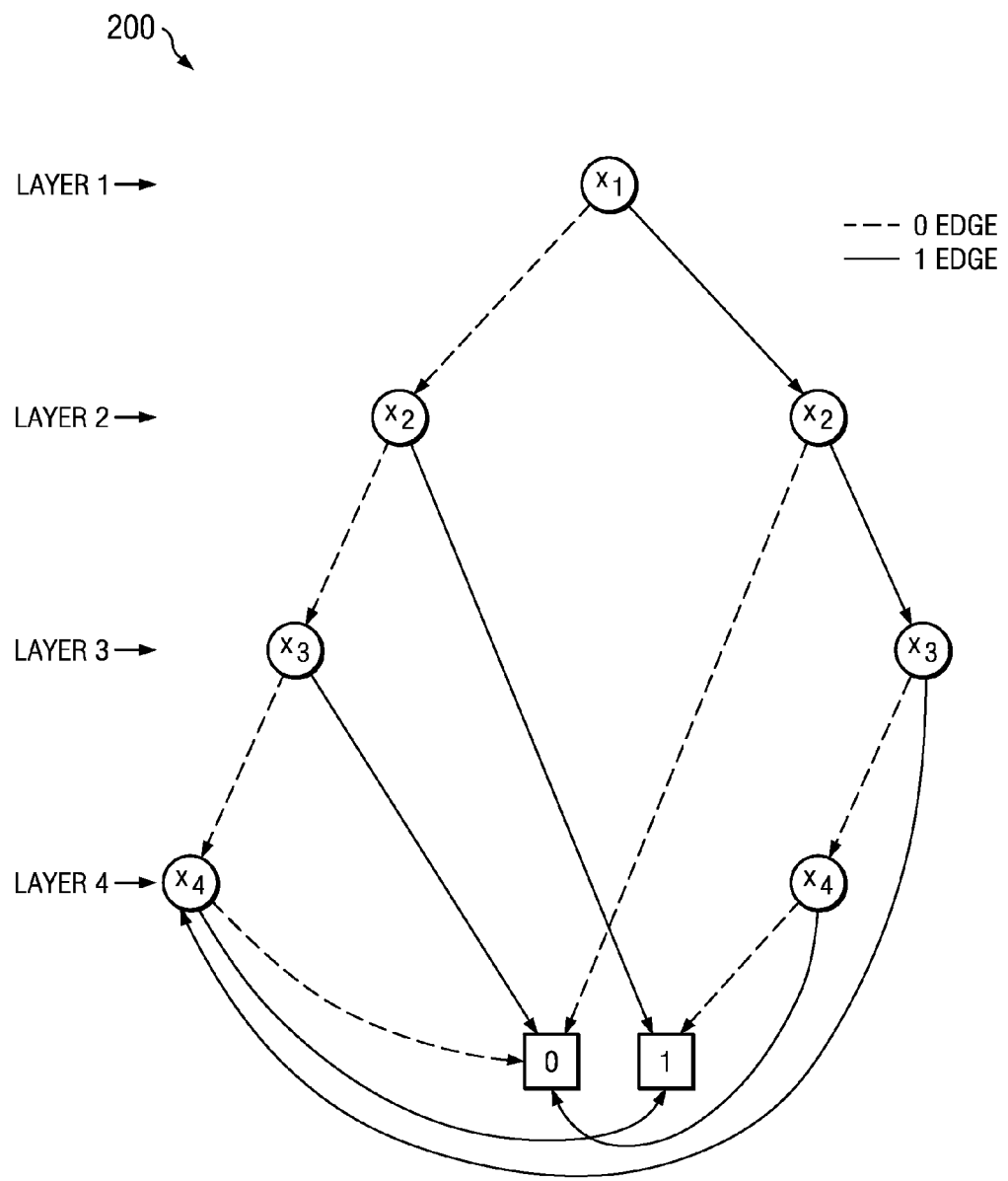
FIG. 2 (prior art) illustrates an optimized BDD that represents a Boolean function that has four variables.

BDD 100, in fact, is not the most optimized representation of the Boolean function as some of the nodes in BDD 100 are redundant and portions of BDD 100 are isomorphic. For example, consider paths 102 and 104, both of which end at the 0 terminal node. By examining the decision nodes on paths 102 and 104, it may be determined that as long as decision node 152, which represents variable $x_3$, branches along its 1 edge, the Boolean function evaluates to FALSE, regardless of along which branch decision node 154, which represents variable $x_4$, proceeds. Thus, decision node 154 may be replaced by the 0 terminal node. Similarly, paths 112, 114, 116, and 118 all end at the 1 terminal node. By examining the decision nodes on these four paths, it may be determined that as long as decision node 162, which represents variable $x_2$, branches along its 1 edge, the Boolean function evaluates to TRUE, regardless of along which branches decision node 164, which represents variable $x_3$, and decision nodes 166 and 168, which represent variable $x_4$, proceed. Thus, decision nodes 164, 166, and 168 may be replaced by the 1 terminal node. As another example, consider decision nodes 172 and 174, which both represent variable $x_4$. Decision node 172 and decision node 184 both have their 0 edge leading to the 0 terminal node and their 1 edge leading to the 1 terminal node. Therefore, they are duplicates or isomorphic of each other. Thus, one of them may be removed from BDD 100. FIG. 2 illustrates an example BDD 200 representing the same Boolean function as repressed by BDD 100, but is more optimized than BDD 100 because it uses less number of nodes to represent the same Boolean function as a result of removing the redundant decision nodes and the isomorphic portions of BDD 100.

A BDD whose redundant decision nodes and isomorphic sub-graphs have been removed and whose decision nodes appear in the same order from the root to the terminal nodes along all the paths in the BDD is referred to as a reduced ordered binary decision diagram (ROBDD). The advantage of a ROBDD is that it is canonical for a particular function and variable order, which makes it useful in various types of practical applications, such as in functional equivalence checking and functional technology mapping.

A ROBDD has two important properties. First, the ROBDD is ordered. That is, there is a fixed order $\pi\{1, \ldots, n\} \to \{x_1, \ldots, x_n\}$ such that for any non-terminal node v, index(low(v))$\pi$(k) with k>$\pi^{-1}$(index(v)) and index(high (v))=$\pi$(q) with q>$\pi^{-1}$(index(v)) hold if low(v) and high(v) are also non-terminal nodes. Second, the ROBDD is reduced. That is, there exists no non-terminal node v∈V with low(v)= high(v) and there are no two non-terminal nodes V and v' such that the sub-BDDs rooted by V and v' are isomorphic. Note that a non-terminal node is a decision node. For example, in FIG. 2, BDD 200 has 4 layers as it represents a Boolean function having 4 variables. Since BDD 200 is ordered, each layer contains the decision nodes that correspond to a particular variable. For example, layer 2 contains the decision nodes corresponding to variable $x_2$ only, and does not contain any decision node corresponding to another variable (e.g., $x_1$ or $x_3$ or $x_4$).

A Boolean function, $f(x_1, \ldots, x_n)$ may be partitioned into two or more Boolean functions, $f_1(x_1, \ldots, x_n)$ to $f_m(x_1, \ldots, x_n)$. Each of the Boolean functions $f_1$ to $f_m$ may be considered a partition of the original Boolean function $f$. If each of the Boolean functions $f_1$ to $f_m$ is represented by a BDD, then the BDD that represents the original Boolean function $f$ may be obtained by logically OR'ing all the BDDs that represent the partitions of f (i.e., $f_1$ to $f_m$). In particular embodiments, each of the BDDs that represent the Boolean functions $f_1$ to $f_m$ may be a ROBDD and may be referred to as a partitioned reduced ordered binary decision diagram (POBDD) with respect to the BDD that represents the original Boolean function $f$.

BDD Variable Order

The size of a BDD is determined by both the Boolean function it represents and the chosen order of the variables of the function. The size of a BDD is the sum of the sizes of all of its individual layers. In particular embodiments, the size of a BDD may be expressed in terms of the number of decision nodes in the BDD. Similarly, the size of a layer of a BDD may be expressed in terms of the number of decision nodes at that layer.

Figure 3:
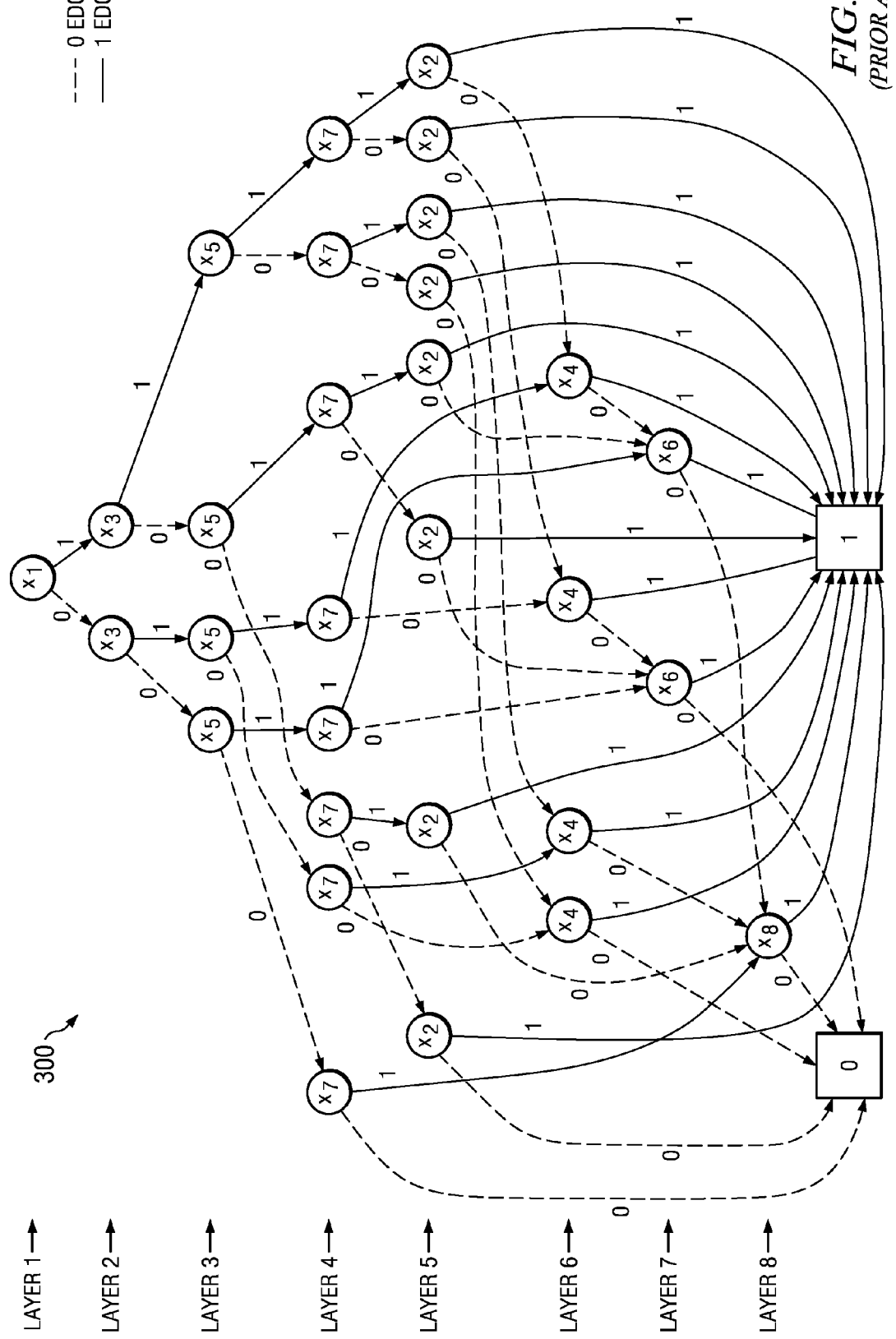
FIGS. 3-4 (prior art) illustrate two BDDs representing the same Boolean function but with different variable orders.
Figure 4:
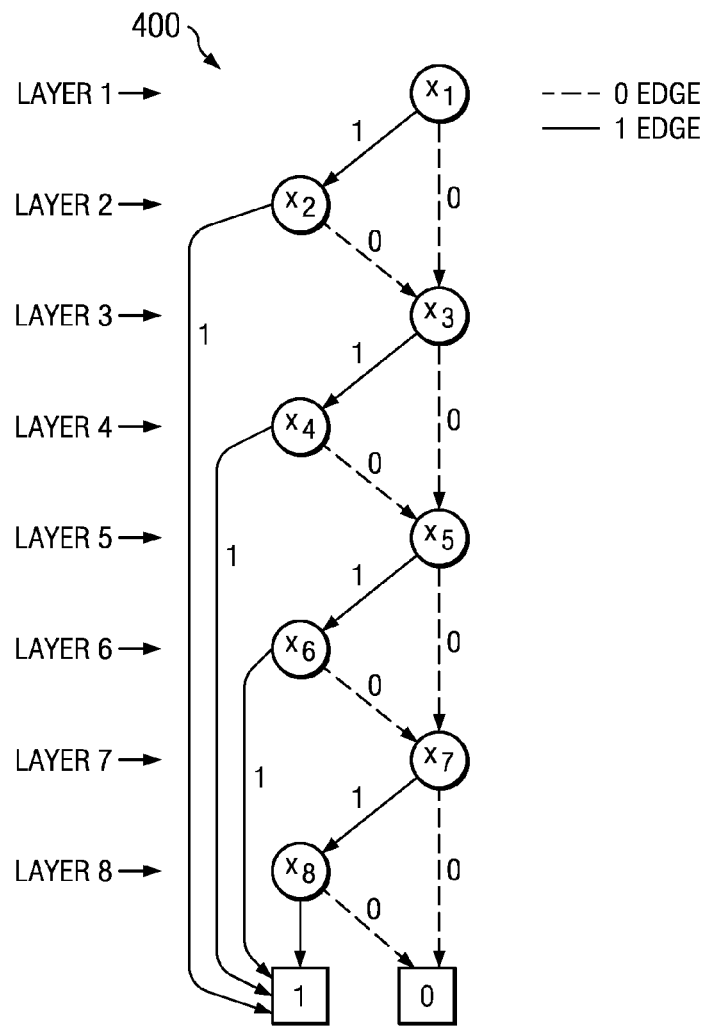

Given a Boolean function, $f(x_1, \ldots, x_n)$, represented by a BDD, depending upon the ordering of the variables, $x_1, \ldots, x_n$, the number of nodes in the graph is linear in the best case and exponential in the worst case, in terms of n. For example, for Boolean function $f(x_1, \ldots x_{2n})=x_1x_2+x_3x_4+ \ldots +x_{2n-1}x_{2n}$, using the variable order $x_1<x_3< \ldots <x_{2n-1}<x_2<x_4< \ldots <x_{2n}$, the BDD needs $2^{n+1}$ nodes to represent the Boolean function, as illustrated in FIG. 3. On the other hand, using the variable order $x_1<x_2<x_3<x_4< \ldots <x_{2n-1}<x_{2n}$, the BDD only needs 2n nodes to represent the same Boolean function, as illustrated in FIG. 4. As this example illustrates, variable ordering exposes a critical optimization problem for BDDs as the size of a BDD often varies greatly as its variable order changes.

Given a particular layer of a BDD, when a first variable (e.g., $x_1$) is positioned at that layer, the layer may have one size. When a second variable (e.g., $x_2$) is positioned at that same layer, the layer may have another, different size. In addition, given a particular layer (e.g., layer 3) of a BDD with a particular variable (e.g., $x_3$) positioned at that layer, the size of the layer in connection with the variable depends on the specific variables positioned at layers above (e.g., layers 1 and 2) and below (e.g., layer 4) that particular layer. Thus, for example, if variable $x_3$ is positioned at layer 3, when variables $x_1$ and $x_2$ are positioned at layers 1 and 2 and variable $x_4$ is positioned at layer 4, layer 3 in connection with variable $x_3$ may have one size. But when variables $x_4$ and $x_1$ are positioned at layers 1 and 2 and variable $x_2$ is positioned at layer 4, layer 3 in connection with variable $x_3$ may have another, different size, even though variable $x_3$ remains at layer 3.

There has been some amount of research concerning BDD variable ordering. The goal of BDD variable ordering is, in general, to find an optimum or substantially optimal ordering of the function variables such that the number of BDD nodes needed is minimized, thus reducing the size of the BDD representing the function. In general, in order to find the optimum variable order of a BDD where the size of the BDD is minimum, it may be necessary to test many if not all possible order permutations of the variables of the BDD so that the order permutation of the variables where the size of the BDD is the smallest may be found. This order permutation yields the optimum variable order for the BDD. Note that each specific order permutation of the variables indicates a different variable order of the BDD. In practice, however, finding all possible order permutations of the variables of a BDD, and thus finding all possible variable orders of the BDD, may be very expensive in terms of time and resources it requires since, for a BDD that represents a function of n variables, there are n! (n factorial, where n!=1×2× . . . ×n) possible order permutations of the variables.

To test different order permutations of the variables of a BDD, the variables of the BDD may be reordered using a suitable reordering algorithm. In their simplest form, reordering algorithms transform the current order permutation of variables of a BDD to another, different order permutation. The ending order permutation of the BDD may be, for example, specified by a person (e.g., according to some design specification or performance criteria) or determined based on the application in which the BDD is used. The majority of the research on BDD variable reordering algorithms or processes exploits the following property: two consecutive layers of a BDD can be efficiently swapped without affecting the rest of the BDD. By swapping two layers of the BDD, the order of the two corresponding variables at those two layers are also swapped, thus reordering two of the variables of the BDD with each swap. Variable reordering algorithms, therefore, transform a given BDD by applying local swaps until some target objective is reached.

Figure 5:
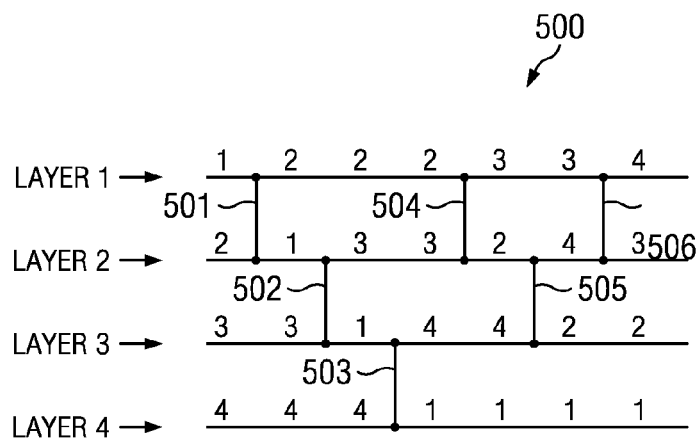
FIG. 5 (prior art) illustrates an example BDD variable reordering process as applied to a BDD representing a function having four variables.

FIG. 5 illustrates an example variable reordering process for BDDs. This is one of the most commonly used reordering algorithms, where it moves each variable to its correct final position by repeatedly performing swaps of two consecutive layers of a BDD. To simplify the discussion, the reordering algorithm is illustrated using a BDD 500 that represents a function having 4 variables, although the same algorithm may be applied to BDDs representing functions having any number of variables. Hereafter, in the figures, horizontal lines represent BDD layers, and vertical lines represent layer swaps. Since there are 4 variables, BDD 500 illustrates 4 horizontal lines corresponding to layers 1-4. Initially, BDD 500 has a first variable order, where variable 1 is at layer 1, variable 2 is at layer 2, variable 3 is at layer 3, and variable 4 is at layer 4. Suppose it is desirable to reorder the 4 variables of BDD 500 to achieve a second variable order, which is different from the initial first variable order, where variable 1 is at layer 4, variable 2 is at layer 3, variable 3 is at layer 2, and variable 4 is at layer 1.

To move variable 1 to layer 4, the reordering algorithm may first swap layers 1 and 2 (i.e., swap 501). After swap 501, variable 2 is at layer 1, and variable 1 is at layer 2. Next, layers 2 and 3 are swapped (i.e., swap 502), after which variable 3 is at layer 2, and variable 1 is at layer 3. Finally, layers 3 and 4 are swapped (i.e., swap 503). At this point, variable 1 is at layer 4, its desired position, and variable 4 is at layer 3. To move variable 2 to layer 3 (note that due to swap 501, variable 2 is currently at layer 1), layers 1 and 2 again are swapped (i.e., swap 504), after which variable 3 is at layer 1, and variable 2 is at layer 2. Next, layers 3 and 4 are swapped (i.e., swap 505). At this point, variable 2 is at layer 3, its desired position, and variable 4 is at layer 2. To move variable 3 to layer 2 (note that variable 3 is currently at layer 1), layers 1 and 2 are swapped (i.e., swap 506). At this point, variable 3 is at layer 2, and variable 4 is at layer 1. The desired second variable order has been achieved for BDD 500, and the reordering algorithm may end.

As FIG. 5 illustrated, it takes a total of 6 layer swaps to reorder the 4 variables of BDD 500 from the first variable order to the second variable order (i.e., to transform the BDD from the first variable order permutation to the second variable order permutation). Recall that two consecutive layers of a BDD can be swapped without affecting the rest of the BDD. Consequently, disjoint pairs of consecutive layers may be swapped concurrently since the swapping of one pair of consecutive layers does not affect any other layers and thus any other pairs of consecutive layers. A pair of consecutive layers in a BDD is any two layers that are next to each other (e.g., layers i and i+1 for $1 \leq i \leq n-1$). Two disjoint pairs of consecutive layers are two pairs of consecutive layers that do not share any common layer. (e.g., layers i and i+1 as one pair and layers i+2 and i+3 as another pair).

In FIG. 5, swap 503 between layers 3 and 4 is immediately followed by swap 504 between layers 1 and 2. Layers 3 and 4 and layers 1 and 2 are two disjoint pairs of consecutive layers as the two pairs of layers do not share any common layer. Therefore, swaps 503 and 504 may be performed concurrently (i.e. in parallel) since the two swaps do not affect each other (i.e., the two swaps do not depend on each other's results). On the other hand, swap 501 between layers 1 and 2 is immediately followed by swap 502 between layers 2 and 3. Layers 1 and 2 and layers 2 and 3 are not two disjoint pairs of consecutive layers as the two pairs share a common layer, layer 2. Therefore, swaps 501 and 502 cannot be performed concurrently since swap 502 requires the result of swap 501 before it can be performed.

Variable Reordering Algorithms

A variable order of a BDD indicates which variable of the function represented by the BDD is positioned at which layer of the BDD. An optimum variable order of a BDD is a particular ordering of the variables of the function represented by the BDD where the size of the BDD is minimum among all possible order permutations of the variables of the BDD. In general, a BDD may have one or more optimum variable orders. Given a BDD that represents a function having n variables, there are different algorithms or processes that may be used to find its optimum variable order or optimum variable orders.

Plain Changes Algorithm

A commonly used algorithm for determining the optimum variable order of a BDD is based on the transposition network algorithm named "plain changes". This is an exact algorithm because the algorithm is able to determine the exact optimum variable order for a given BDD (i.e., the variable order of the BDD that results in the BDD having the smallest size). With the Plain Changes Algorithm, all possible order permutations of the variables of a BDD are obtained, thereby detecting the one variable order where the BDD is of minimum size, and this one variable order is considered the optimum variable order of the BDD. For a BDD representing a function of n variables, the Plain Changes Algorithm requires that $n!-1$ swaps between two consecutive layers of the BDD to be performed in order to cover all possible n! order permutations of the variables. Note that a BDD always has an initial variable order; therefore, one order permutation of the variables is already obtained without requiring any layer swaps. Thereafter, the n variables of the BDD may be reordered using a suitable reordering algorithm to achieve the optimum variable order.

Figure 6:
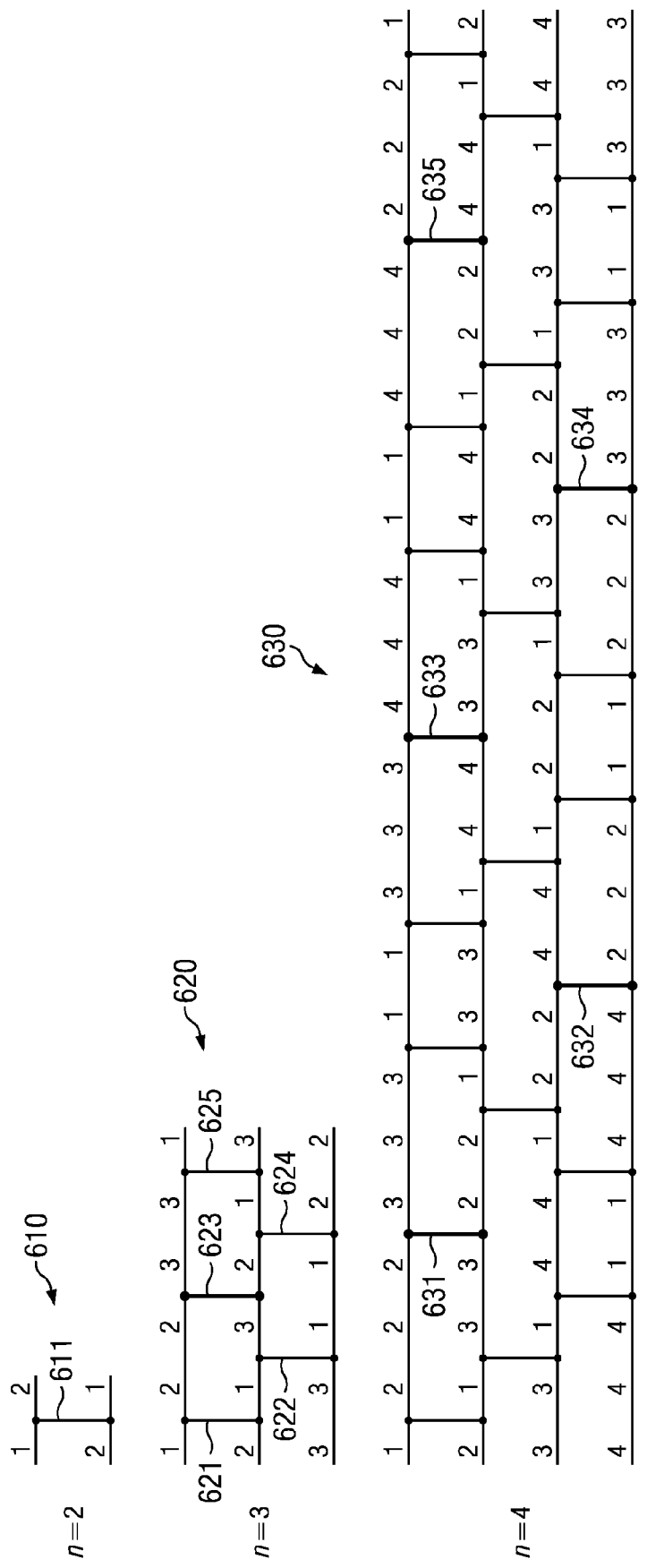
FIG. 6 (prior art) illustrates the Plain Changes Algorithm as applied to BDDs representing functions having two, three, and four variables respectively.

FIG. 6 illustrates the Plain Changes Algorithm, in terms of the layer swaps performed, applied to BDDs representing functions having two, three, and four variables, respectively. In FIG. 6, a BDD 610 has 2 layers corresponding to 2 variables (i.e., n=2). There are 2 (i.e., 2!) possible order permutations of the 2 variables for BDD 610, and it takes 1 layer swap to obtain the 2 possible order permutations of the 2 variables. To determine the optimum variable order for BDD 610, the size of BDD 610 having the initial, first variable order is determined and recorded. The two layers are swapped to obtain the second possible variable order. The size of BDD 610 having the second variable order is also determined and recorded. The two sizes are then compared, and the variable order resulting in the smaller size is selected as the optimum variable order of BDD 610.

A BDD 620 has 3 layers corresponding to 3 variables (i.e., n=3). There are 6 (i.e., 3!) possible order permutations of the 3 variables for BDD 620, and it takes 5 layer swaps to obtain the 6 possible order permutations of the 3 variables. To determine the optimum variable order for BDD 620, 6 sizes of BDD 620 corresponding to the 6 different variable orders are individually determined and recorded. The 6 sizes of are then compared, and the variable order resulting in the smallest size is selected as the optimum variable order of BDD 620.

A BDD 630 has 4 layers corresponding to 4 variables (i.e., n=4). There are 24 (i.e., 4!) possible order permutations of the 4 variables for BDD 630. A process similar to those described in connection with BDDs 610 and 620 may be applied to BDD 630 to determine the optimum variable order for BDD 630. In this case, there are 24 sizes of BDD 630 corresponding to the 24 different variable orders, and the variable order resulting in the smallest size is selected as the optimum variable order of BDD 630.

The Plain Changes Algorithm works inductively by constructing the layer swap sequence for n variables from the layer swap sequence for n−1 variables. For n variables, layer swaps (1, 2), (2, 3), . . . , (n−1, n) and (n−1, n), (n−2, n−1), . . . , (1, 2) are alternatingly added in between layer swaps from the sequence of layer swaps for n−1 variables. Thus, the layer swap sequence for 3 variables is constructed from the layer swap sequence for 2 variables. Swap 623 of BDD 620 between layers 1 and 2 corresponds to swap 611 of BDD 610. And in BDD 620, swaps between layers 1 and 2 (i.e., swap 621) and between layers 2 and 3 (i.e., swap 622) are added before swap 621; and swaps between layers 2 and 3 (i.e., swap 624) and between layers 1 and 2 (i.e., swap 625) are added after swap 621. Similarly, the layer swap sequence for 4 variables is constructed from the layer swap sequence for 3 variables. Swaps 631, 632, 633, 634, and 635 of BDD 630 correspond to swaps 621, 622, 623, 624, and 625 of BDD 620, respectively. And in BDD 630, swaps between layers 1 and 2, between layers 2 and 3, and between layers 3 and 4 and swaps between layers 3 and 4, between layers 2 and 3, and between layers 1 and 2 are alternatingly added in between swaps 631, 632, 633, 634, and 635.

As illustrated in FIG. 6, since most of the layers swaps performed depend on the layer swap that immediately precedes them, the Plain Changes Algorithm cannot be parallelized efficiently.

Sifting Algorithm

There are heuristic algorithms for determining a substantially optimal variable order of a BDD. Heuristic algorithms may not always be able to determine one optimum variable order of a BDD where the size of the BDD is at its smallest, but they are able to determine a substantially optimal variable order for the BDD where the size of the BDD is sufficiently small, such as below a desired threshold. A widely used heuristic algorithm is the Sifting Algorithm. It works by finding the optimum location for each variable of a BDD independently. Each variable of the BDD is moved (sifted) to the end layer that is closer to the initial layer where the variable is positioned. The variable is then moved to the opposite end layer of the BDD. Each time the variable is moved to a new layer, the size of the layer (e.g., in terms of the number of decision nodes on that layer) where the variable is currently positioned is determined and recorded. Thus, by moving the variable from one end layer to the other end layer of the BDD, the sizes of all the layers with the variable at these layers are determined. The layer that has the smallest size is considered the optimum layer (i.e., location) for the variable. Thereafter, the variable is moved to its optimum layer, which locally minimizes with size of the BDD with respect to the variable.

Figure 7:
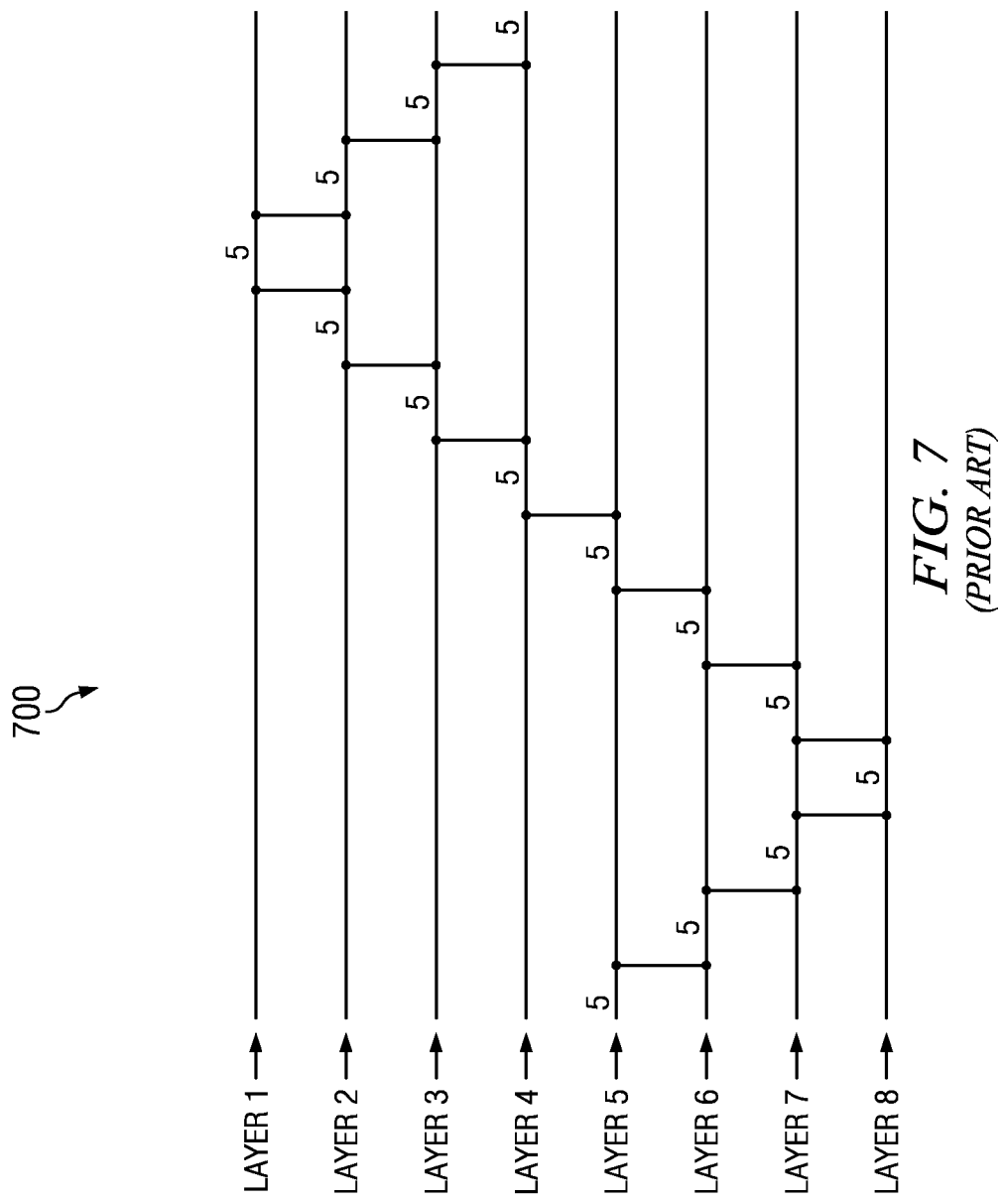
FIG. 7 (prior art) illustrates the Sifting Algorithm as applied to a BDD representing a function having eight variables.

FIG. 7 illustrates the sifting process as applied to one of the variables, variable 5, of a BDD 700 representing a function having eight variables. BDD 700 therefore has eight layers. Initially, variable 5 is at layer 5. The two end layers of BDD 700 are layer 1 and layer 8, since BDD 700 has a total of 8 layers. Layer 8 is closer to layer 5. Therefore, variable 5 is moved downward first, one layer at a time, until it is at layer 8. Then variable 5 is moved upward, again one layer at a time, until it is at layer 1. Note that to move variable 5 from one layer to another, adjacent layer, the two layers are swapped. For example, to move variable 5 from layer 5 to layer 6, layers 5 and 6 are swapped. It takes 10 layer swaps for variable 5 to traverse first down to layer 8 and then up to layer 1. By doing so, the size of each layer with variable 5 positioned at it may be determined, and the layer having the smallest size is selected as the optimum layer for variable 5. Suppose the optimum layer for variable 5 is layer 4. Then, variable 5 is moved from layer 1 back down to layer 4, which takes another 3 layer swaps.

The same process may be applied to each variable in turn to determine the optimum location for that variable. Each variable may be selected in turn based on the number of decision nodes that depend on it initially. For example, the algorithm may begin with the variable that initially has the largest number of decision nodes depending on it, determine the optimum position in the BDD (i.e., the layer) for this first variable using the above process, and move the first variable to its optimum layer. Then, the algorithm may repeat the process for another variable that initially has the second largest number of decision nodes depending on it, and move this second variable to its optimum layer. And so on, until all the variables have been moved to their respective optimum layers, or until the total size of the BDD is smaller than a desired or predefined threshold, or until further adjustment of the variable positions no longer significantly reduces the total size of the BDD (e.g., the difference in sizes of the BDD between two consecutive variable position adjustments is less than a predefined threshold). The Sifting Algorithm is also not parallelizable because each layer swap required for the sifting of a given variable depends on the one that immediately precedes it.

Window Algorithm

Another heuristic algorithm is the Window Algorithm. In generally, the Window Algorithm cannot detect the globally optimum variable order for BDDs, but has the desirable property of fast execution times. For a BDD that represents a function having n variables, a "window" of size k is used, where 2≤k<n. The algorithm iteratively and sequentially detects the optimum ordering of layers [1 . . . k], [2 . . . k+1], [3 . . . k+2] . . . [n−k+1 . . . n]. That is, for each window, the optimum ordering of the k consecutive layers within the window is determined, and the k consecutive layers within the window are reordered according to their optimum ordering. This may be done using the Plain Changes Algorithm described above in connection with FIG. 6. The process is iteratively and sequentially applied to each window (e.g., repeatedly using the Plain Changes Algorithm) until the total size of the BDD is smaller than a desired or predefined threshold, or until further adjustments of the variables within a window no longer significantly reduces the total size of the BDD, or until no further size improvement is possible.

Figure 8:
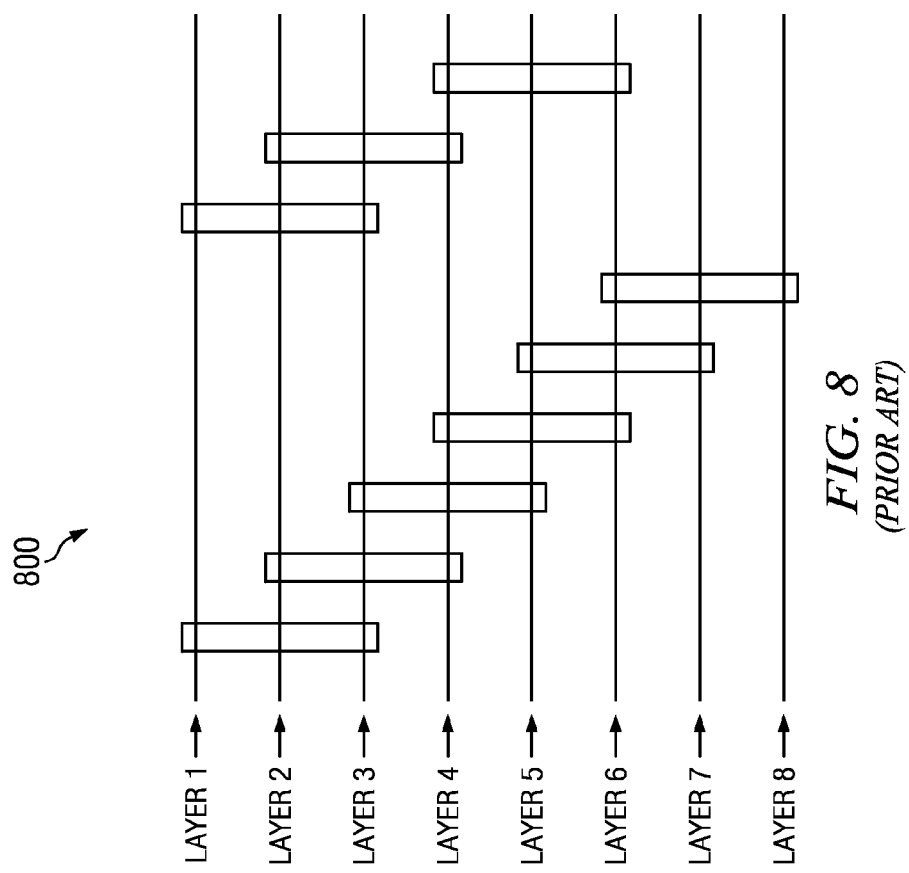
FIG. 8 (prior art) illustrates the Window Algorithm as applied to a BDD representing a function having eight variables.

FIG. 8 illustrates the Window Algorithm as applied to a BDD 800 representing a function having eight variables. BDD 800 therefore has eight layers. In this example, the window size k is chosen to be 3. Thus, first, layers 1 to 3 are reordered according to their optimum ordering (e.g., using the Plain Changes Algorithm). Second, layers 2 to 4 are reordered according to their optimum ordering. And so on. When the window moves down to layers 6 to 8, if necessary, the window may restart from layer 1 again. As the Window Algorithm utilizes the Plain Changes Algorithm as a subset, it is typically not parallelizable.

Parallel Variable Reordering Algorithms

Although there are several existing variable reordering algorithms that determine the optimum or the substantially optimal variable order for a BDD and reorder the variables of the BDD according to its optimum or substantially optimal variable order, none of them can be parallelized efficiently, as FIGS. 6-8 illustrate. On the other hand, reordering the variables of a BDD according to its optimum or substantially optimal variable order may be very expensive (e.g., in terms of time and human or machine resources), especially when the number of the variables of the BDD is sufficiently large.

For example, as the Plain Changes Algorithm illustrates, for a BDD that represents a function having n variables, it takes a total of n!−1 layer swaps to determine its optimum variable order. In practical applications, a BDD often has hundreds or thousands of layers.

Various embodiments of the present disclosure therefore provide several variable reordering algorithms for BDDs that significantly improve upon the existing algorithms by efficiently parallelizing the reordering process. There are two main concepts underlying the design of the parallel variable reordering algorithms described in the various embodiments. The first concept may be termed "maximal parallelization". For any given BDD having n layers, performing a local swap between two consecutive layers (e.g., layer j and layer j+1) does not alter or affect the other layers (i.e., layers 1 to j−1 and layers j+2 to n) of the BDD. This property can be applied recursively. In particular embodiments, all layer swaps that do not depend on each other may be executed concurrently.

Figure 9:
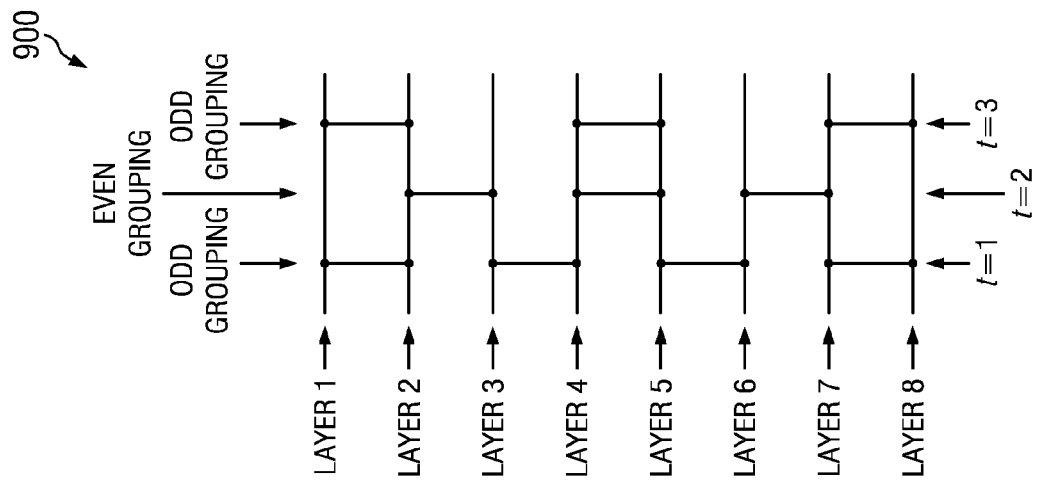
FIG. 9 illustrates an example of the maximal parallelization concept as applied to a BDD having eight layers.

For example, consider FIG. 9 that illustrates a BDD 900 having eight layers. The eight layers may be grouped into several disjoint pairs of consecutive layers. In particular embodiments, according to one type of grouping, layers 1 and 2 may be paired up; layers 3 and 4 may be paired up; layers 5 and 6 may be paired up; and layers 7 and 8 may be paired up. According to this first type of grouping, the 8 layers of BDD 900 may be grouped into 4 disjoint pairs of consecutive layers. Two pairs of consecutive layers are considered "disjoint" if they do not share any common layer. For example, the pair with layers 1 and 2 and the pair with layers 3 and 4 do not share any common layer between them. Swapping layers 1 and 2 do not affect layers 3 to 8. Similarly, swapping layers 3 and 4 do not affect layers 1 to 2 and 5 to 8. And so on. Consequently, the 4 disjoint pairs of consecutive layers may be swapped concurrently as there is no interdependency among the individual pairs. Alternatively, according to another type of grouping, layers 2 and 3 may be paired up; layers 4 and 5 may be paired up; and layers 6 and 7 may be paired up. According to this second type of grouping, the 8 layers of BDD 900 may be grouped into 3 disjoint pairs of consecutive layers. Again, swapping layers 2 and 3 do not affect layers 1 and 4 to 8. Swapping layers 4 and 5 do not affect layers 1 to 3 and 6 to 8. And so on. Consequently, the 3 disjoint pairs of consecutive layers may be swapped concurrently as there is no interdependency among the individual pairs.

To generalize, given any BDD having n layers corresponding to n variables, where n may be any odd or even integer greater than or equal to 3, there are at least two ways to group the n layers into disjoint pairs of consecutive layers. For example, if n=4, then the 4 layers may be grouped as $\{1, 2\}$ and $\{3, 4\}$. On the other hand, if n=5, then one way to group the 5 layers may be $\{1, 2\}$ and $\{3, 4\}$; another way to group the 5 layers may be $\{1, 2\}$ and $\{4, 5\}$; and a third way to group the 5 layers may be $\{2, 3\}$ and $\{4, 5\}$. According to the first type of grouping, each pair includes an odd layer, $j_{odd}$, and an even layer, $j_{even}$, where $j_{even}=j_{odd}+1$, for $1 \leq j_{odd} \leq n-1$. All the pairs thus grouped may be referred to as "odd-grouping pairs" or "first-grouping pairs" and may be swapped concurrently. According to the second type of grouping, each pair includes an even layer, $j_{even}$, and an odd layer, $j_{odd}$, where $j_{odd}=j_{even}+1$, for $2 \leq j_{even} \leq n-1$. All the pairs thus grouped may be referred to as "even-grouping pairs" or "second-grouping pairs" and again may be swapped concurrently. In particular embodiments, all the first-grouping pairs obtained according to the first type of grouping and all the second-grouping pairs obtained according to the second type of grouping may be iteratively and alternatingly swapped.

For example, in FIG. 9, during the first iteration, t=1, all the odd-grouping pairs (i.e., the first-grouping pairs) are swapped in parallel (i.e., concurrently). During the second iteration, t=2, all the even-grouping pairs (i.e., the second-grouping pairs) are swapped in parallel. During the third iteration, t=2, all the odd-grouping pairs are again swapped in parallel. The process may continue, alternating between swapping all the odd-grouping pairs and all the even-grouping pairs, until a desired result is achieved.

To generalize, in particular embodiments, the process swaps all the odd-grouping pairs concurrently during each odd iteration (e.g., iterations 1, 3, 5, . . . ), and swaps all the even-grouping pairs concurrently during each even iteration (e.g., iterations 2, 4, 6, . . . ). Alternatively, in other embodiments, the process may swap all the even-grouping pairs concurrently during each odd iteration, and swap all the odd-grouping pairs concurrently during each even iteration.

The second concept may be termed "implicit enumeration of permutations". Consider FIG. 10 that illustrates a BDD 1000 having six layers. Suppose these six layers are grouped into three disjoint pairs of consecutive layers: layers 1 and 2, layers 3 and 4, and layers 5 and 6. The three disjoint pairs of consecutive layers may be swapped sequentially or concurrently. If, before the three layer swaps, the variable order of BDD 1000 is $\{1, 2, 3, 4, 5, 6\}$ (i.e., variable 1 is at layer 1; variable 2 is at layer 2; variable 3 is at layer 3; and so on), then after the three layer swaps, the variable order of BDD 1000 becomes $\{2, 1, 4, 3, 6, 5\}$ (i.e., variable 2 is at layer 1; variable 1 is at layer 2; variable 4 is at layer 3; variable 3 is at layer 4; variable 6 is at layer 5; and variable 5 is at layer 6).

Particular embodiments make the following observation: since the execution of each of these layer swaps does not affect the structure, and thus the size, of the rest of BDD 1000, the size of any permutation obtained by executing any subset of these swaps can be calculated without explicitly generating the corresponding complete variable order for the entire BDD. For example, with BDD 1000, before the 3 layer swaps, the sizes of the 6 layers may be individually determined, with variable 1 at layer 1, variable 2 at layer 2, variable 3 at layer 3, variable 4 at layer 4, variable 5 at layer 5, and variable 6 at layer 6. After the 3 swaps, the sizes of the 6 layers may be individually determined again, but with variable 2 at layer 1, variable 1 at layer 2, variable 4 at layer 3, variable 3 at layer 4, variable 6 at layer 5, and variable 5 at layer 6. Thus, for each disjoint pair of consecutive layers, there are two sizes: the size before the two layers are swapped and the size after the two layers are swapped. For the 6 layers of BDD 1000, there are 3 disjoint pairs of consecutive layers.

More specifically, for layers 1 and 2, before layers 1 and 2 are swapped, the size of layers 1 and 2 with variables 1 and 2 may be determined. After layers 1 and 2 are swapped, the size of layers 1 and 2 with variables 2 and 1 may be determined. Similarly, for layers 3 and 4, before layers 3 and 4 are swapped, the size of layers 3 and 4 with variables 3 and 4 may be determined. After layers 3 and 4 are swapped, the size of layers 3 and 4 with variables 4 and 3 may be determined. And for layers 5 and 6, before layers 5 and 6 are swapped, the size of layers 5 and 6 with variables 5 and 6 may be determined. After layers 5 and 6 are swapped, the size of layers 5 and 6 with variables 6 and 5 may be determined.

Different combinations of the sizes of the 3 disjoint pairs of consecutive layers may yield sizes of different variable orders for BDD 1000 without explicitly generating the corresponding variable orders. For example, to implicitly determine the size of variable order $\{1, 2, 4, 3, 5, 6\}$ (i.e., variable 1 is at layer 1; variable 2 is at layer 2; variable 4 is at layer 3; variable 3 is at layer 4; variable 5 is at layer 5; and variable 6 is at layer 6), particular embodiments may compute the sum of: (1) the size of layers 1 and 2 with variables 1 and 2 respectively (obtained before swapping layers 1 and 2); (2) the size of layers 3 and 4 with variables 4 and 3 respectively (obtained after swapping layers 3 and 4); and (3) the size of the layers 5 and 6 with variables 5 and 6 respectively (obtained before swapping layers 5 and 6). All three sizes have been determined either before or after the 3 layer swaps. As another example, to implicitly determine the size of variable order {2, 1, 3, 4, 6, 5}, particular embodiments may compute the sum of (1) the size of layers 1 and 2 with variables 2 and 1 respectively (obtained after swapping layers 1 and 2); (2) the size of layers 3 and 4 with variables 3 and 4 respectively (obtained before swapping layers 3 and 4); and (3) the size of the layers 5 and 6 with variables 6 and 5 respectively (obtained after swapping layers 5 and 6).

Figure 10:
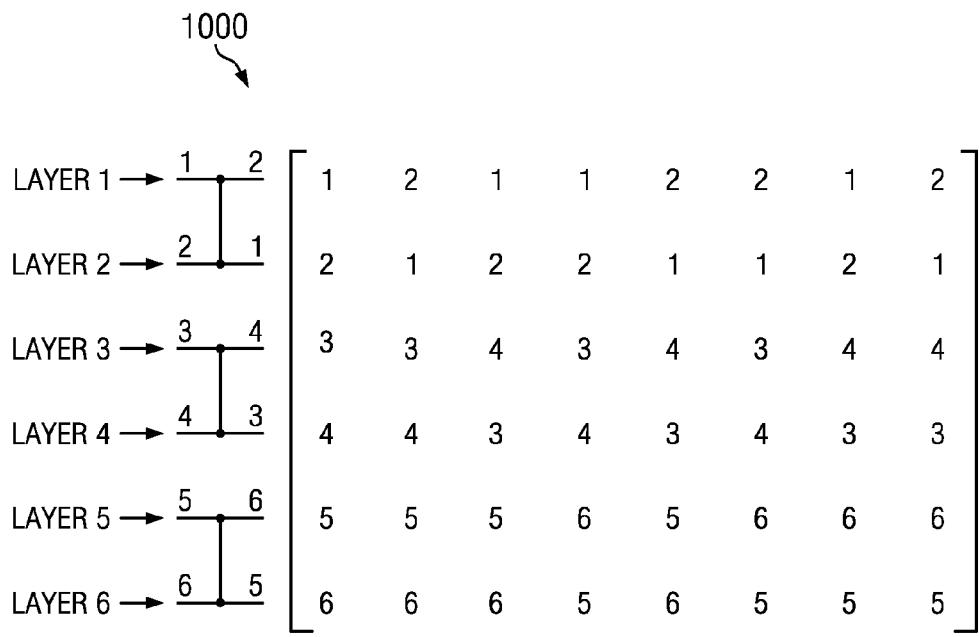
FIG. 10 illustrates an example of the implicit enumeration concept as applied to a BDD having six layers.

In the case of BDD 1000, by combining the sizes of the 3 disjoint pairs of consecutive layers obtained before and after the layer swaps, the sizes of 7 additional variable orders may be computed with 3 layer swaps with respect to the 3 disjoint pairs of consecutive layers. Note that since BDD 1000 initially has variable order {1, 2, 3, 4, 5, 6}, the size of this variable order is already known and does not need to be computed. FIG. 10 illustrates all eight different variable orders of BDD 1000 whose sizes may be determined by combining the different sizes of the 3 disjoint pairs of consecutive layers obtained before and after the 3 swaps. For 6 variables (i.e., 3 disjoint pairs of consecutive layers), there are 8 unique combinations (note that one of the variable orders, {1, 2, 3, 4, 5, 6}, is the initial order before the layer swap). To generalize, given any BDD having n layers corresponding to n variables, if k layer swaps are executed in parallel (i.e., there are k disjoint pairs of consecutive layers), then the sizes of $2^k-1$ variable orders can be implicitly computed. Note that there is "−1" because the size of the initial variable order of the BDD before the layer swaps can be obtained directly without requiring any implicit computation. In general, however, given k disjoint pairs of consecutive layers, the sizes of $2^k$ different variable orders may be determined by swapping the k disjoint pairs of consecutive layers.

The parallel variable reordering algorithms for BDDs described in the various embodiments rely on the concepts of maximal parallelization and implicit enumeration of permutations. Existing variable reordering algorithms for BDDs are not parallelizable because most of the executed swaps are interdependent. Particular embodiments, therefore, attempt to structure the layer-swapping process so that the interdependency between the pairs of consecutive layers that need to be swapped is minimized (e.g., by forming disjoint pairs of consecutive layers), thus increasing the possibility of swapping multiple pairs of consecutive layers in parallel.

Parallel Permutation Algorithm

Particular embodiments observe that a schedule of swaps where the depth of the swap network is minimized is desirable. Suppose a given BDD having n layers corresponding to n variables initially has a first variable order, and it is desirable to reorder the n variables of the BDD according to a different second variable order. The second variable order may be obtained by any suitable means (e.g., specified by a person, or determined according to design specification requirements or application criteria). Particular embodiments observe that applying a given permutation (i.e., variable order) to the current variable permutation is equivalent to the problem of sorting, if the total order imposed on the variable identifiers is defined by the desired final permutation.

Figure 11B:
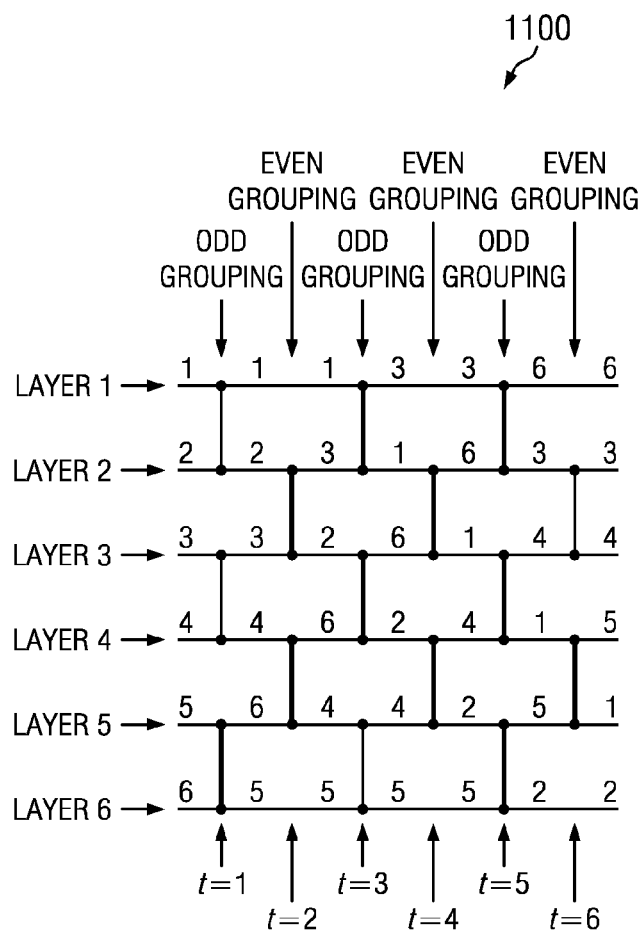
FIG. 11B illustrates the Parallel Permutation Algorithm as applied to a BDD having six layers corresponding to six variables.
Figure 11A:
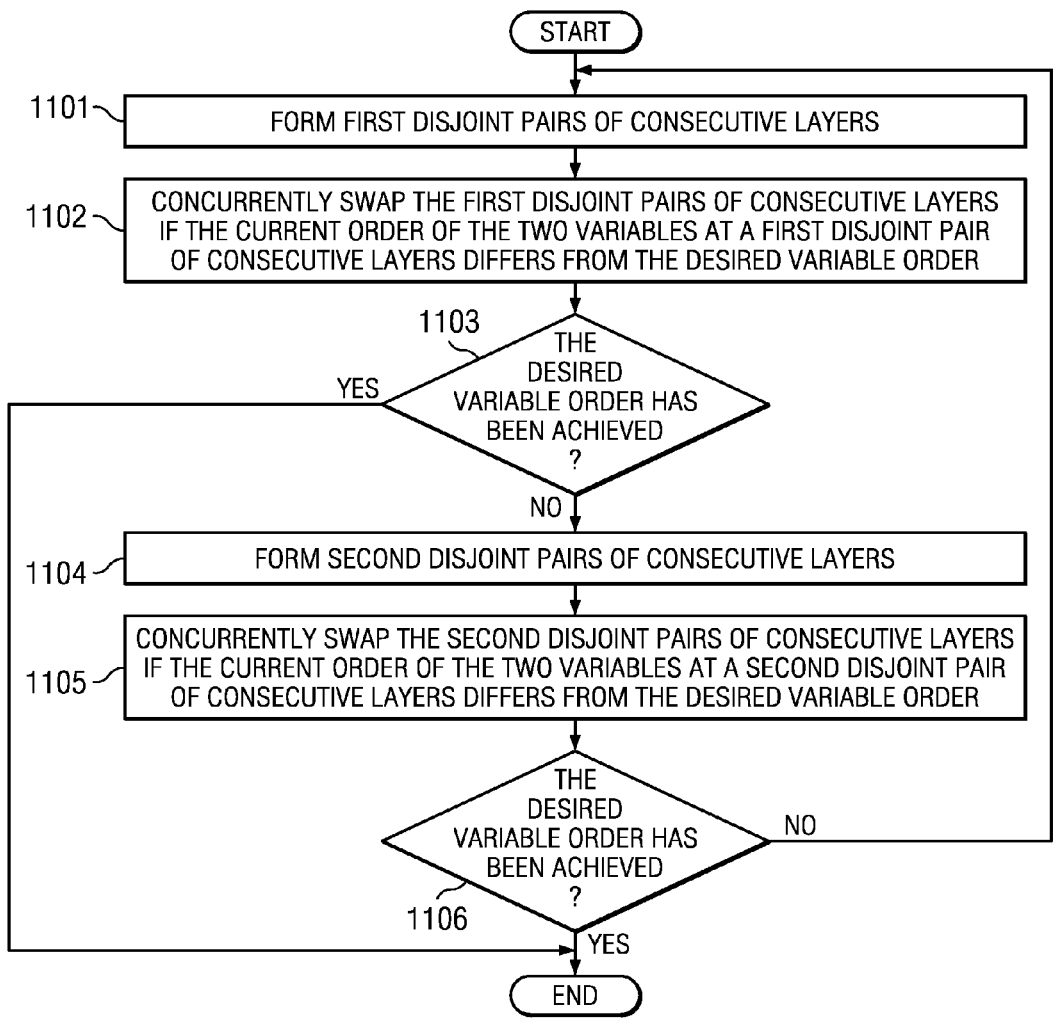
FIG. 11A illustrates an example of the Parallel Permutation Algorithm.

In particular embodiments, assume the first variable order of the BDD (i.e., the variable order the BDD currently has) is the identity permutation; that is, each variable i is at layer i for $1 \leq i \leq n$. The desired, second variable order is defined as $\pi(i)$; that is, each variable i is at layer $\pi(i)$ for $1 \leq i \leq n$. The goal is to reorder the n variables of the BDD so that the BDD eventually has the second variable order. FIG. 11A illustrates an example of the Parallel Permutation Algorithm, which reorders the n variables of a BDD initially having a first variable order according to a second variable order. FIG. 11B illustrate the Parallel Permutation Algorithm as applied to a BDD 1100 having six layers corresponding to six variables. The steps illustrated in FIG. 11A are described using BDD 1100 as an example.

As described above in connection with FIG. 9, given any BDD having n layers corresponding to n variables, there are two ways to group the n layers into disjoint pairs of consecutive layers. First, the n layers may be grouped into odd-grouping pairs (also referred to as first-grouping pairs), where each pair includes an odd layer followed by an even layer. Second, the n layers may be grouped into even-grouping pairs (also referred to as second-grouping pairs), where each pair includes an even layer followed by an odd layer. All the odd-grouping pairs may be swapped concurrently as they are disjoint from each other (i.e., they do not share any common layer). Similarly, all the even-grouping pairs may be swapped concurrently as they are also disjoint from each other. The Parallel Permutation Algorithm takes advantage of this property.

In particular embodiments, the n layers of the BDD are iteratively and alternatingly grouped into odd-grouping pairs and even-grouping pairs, and each pair of layers is swapped if the current order of the two layers during the current iteration differs from the order specified by the second variable order. More specifically, using BDD 1100 having six layers corresponding to six variables in FIG. 11B as an example. BDD 1100 initially has a first variable order, which is the identity permutation, {1, 2, 3, 4, 5, 6} (i.e., each variable i is at layer i for $1 \leq i \leq 6$). Suppose the desired second variable order is {6, 3, 4, 5, 1, 2} (i.e., variable 6 at layer 1, variable 3 at layer 2, variable 4 at layer 3, and so on, which means $\pi(6)<\pi(3)<\pi(4)<\pi(5)<\pi(1)<\pi(2)$).

In particular embodiments, during the first iteration (i.e., t=1), the 6 layers of BDD 1100 is grouped into 3 odd-grouping pairs: layers 1 and 2, layers 3 and 4, and layers 5 and 6, as illustrated in step 1101 of FIG. 11A. These are disjoint pairs of consecutive layers as they do not share any common layer among the pairs. Therefore, the 3 odd-grouping pairs may be swapped concurrently, as illustrated in step 1102 of FIG. 11A. For layers 1 and 2, variable 1 is currently at layer 1 and variable 2 is currently at layer 2. Thus, the current order of the two variables at layers 1 and 2 is {1, 2}, which already agrees with the order specified by the second variable order for variables 1 and 2 (i.e., variable 1 before variable 2, which means $\pi(1)<\pi(2)$). Therefore, there is no need to swap layers 1 and 2 during this iteration. Similarly, for layers 3 and 4, variable 3 is currently at layer 3 and variable 4 is currently at layer 4. Thus, the current order of the two variables at layers 3 and 4 is {3, 4}, which already agrees with the order specified by the second variable order for variables 3 and 4 (i.e., $\pi(3)<\pi(4)$). Therefore, there is also no need to swap layers 3 and 4 during this iteration. On the other hand, for layers 5 and 6, variable 5 is currently at layer 5 and variable 6 is currently at layer 6. The current order of the two variables at layers 5 and 6 is {5, 6}, which differs from the order specified by the second variable order for variables 5 and 6 (i.e., $\pi(5)>\pi(6)$). Therefore, layers 5 and 6 are swapped during this iteration, after which variable 6 is at layer 5 and variable 5 is at layer 6. Since there is only one layer swap needed during the first iteration, there is no need for parallelization. However, if multiple layer swaps are needed during an iteration, they may be performed in parallel, since the grouping of the layers ensures that the resulting pairs of consecutive layers are disjoint.

After each iteration, the process determines whether the second variable order has been achieved, as illustrated in step 1103 of FIG. 11A. If so, the process may end with success. Otherwise, the process continues to the next iteration. For BDD 1100, after the first iteration, the variable order becomes {1, 2, 3, 4, 6, 5}. Thus, the desired second variable order has not been achieved, and another iteration is needed.

In particular embodiments, during the second iteration (i.e., t=2), the 6 layers of BDD 1100 is grouped into 2 even-grouping pairs: layers 2 and 3, and layers 4 and 5, as illustrated in step 1104 of FIG. 11A. Again, these are disjoint pairs of consecutive layers as they do not share any common layer among the pairs. Therefore, the 2 even-grouping pairs may be swapped concurrently, as illustrated in step 1105 of FIG. 11A. For layers 2 and 3, variable 2 is currently at layer 2 and variable 3 is currently at layer 3. The current order of the two variables at layers 2 and 3 is {2, 3}, which differs from the order specified by the second variable order for variables 2 and 3 (i.e., $\pi(2)>\pi(3)$). Therefore, layers 2 and 3 are swapped during this iteration, after which variable 3 is at layer 2 and variable 2 is at layer 3. Similarly, for layers 4 and 5, variable 4 is currently at layer 4 and variable 6 is currently at layer 5. The current order of the two variables at layers 4 and 5 is {4, 6}, which differs from the order specified by the second variable order for variables 4 and 6 (i.e., $\pi(4)>246$)). Therefore, layers 4 and 5 are swapped during this iteration, after which variable 6 is at layer 4 and variable 4 is at layer 5. Since two layer swaps are needed during this iteration, in particular embodiments, they may be performed in parallel.

Again, after each iteration, the process determines whether the second variable order has been achieved, as illustrated in step 1106 of FIG. 11A. If so, the process may end with success. Otherwise, the process continues to the next iteration. For BDD 1100, after the second iteration, the variable order becomes {1, 3, 2, 6, 4, 5}. Thus, the desired second variable order has not been achieved, and another iteration is needed. The steps performed during the third and the fifth iteration is similar to those of the first iteration, and the steps performed during the fourth and the sixth iteration is similar to those of the second iteration.

As illustrated in FIG. 11B, for BDD 1100, it takes a total of 6 iterations to reorder the 6 variables before the second variable ordering is achieved. During each odd iteration (i.e., iterations 1, 3, 5), the 6 layers of BDD 1100 are grouped into odd-grouping disjoint pairs of consecutive layers. During each even iteration (i.e., iterations 2, 4, 6), the 6 layers are grouped into even-grouping disjoint pairs of consecutive layers. During the third iteration (i.e., t=3), layers 1 and 2 and layers 3 and 4 are swapped concurrently. During the fourth iteration (i.e., t=4), layers 2 and 3 and layers 4 and 5 are swapped concurrently. During the fifth iteration (i.e., t=5), layers 1 and 2, layers 3 and 4, and layers 5 and 6 are swapped concurrently. During the sixth iteration (i.e., t=6), layers 4 and 5 are swapped.

However, BDD 1100 is one example of the Parallel Permutation Algorithm. Alternatively, during each odd iteration, the 6 layers may be grouped into even-grouping disjoint pairs of consecutive layers, while during each even iteration, the 6 layers may be grouped into odd-grouping disjoint pairs of consecutive layers. The algorithm is able to achieve its goal as long as the grouping of the layers alternates between successive iterations. During each iteration, the pairs of layers are either swapped or not swapped depending on whether the orders of the variables currently at the layers differ from or agree with the orders of the corresponding variables specified by the desired second variable order.

To generalize, given a BDD having n layers corresponding to n variables, and the BDD initially has a first variable order where each variable i is at layer i for $1 \le i \le n$, and given a second variable order of the BDD defined as $\pi(i)$ where each variable i is at layer $\pi(i)$ for $1 \le i \le n$, to reorder the n variables of the BDD according to the second variable order, in particular embodiments, the Parallel Permutation Algorithm performs an iterative process. During each odd iterations, the n layers are grouped into a first type of disjoint pairs of consecutive layers according to a first grouping scheme. During each even iterations, the n layers are grouped into a second type of disjoint pairs of consecutive layers according to a second grouping scheme. During each iteration, a pair of consecutive layers is swapped only if the order of the two variables currently at the two layers differs from the order of the two variables specified by the second variable order. That is, for two consecutive layers $j_1$ and $j_2$, during a particular iteration, suppose variable $i_1$ is currently at layer $j_1$ and variable $i_2$ is currently at layer $j_2$. Then, layers $j_1$ and $j_2$ are swapped during this iteration only if $\pi(i_1)>\pi(i_2)$. In particular embodiments, all the layer swaps performed during each iteration are done in parallel (i.e., concurrently).

Particular embodiments observe that for any BDD having n layers corresponding to n variables and the BDD initially has a first variable order, using the Parallel Permutation Algorithm, it takes at most n iterations (each iteration may also be referred to as a "level") of layer swaps to reorder the n variables of the BDD to achieve a second variable order. In addition, it takes at most $$\binom{n}{2}$$

(i.e., "n choose 2", which equals $$\frac{n(n-1)}{2})$$

layer swaps during the n iterations. The Parallel Permutation Algorithm is parallelly optimum as there exists no other layer-swapping schedule that can achieve any permutation in less than n iterations. In comparison, the existing variable reordering algorithms also require at most $$\binom{n}{2}$$

layer swaps but may require as many as $$\binom{n}{2}$$

iterations.

The Parallel Permutation Algorithm described above in connection with FIG. 11A may be used for transforming permutations between different partitions of BDDs and particularly of ROBDDs. In practical applications, a BDD, or more commonly, a ROBDD often has thousands, even millions of nodes. Therefore, storing such large BDDs or ROBDDs may require a great amount of storage space. To address this problem, often, a large BDD or ROBDD may be partitioned into two or more sub-BDDs, and each sub-BDD is in effect a BDD by itself. The original BDD may be obtained by logically OR'ing the sub-BDDs. To further reduce the need for storage space, the variables of each sub-BDD may be reordered according to the optimum or substantially optimal variable order of that particular sub-BDD. The sub-BDDs are then stored thus. However, since each sub-BDD is in effect a BDD by itself, the optimum or substantially optimal variable order of one sub-BDD may differ from the optimum or substantially optimal variable order of another sub-BDD.

When operations need to be performed in connection with the BDD, the sub-BDDs may be combined together to form the original BDD. Alternatively, the operations may be performed in connection with the individual sub-BDDs. In either case, when performing these operations, all the sub-BDDs involved need to have the same variable order. If there are a total of m sub-BDDs, where m≥2, all having different variable orders, then the variables of m−1 sub-BDDs may need to be reordered.

In particular embodiments, suppose there are two BDDs, a first BDD and a second BDD, each having n layers corresponding to n variables. The first BDD currently has a first variable order. The second BDD currently has a second variable order, which differs from the first variable order of the first BDD. Further suppose that the first BDD and the second BDD are two partitions (i.e., two sub-BDDs) of a third BDD (i.e., the first BDD and the second BDD together form the third BDD). When needed, the n variables of the first BDD may be reordered according to the second variable order of the second BDD using the Parallel Permutation Algorithm described above in connection with FIG. 11A. Alternatively, the n variables of the second BDD may be reordered according to the first variable order of the first BDD using the Parallel Permutation Algorithm. In either case, after the variable reordering, the first BDD and the second BDD both have the same variable order. Thereafter, they may be combined to form the third BDD or operations may be performed in connection with the first BDD and the second BDD individually. The process may be applied similarly where a BDD is partitioned into three or more sub-BDDs. One sub-BDD is selected as the sub-BDD having the desired variable order. The variables of each of the other sub-BDDs are reordered according to the variable order of the selected sub-BDD using the Parallel Permutation Algorithm.

Optimum Layer-Swapping Schedules for BDDS with Four Variables

As FIG. 9 illustrates, given any BDD having n layers corresponding to n variables, the maximum parallelization that can be achieved is $$\frac{n}{2},$$

as at most $$\frac{n}{2}$$

layer swaps can be executed in parallel during each iteration. Therefore, it is desirable to place as many as $$\frac{n}{2}$$

layer swaps during each iteration (i.e., at each level). While this is possible for the case of the permutation algorithm, it is not always possible when at the same time, the process needs to respect the semantics of an exact or heuristic algorithm.

In the case of exact reordering, in particular embodiments, it is desirable to determine a swapping schedule that requires less than n!−1 iterations to perform n!−1 layer swaps (e.g., as with the case of the Plain Changes Algorithm) in order to go through all the possible variable permutations to determine the optimum variable order. Particular embodiments may determine the swapping schedule based on the implicit permutations concept described above.

Particular embodiments may consider a BDD having 4 layers corresponding to 4 variables and determine the optimum layer-swapping schedule for such a BDD. Note that for BDDs having 2 or 3 layers corresponding to 2 or 3 variables, no two swaps can be executed in parallel as, for example, FIG. 6 illustrates.

Figure 12B:
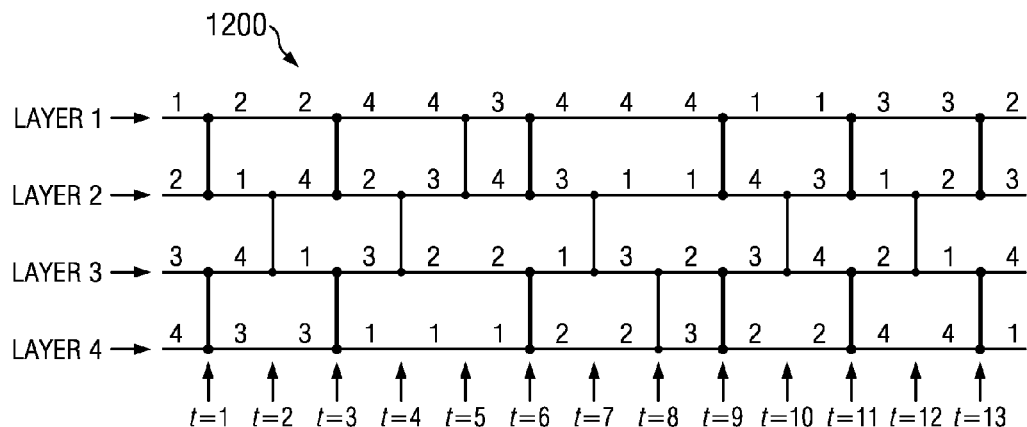
FIGS. 12A-12B illustrate an example optimum layer-swapping schedule for a BDD having four layers corresponding to four variables.
Figure 12A:
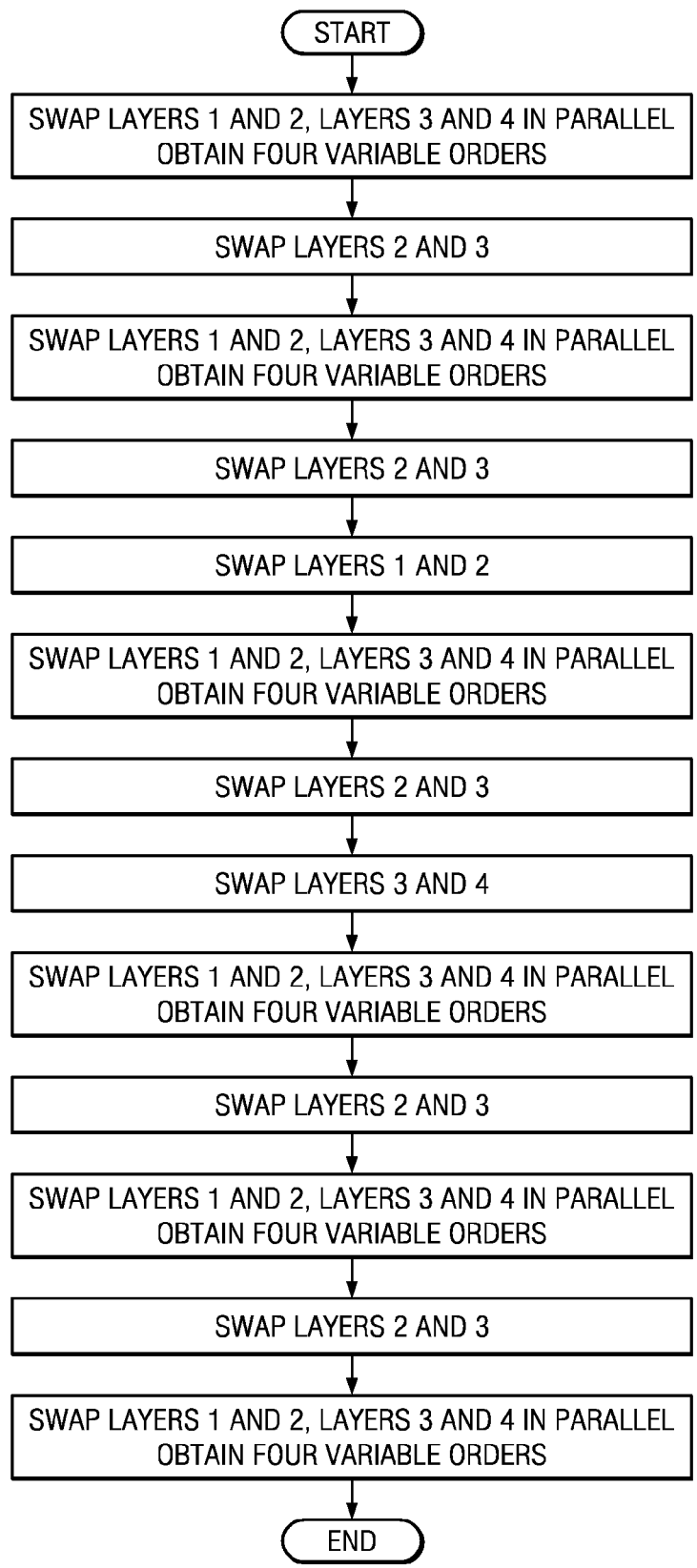

FIGS. 12A-12B illustrate an example optimum layer-swapping schedule for a BDD 1200 having four layers corresponding to four variables. There are a total of 19 layer swaps performed during 13 iterations. Note that all layer swaps that belong to the same iteration can be performed in parallel. Thus, during the first iteration (i.e., at the first level) layers 1 and 2 and layers 3 and 4 are swapped concurrently. During the second iteration, layers 2 and 3 are swapped. During the third iteration, layers 1 and 2 and layers 3 and 4 are swapped concurrently. An so on. For example, suppose the initial variable order of BDD 1200 is {1, 2, 3, 4}. The variable orders before and after each iteration are indicated with BDD 1200 in FIG. 12B. After going through the 13 iterations of layer swaps, the end variable order of BDD 1200 is {2, 3, 4, 1}. During the 13 iterations, the 4 variables are moved between the 4 layers.

For 4 variables, there are a total of 24 (i.e., 4!) possible variable orders. To determine the optimum variable order, the sizes of the 24 possible variable orders need to be determined so that the variable order with the smallest size may be selected. However, based on the implicit enumeration concept, the 24 possible variable orders do not need to be explicitly generated in order to determine the 24 sizes of the 24 variable orders.

Using BDD 1200 as an example, suppose the initial variable order of BDD 1200 is {1, 2, 3, 4}. The size, $s_{1,2}^{1,2}$, of layers 1 and 2 with variables 1 and 2, respectively, may be determined, and the size, $s_{3,4}^{3,4}$, of layers 3 and 4 with variables 3 and 4, respectively, may be determined. During the first iteration (i.e., t=1), layers 1 and 2 and layers 3 and 4 are swapped in parallel. After the first iteration, the variable order of BDD 1200 is {2, 1, 4, 3}. The size, $s_{1,2}^{2,1}$, of layers 1 and 2 with variables 2 and 1, respectively, may be determined, and the size, $s_{3,4}^{4,3}$, of layers 3 and 4 with variables 4 and 3, respectively, may be determined. After the first iteration, the sizes of 4 variable orders may be computed: (1) the size of variable order {1, 2, 3, 4} is the sum of $s_{1,2}^{1,2}$ and $s_{3,4}^{3,4}$ (note that since {1, 2, 3, 4} is the initial variable order of BDD 1200, the size of this variable order is in fact the initial size of BDD 1200, which is known without requiring any layer swap); (2) the size of variable order {2, 1, 3, 4} is the sum of $s_{1,2}^{2,1}$ and $s_{3,4}{}^{3,4}$; (3) the size of variable order {1, 2, 4, 3} is the sum of $s_{1,2}{}^{1,2}$ and $s_{3,4}{}^{4,3}$; and (4) the size of variable order {2, 1, 4, 3} is the sum of $s_{1,2}{}^{2,1}$ and $s_{3,4}{}^{4,3}$. In practice, however, it may not be necessary to explicitly compute all 4 sizes of the 4 variable orders obtained in connection with the first iteration. Particular embodiments may select the smaller of sizes $s_{1,2}{}^{1,2}$ and $s_{1,2}{}^{2,1}$ for layers 1 and 2 and select the smaller of sizes $s_{3,4}{}^{3,4}$ and $s_{3,4}{}^{3,4}$ for layers 3 and 4 to determine the variable order that yields the smallest size for the 4 variable orders obtained in connection with the first iteration and record the variable order that yields the smallest size thus far for comparison during subsequent iterations.

During the second iteration (i.e., t=2), layers 2 and 3 are swapped. After the second iteration, the variable order is {2, 4, 1, 3}. The purpose of the second iteration is to position the 4 variables for another iteration where layers 1 and 2 and layers 3 and 4 may be swapped concurrently and the sizes of more variable orders may be computed based on the implicit permutations concept, similar to the process described with the first iteration.

Before the third iteration, the size, $s_{1,2}{}^{2,4}$, of layers 1 and 2 with variables 2 and 4, respectively, may be determined, and the size, $s_{3,4}{}^{1,3}$, of layers 3 and 4 with variables 1 and 3, respectively, may be determined. During the third iteration (i.e., t=3), layers 1 and 2 and layers 3 and 4 are swapped in parallel. After the third iteration, the variable order of BDD 1200 is {4, 2 3, 1}. The size, $s_{1,2}{}^{4,2}$, of layers 1 and 2 with variables 4 and 2, respectively, may be determined, and the size, $s_{3,4}{}^{3,1}$, of layers 3 and 4 with variables 3 and 1, respectively, may be determined. After the third iteration, the sizes of another 4 variable orders may be computed: (1) the size of variable order {2, 4, 1, 3} is the sum of $s_{1,2}{}^{2,4}$ and $s_{3,4}{}^{1,3}$; (2) the size of variable order {2, 4, 3, 1} is the sum of $s_{1,2}{}^{2,4}$ and $s_{3,4}{}^{3,1}$; (3) the size of variable order {4, 2, 1, 3} is the sum of $s_{1,2}{}^{4,2}$ and $s_{3,4}{}^{1,3}$; and (4) the size of variable order {4, 2, 3, 1} is the sum of $s_{1,2}{}^{4,2}$ and $s_{3,4}{}^{3,1}$. Again, in practice, it may not be necessary to explicitly compute all 4 sizes of the 4 variable orders obtained in connection with the third iteration. Particular embodiments may select the smaller of sizes $s_{1,2}{}^{2,4}$ and $s_{1,2}{}^{4,2}$ for layers 1 and 2 and select the smaller of sizes $s_{3,4}{}^{1,3}$ and $s_{3,4}{}^{3,1}$ for layers 3 and 4 to determine the variable order that yields the smallest size for these 4 variable orders obtained in connection with the third iteration. The smallest size for the 4 variable orders obtained in connection with the third iteration may be compared with the smallest size for the 4 variables orders obtained in connection with the first iteration. The variable order from the first or the third iteration that yields the smallest size thus far may be recorded for comparison during subsequent iterations.

During the fourth iteration (i.e., t=4), layers 2 and 3 are swapped. During the fifth iteration (i.e., t=5), layers 1 and 2 are swapped. After the fifth iteration, the variable order is {4, 3, 2, 1}. The purpose of the fourth and the fifth iteration is to position the 4 variables for another iteration where layers 1 and 2 and layers 3 and 4 may be swapped concurrently and the sizes of more variable orders may be computed based on the implicit permutations concept, similar to the process described with the first and the third iteration.

Examining BDD 1200, there are four more iterations (i.e., the sixth iteration, the ninth iteration, the eleventh iteration, and the thirteenth iteration) during which layers 1 and 2 and layers 3 and 4 are swapped concurrently. During each of these iterations, the sizes of four unique variable orders may be computed based on the implicit enumeration concept, similar as the first and the third iteration. Examining BDD 1200, there are a total of 6 iterations (i.e., the first, the third, the sixth, the ninth, the eleventh, and the thirteenth iterations) during which layers 1 and 2 and layers 3 and 4 are swapped concurrently. Each of these 6 iterations provide sizes of 4 variable orders based on the implicit enumeration concept. Thus, these 6 iterations may be referred to as enumeration or permutation iterations. The other iterations in between these 6 enumeration iterations (e.g., the second, the fourth, the fifth, the seventh, the eighth, the tenth, and the twelfth iteration) reposition the variables for the subsequent enumeration iterations.

In particular embodiments, after each enumeration iteration, the variable order that yields the smallest size among the 4 variable orders obtained in connection with that enumeration iteration is selected, and its size (i.e., the smallest of the sizes of the 4 variable orders obtained in connection with that enumeration iteration) is compared with the smallest size of the variable order obtained and recorded during the previous iterations, and the variable order that yields the smaller size is recorded as the variable order that yields the smallest size thus far. Therefore, at the end of the thirteenth iteration, the variable order selected as the result of again comparing the smallest size of the 4 variable orders obtained in connection with the thirteenth iteration and the smallest size determined and recorded during the previous iterations is the optimum variable order for BDD 1200, as it yields the smallest size among all 24 possible variable orders.

Comparing the optimum layer-swapping schedule illustrated in FIGS. 12A-12B with, for example, the Plain Changes Algorithm as applied to a BDD having 4 layers corresponding to 4 variables. To obtain all possible variable permutations for the 4 variables, the Plain Changes Algorithm requires 23 layer swaps packed in either 23 iterations without parallelization or 18 iterations with full parallelization, where as the layer-swapping schedule illustrated in FIGS. 12A-12B only requires 13 iterations with 19 layer swaps. Obviously, the layer-swapping schedule illustrated in FIGS. 12A-12B improves upon the Plain Changes Algorithm as it requires less number of iterations and layer swaps, and thus less time to complete.

Figure 12C:
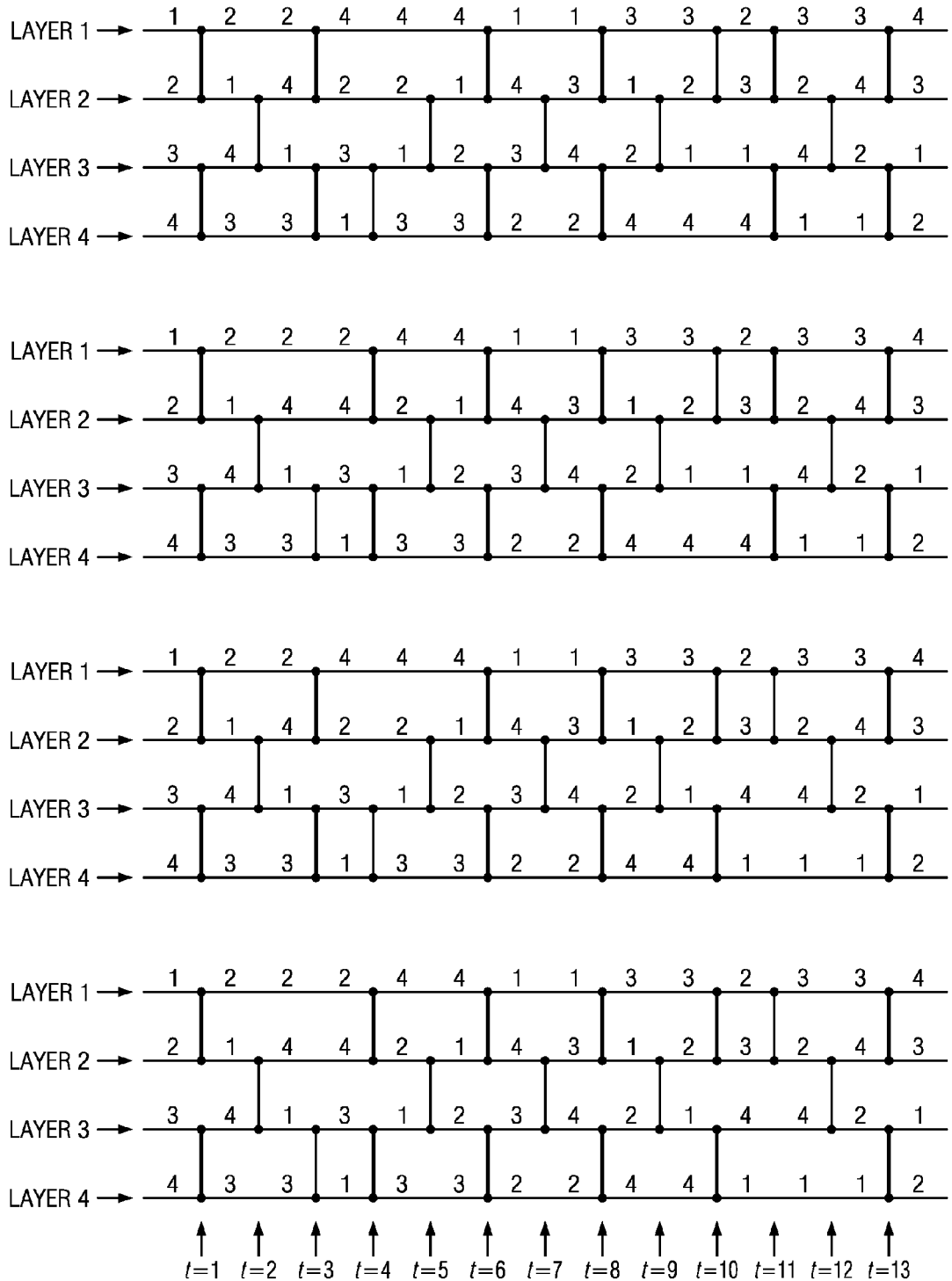
FIGS. 12C-12Z illustrate additional example optimum layer-swapping schedules for a BDD having four layers corresponding to four variables.
Figure 12D:
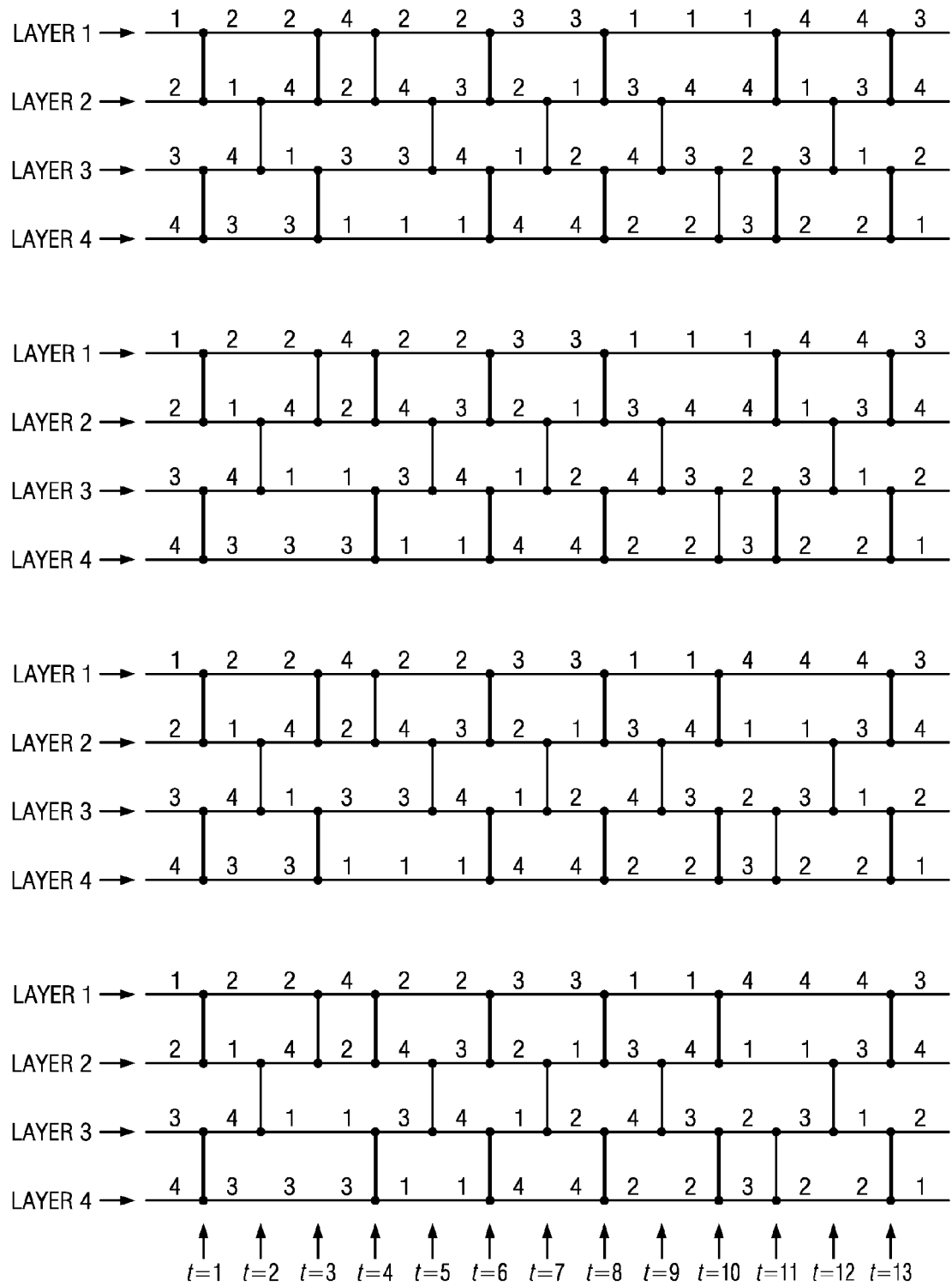
Figure 12E:
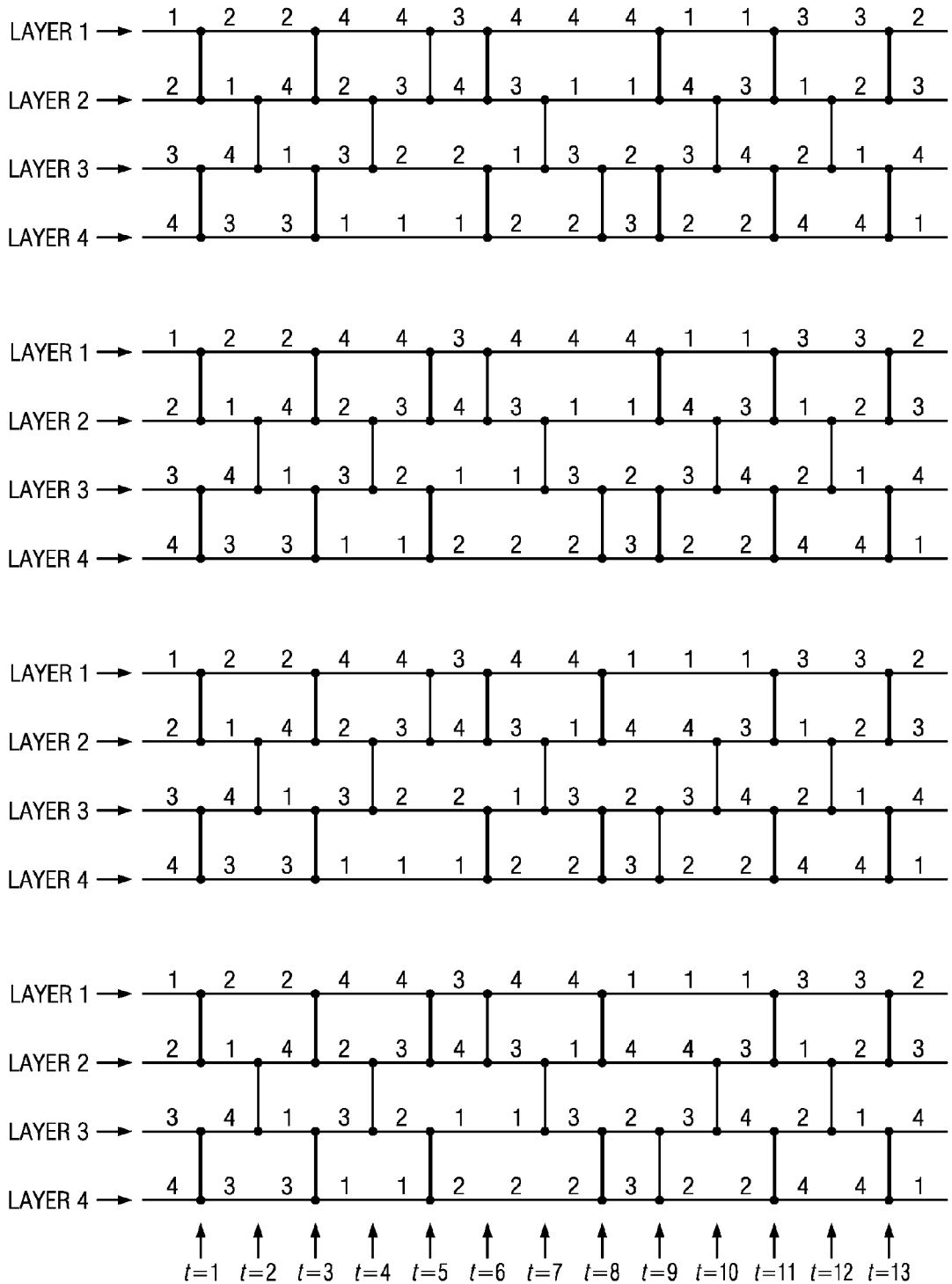
Figure 12F:
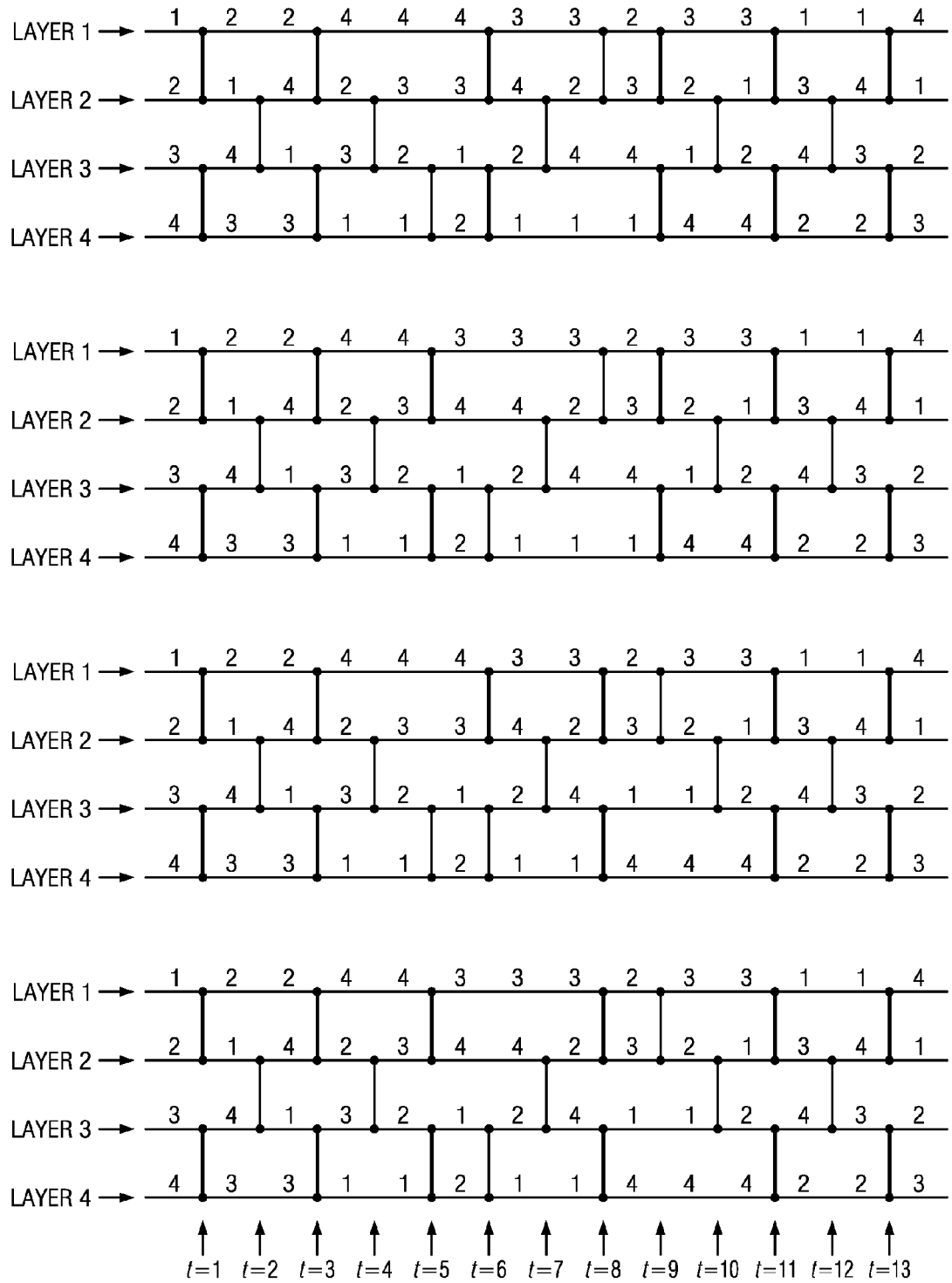
Figure 12G:
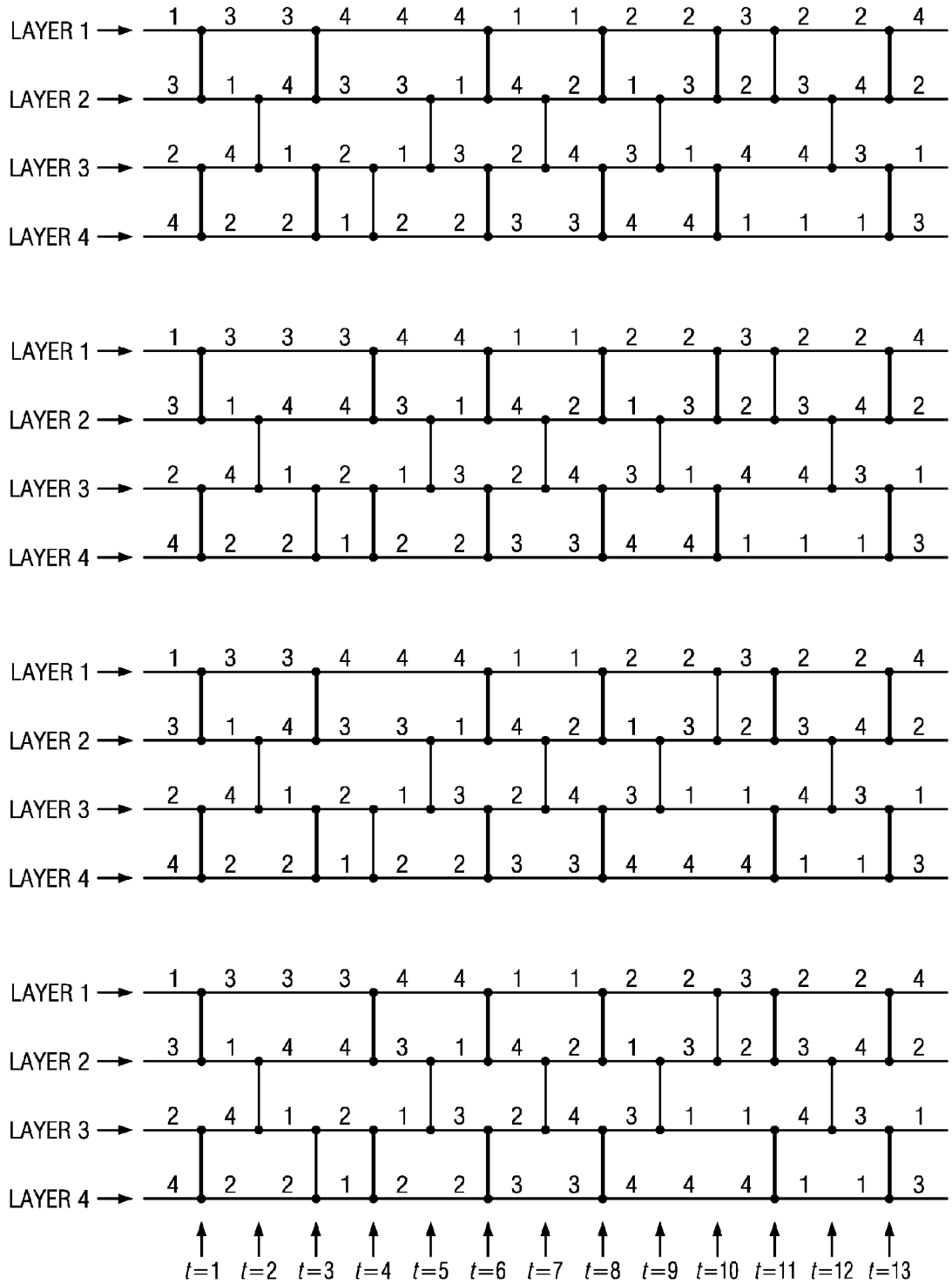
Figure 12H:
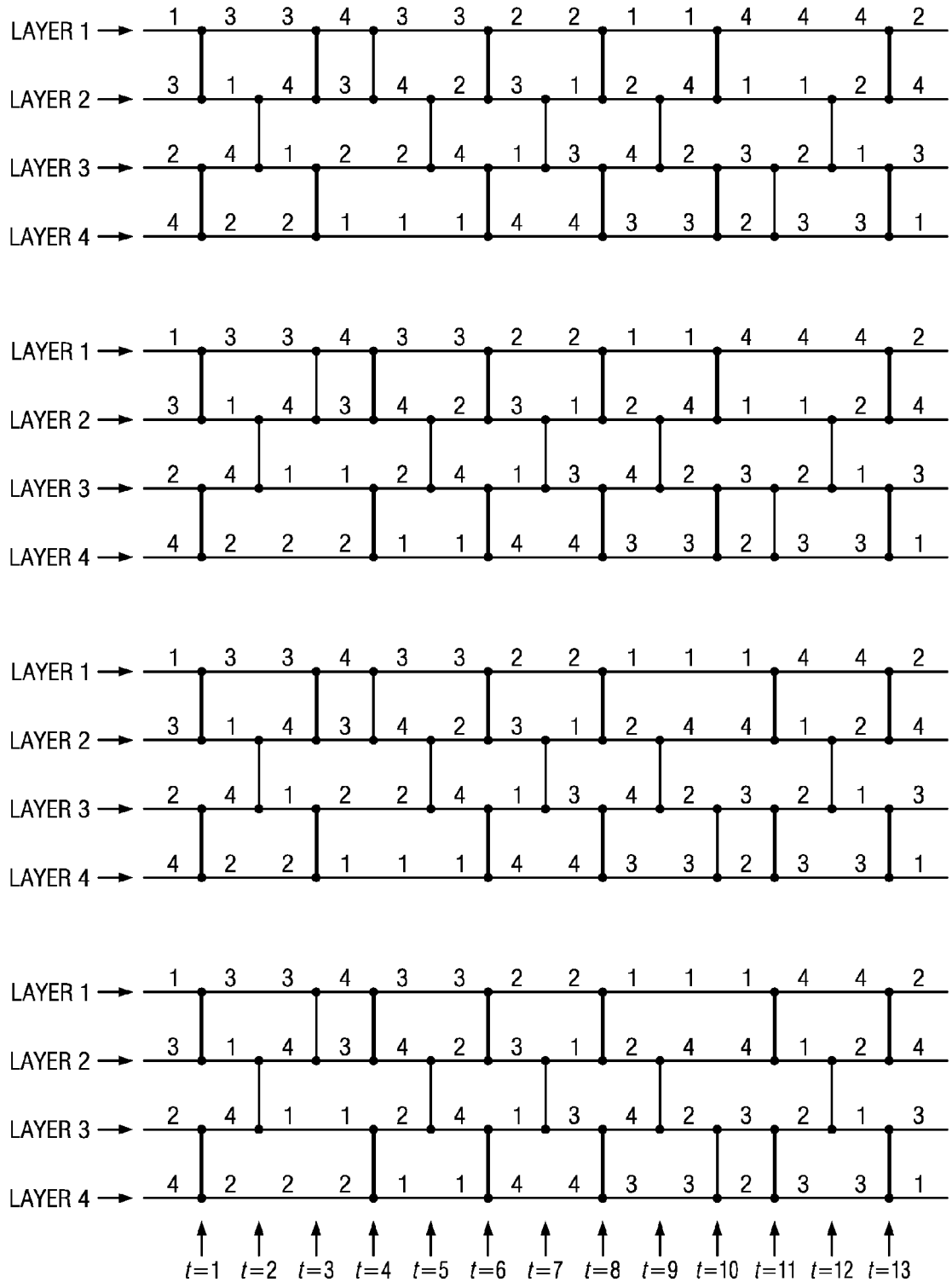
Figure 12I:
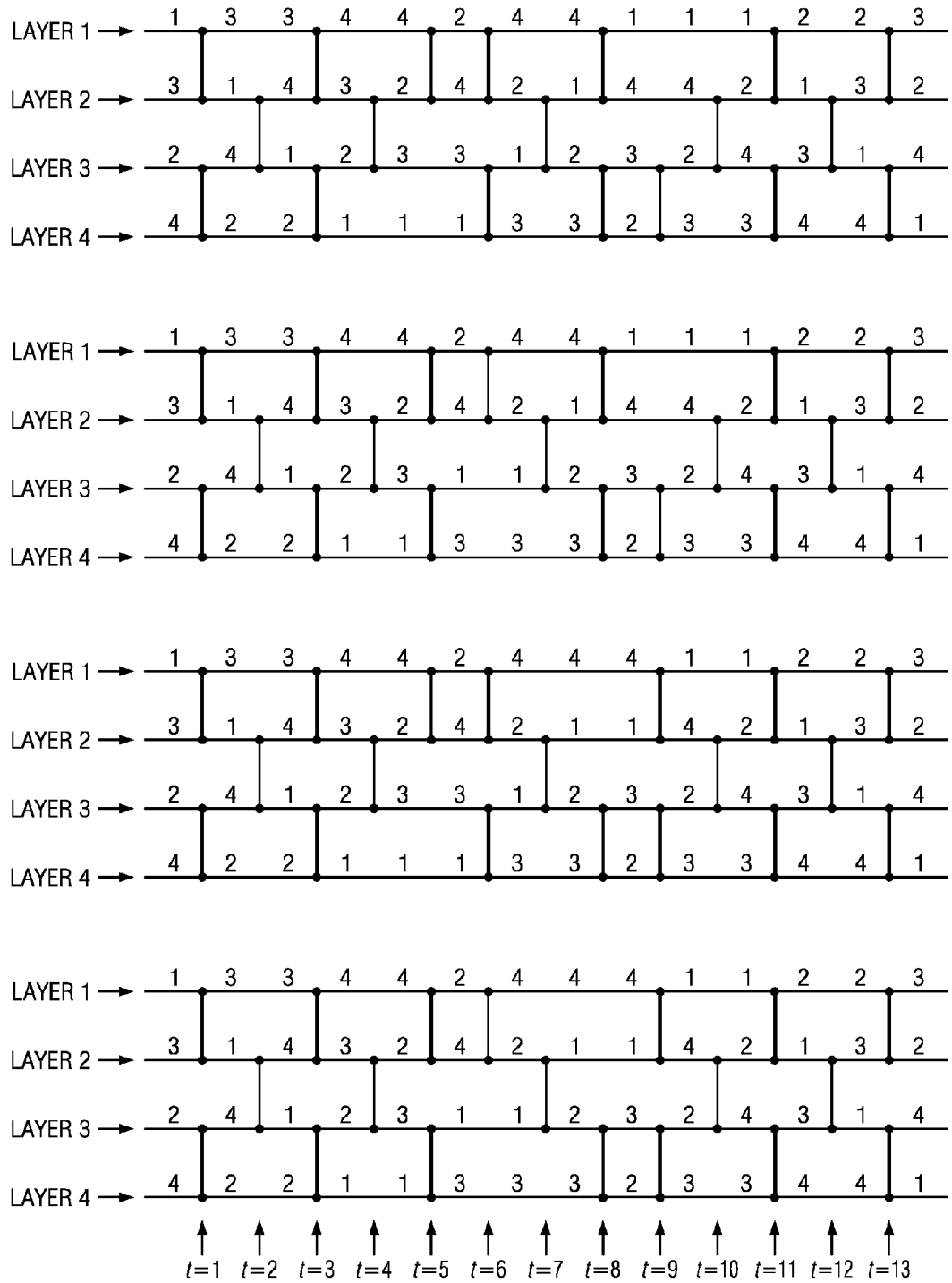
Figure 12J:
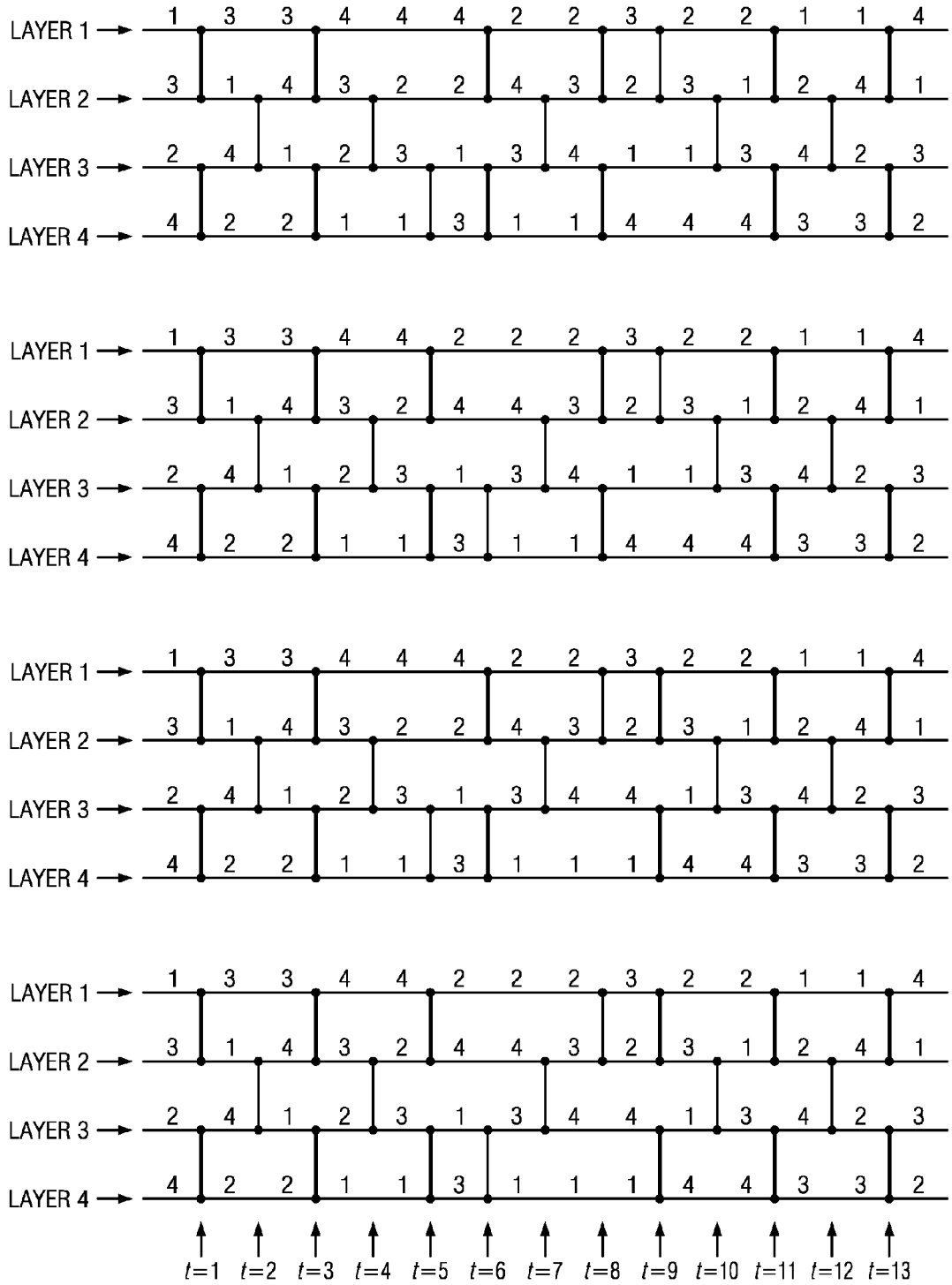
Figure 12K:
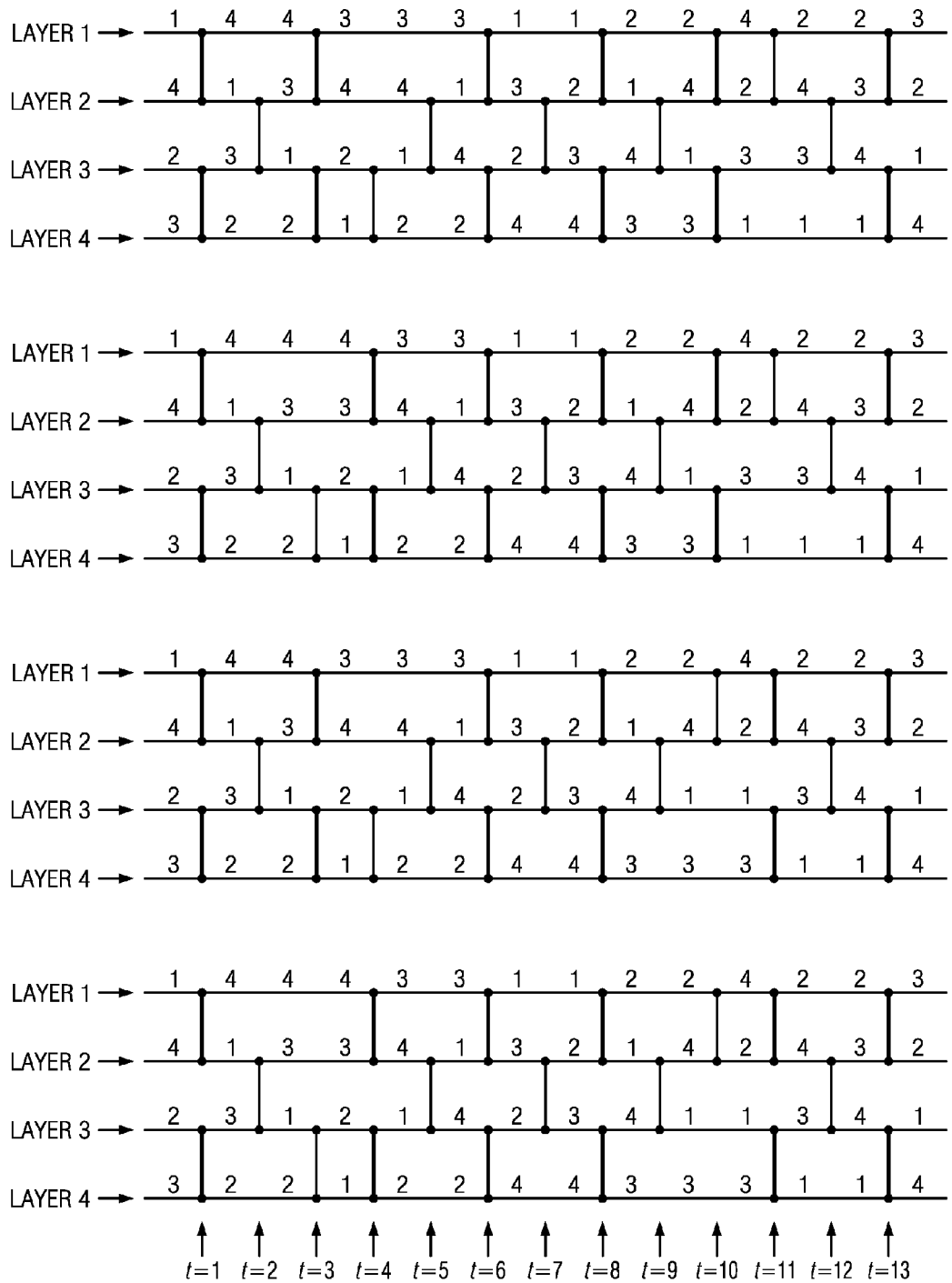
Figure 12L:
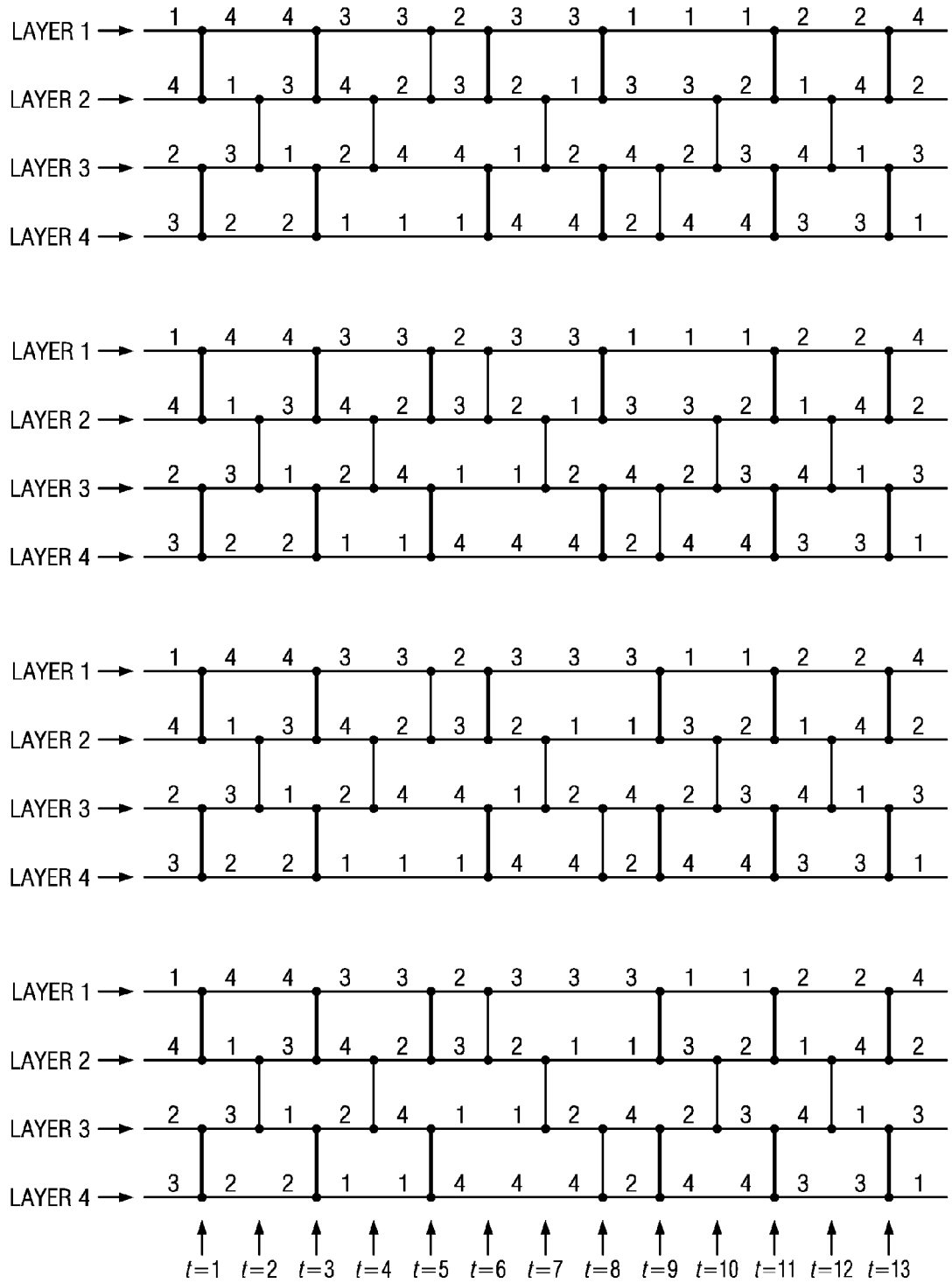
Figure 12M:
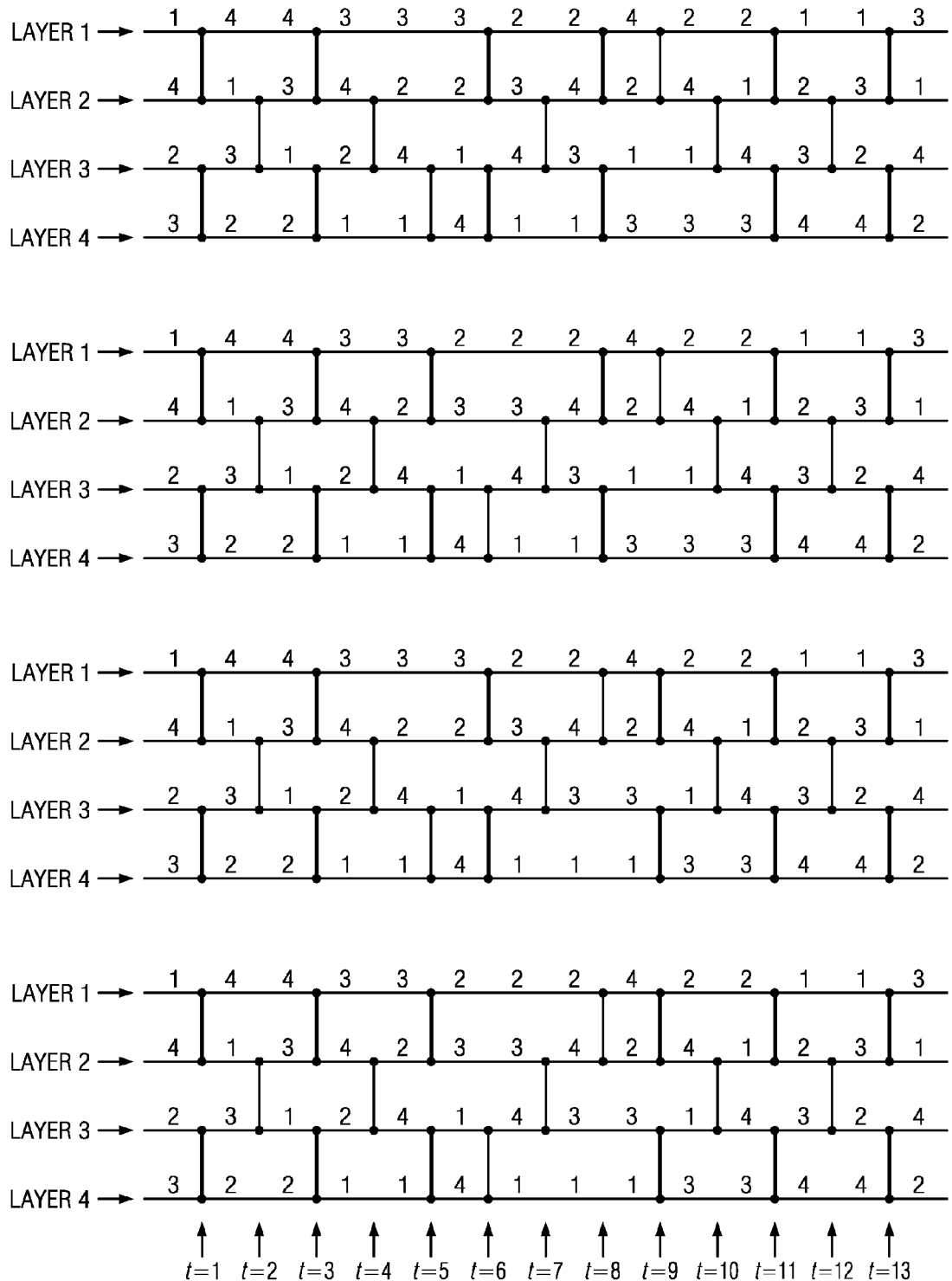
Figure 12N:
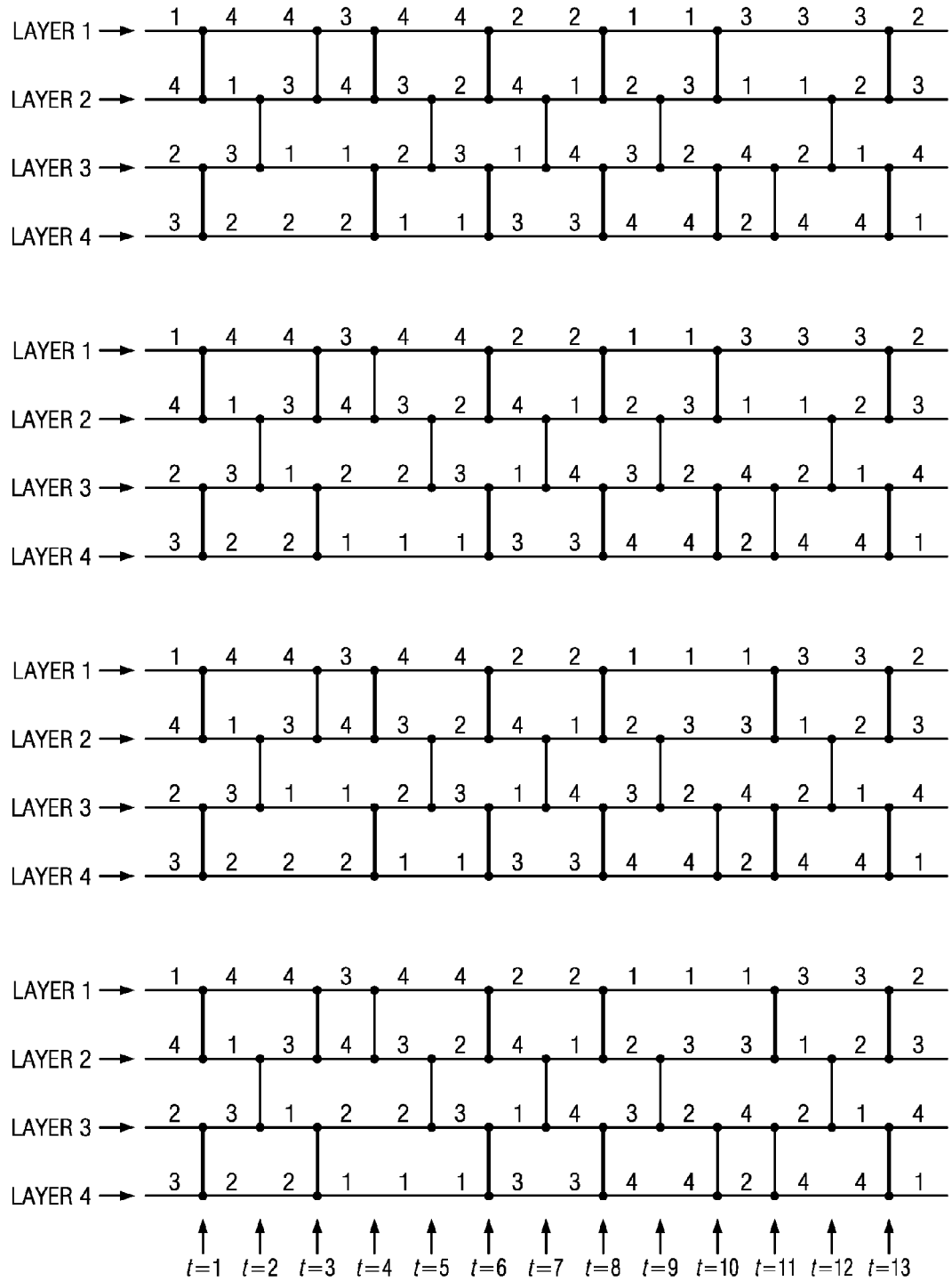
Figure 12O:
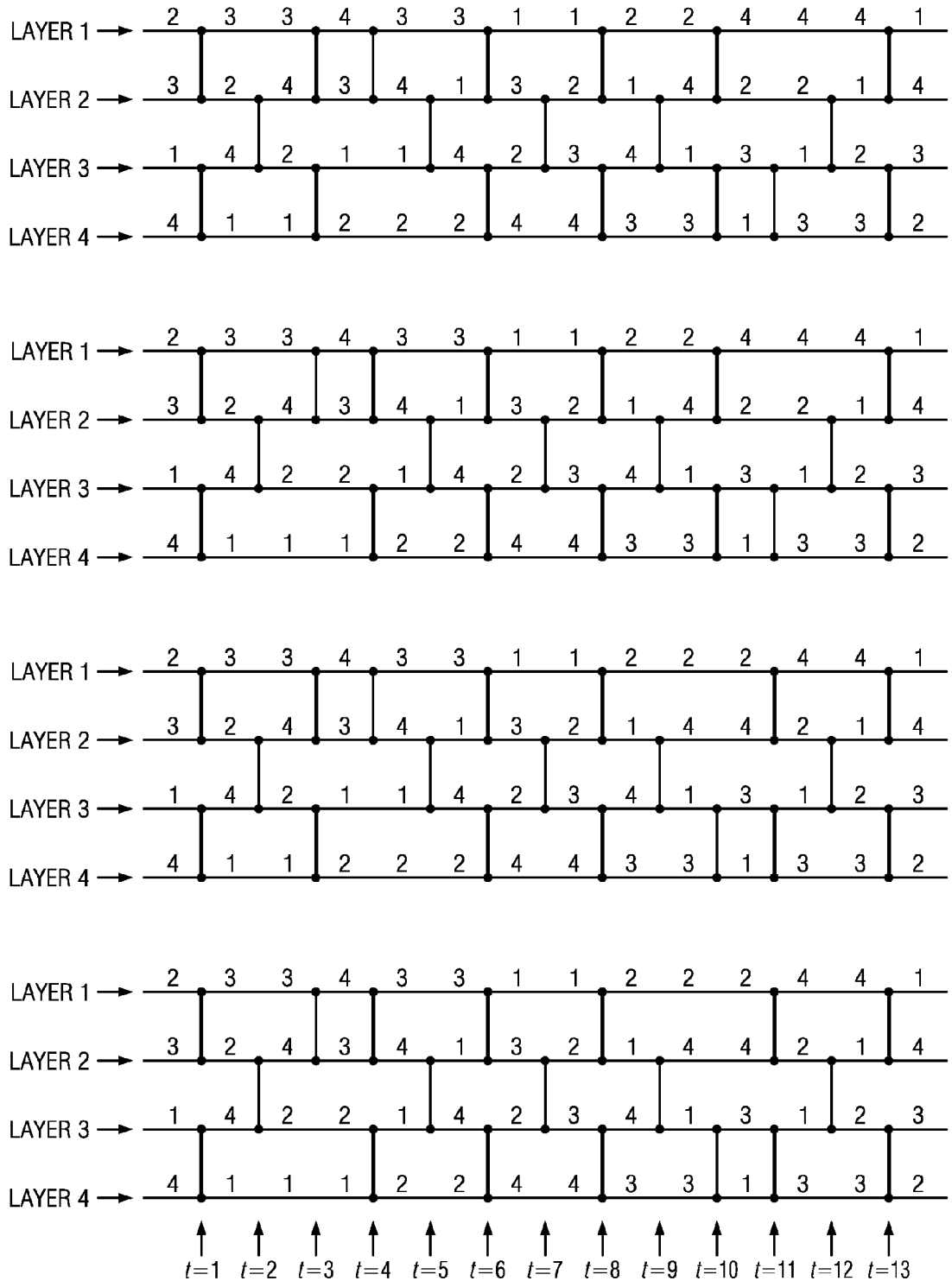
Figure 12P:
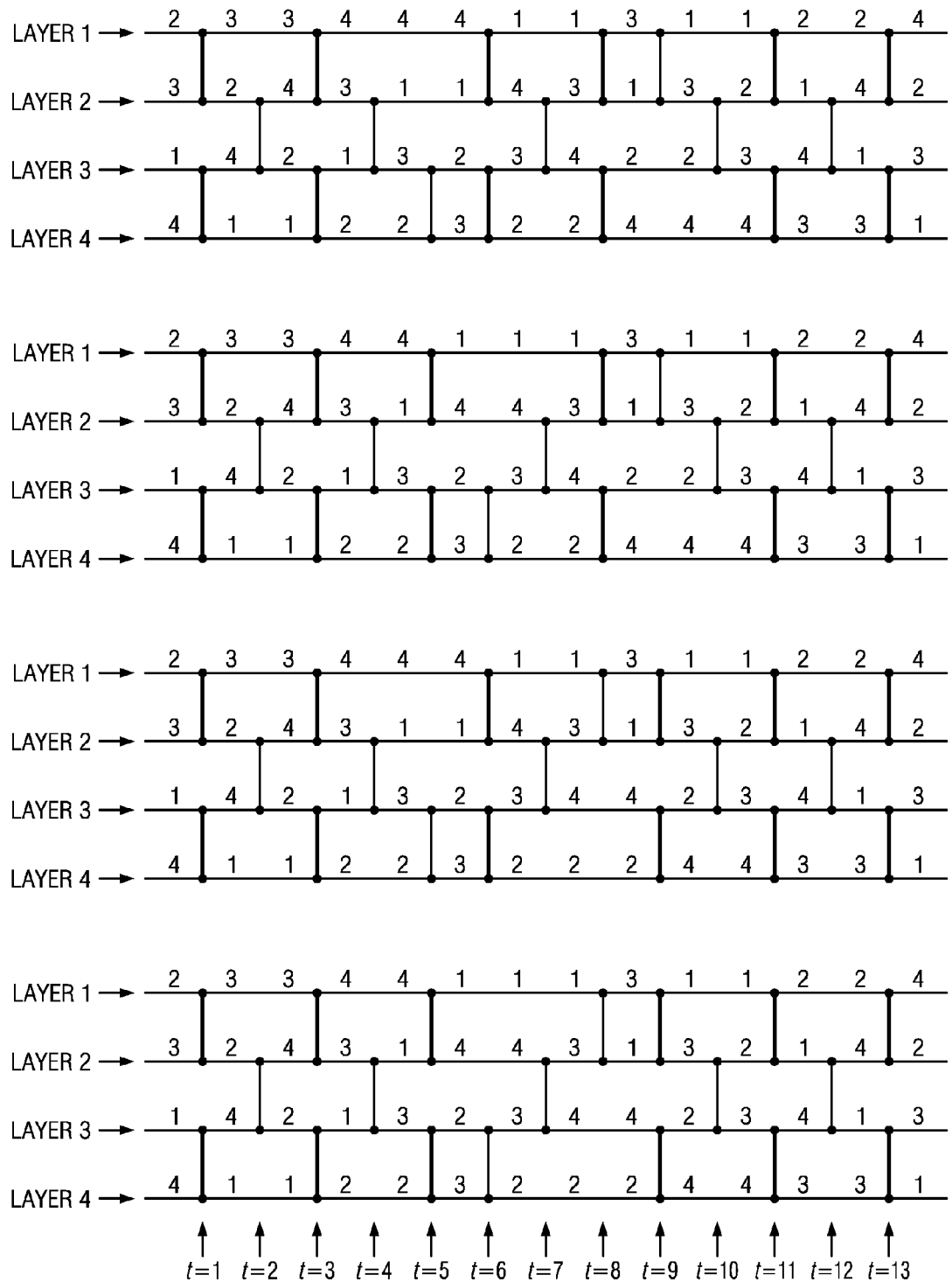
Figure 12Q:
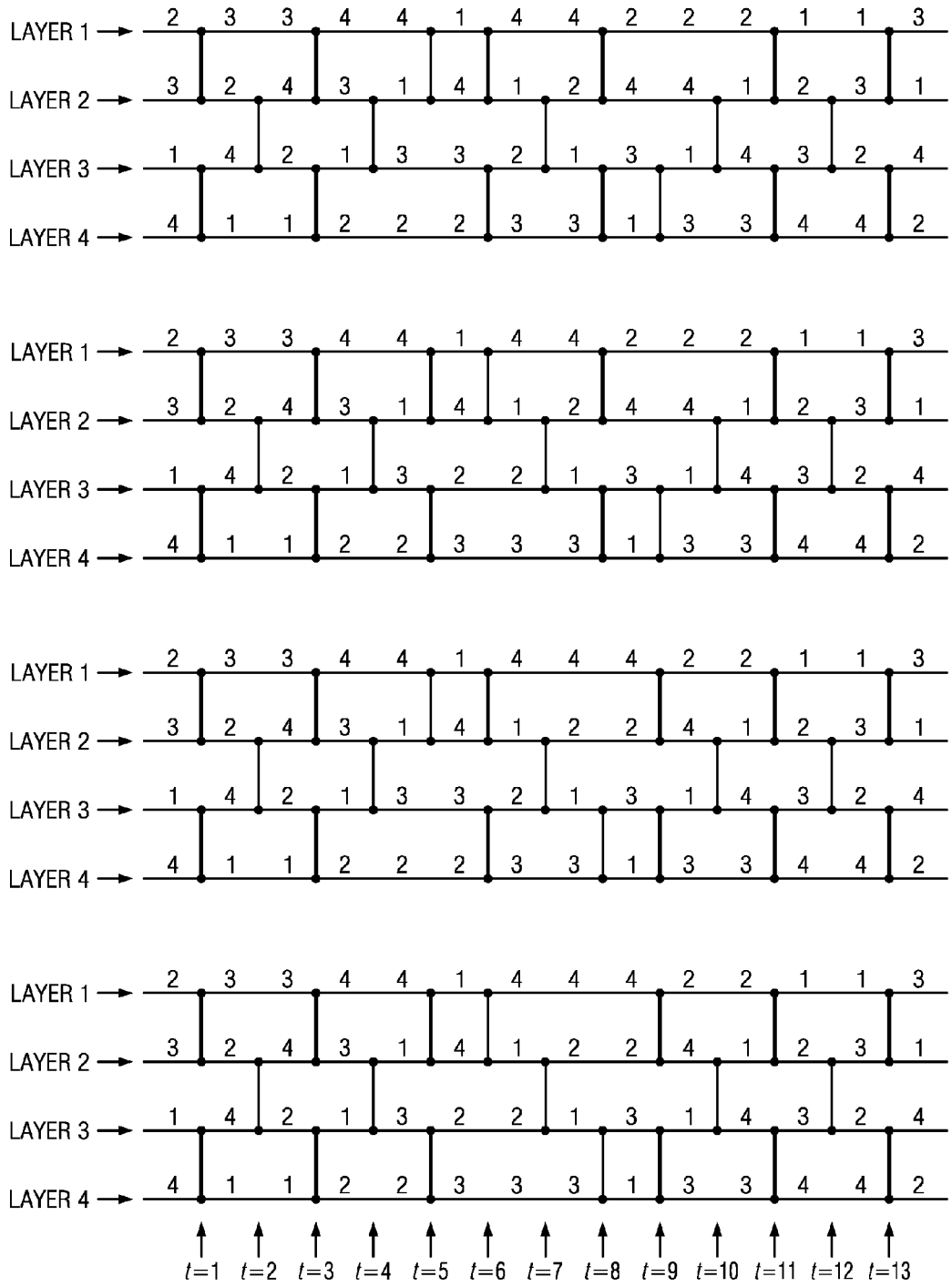
Figure 12R:
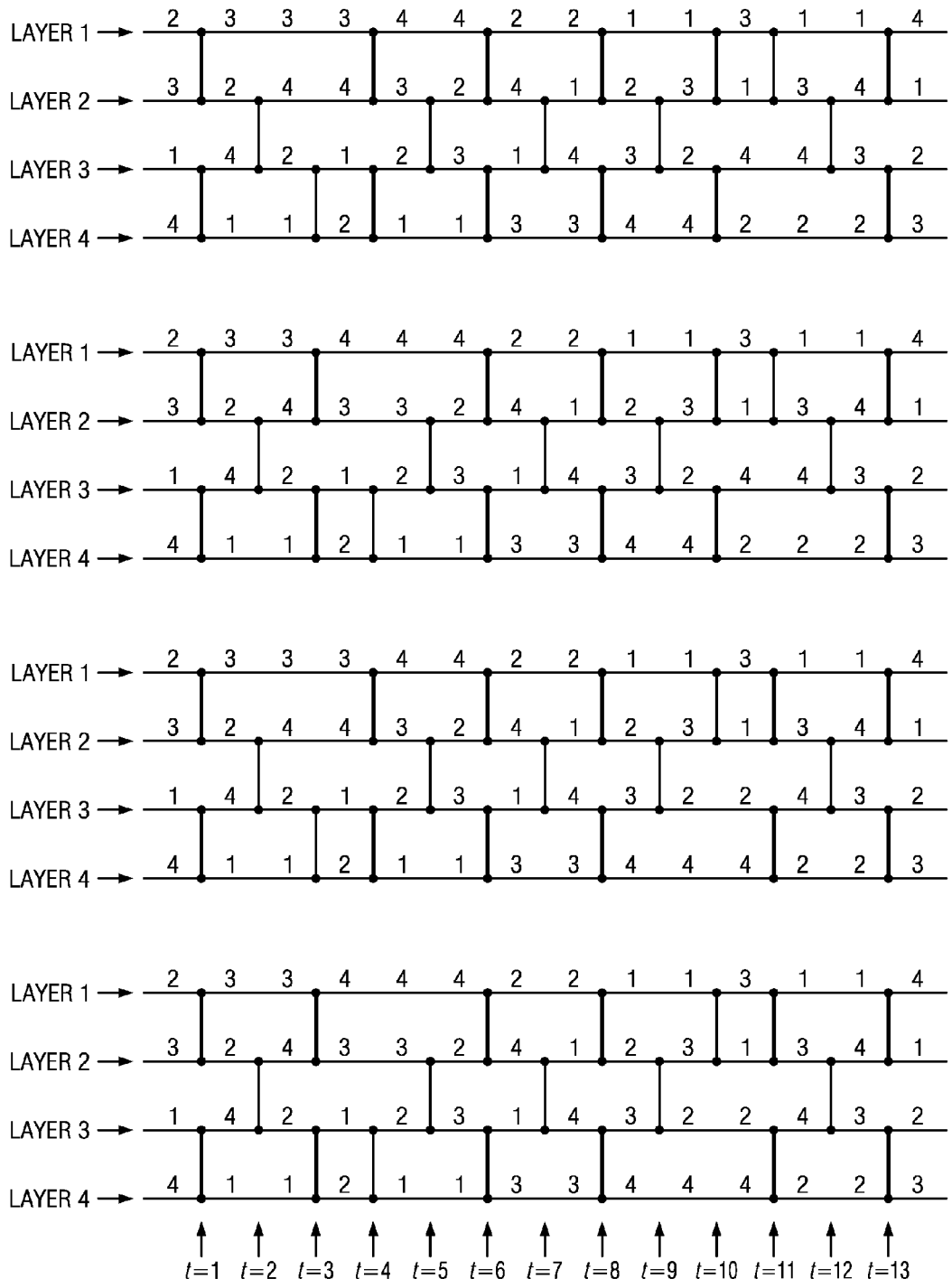
Figure 12S:
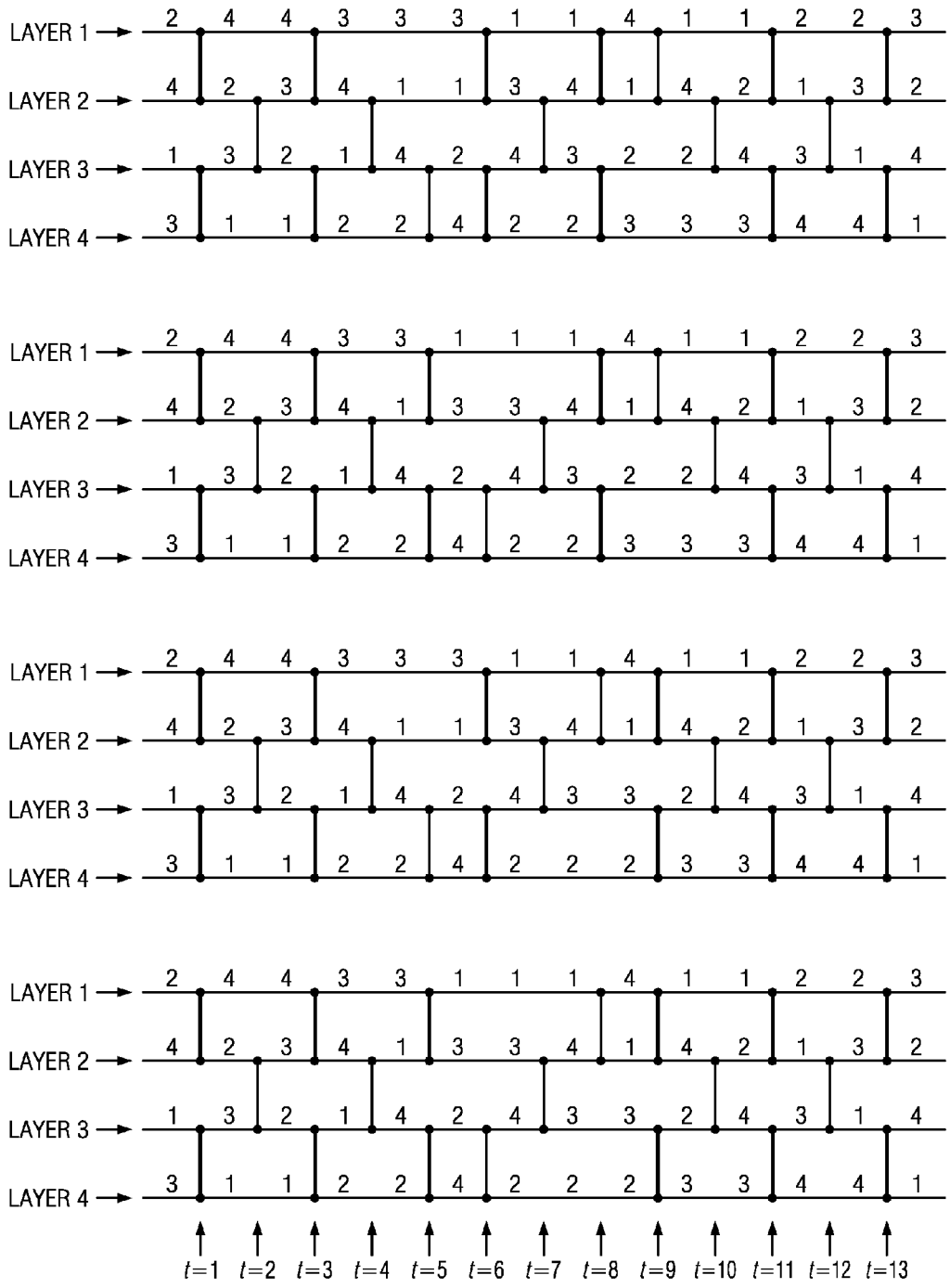
Figure 12T:
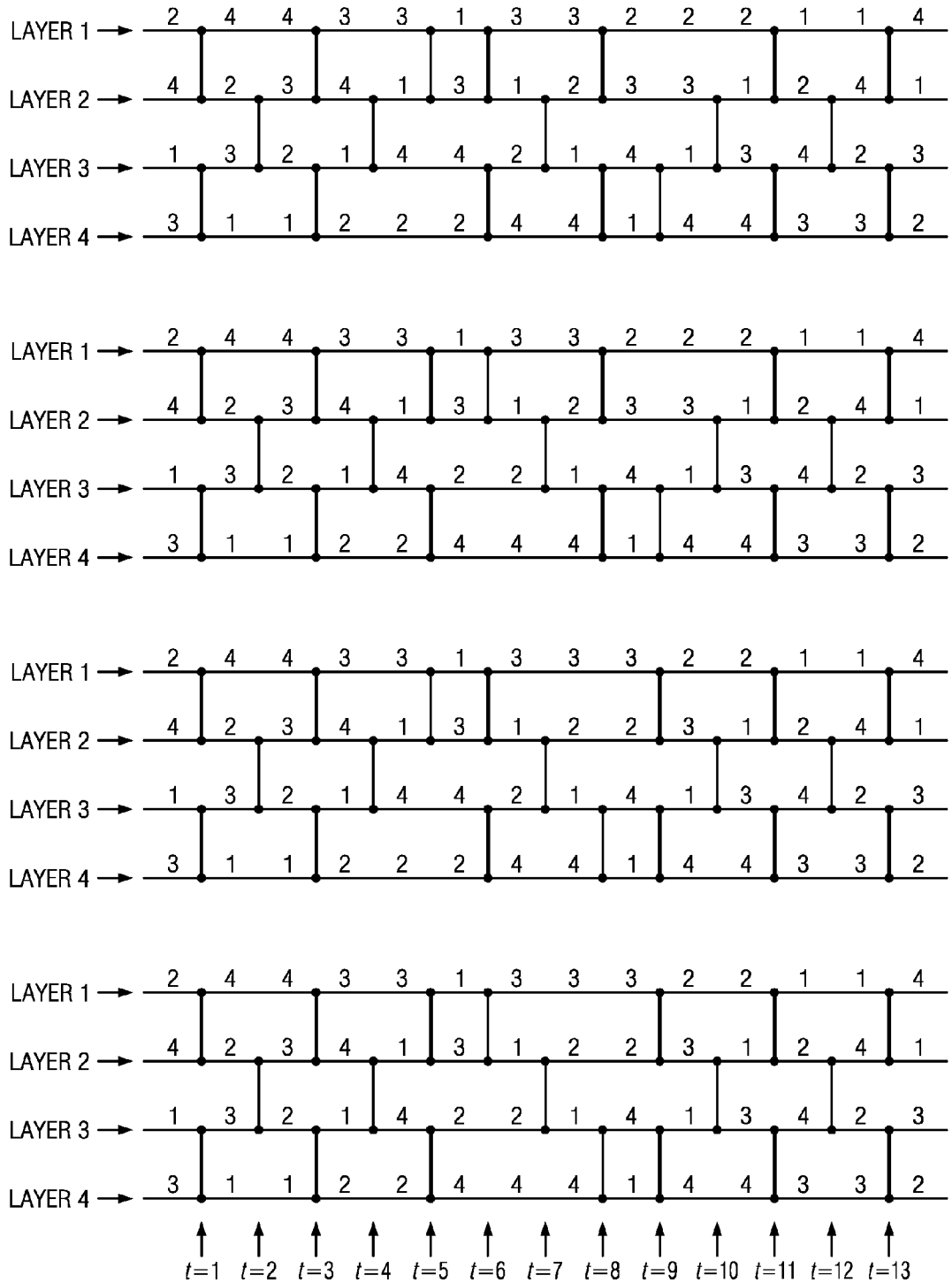
Figure 12U:
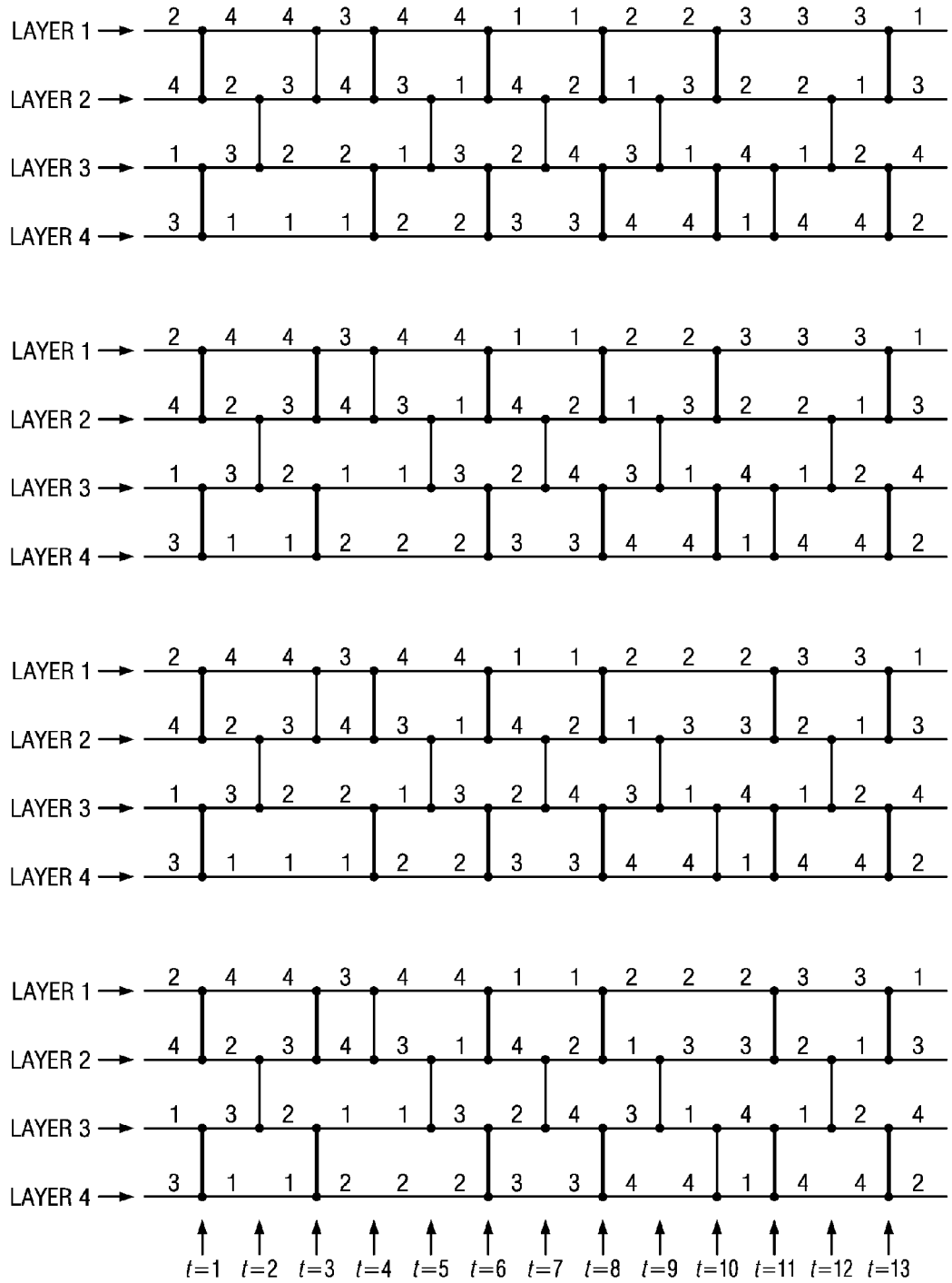
Figure 12V:
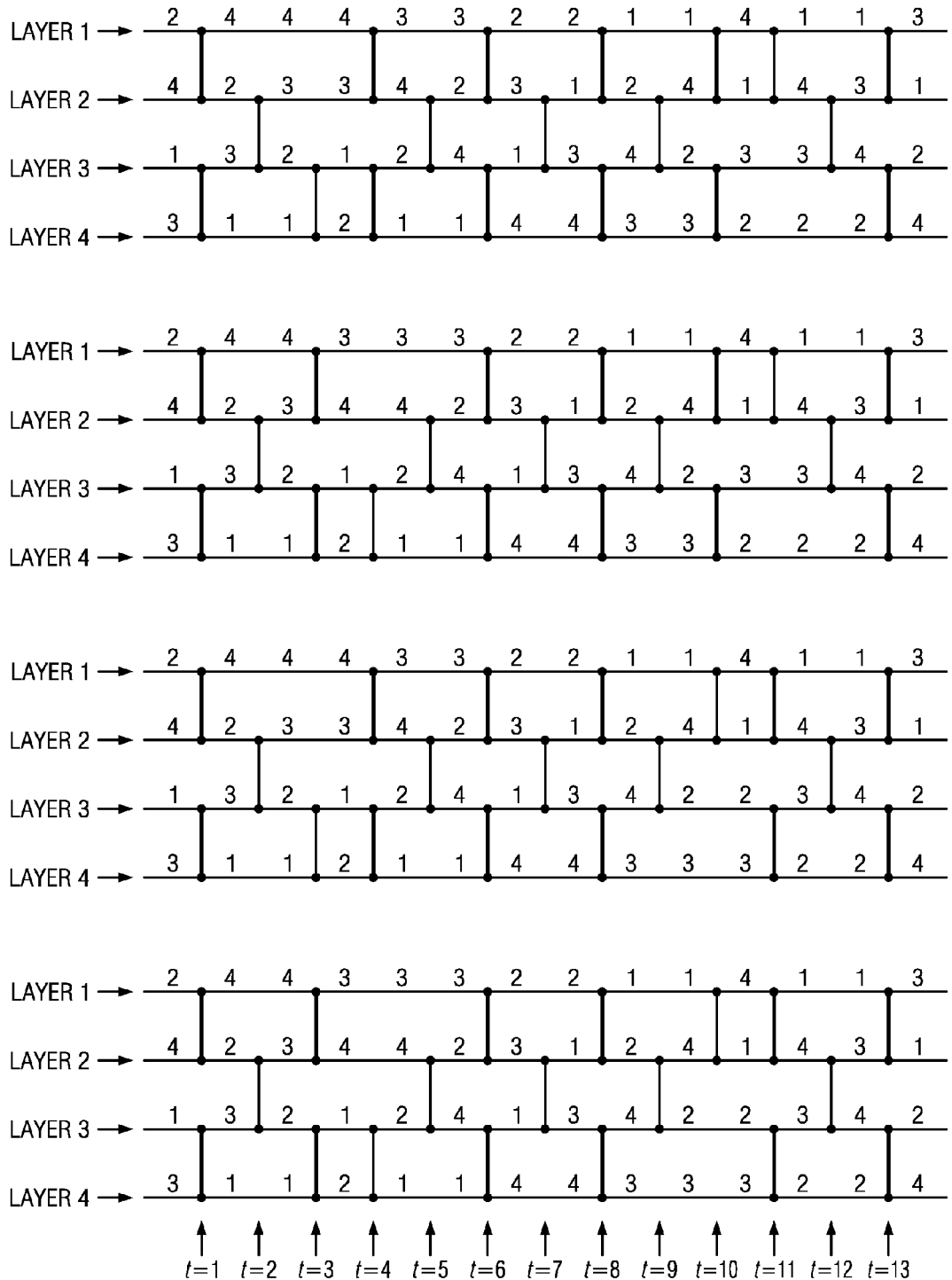
Figure 12W:
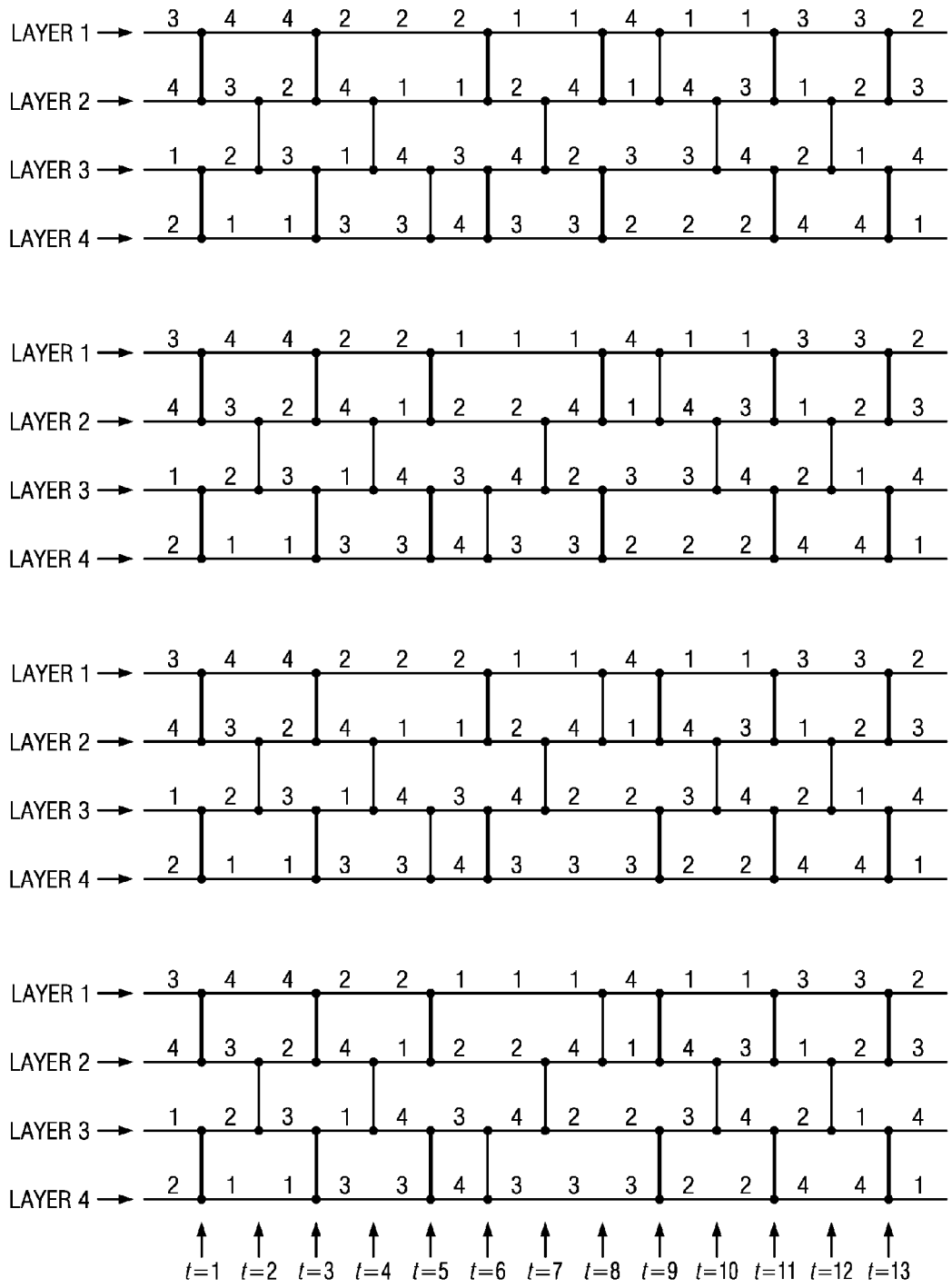
Figure 12X:
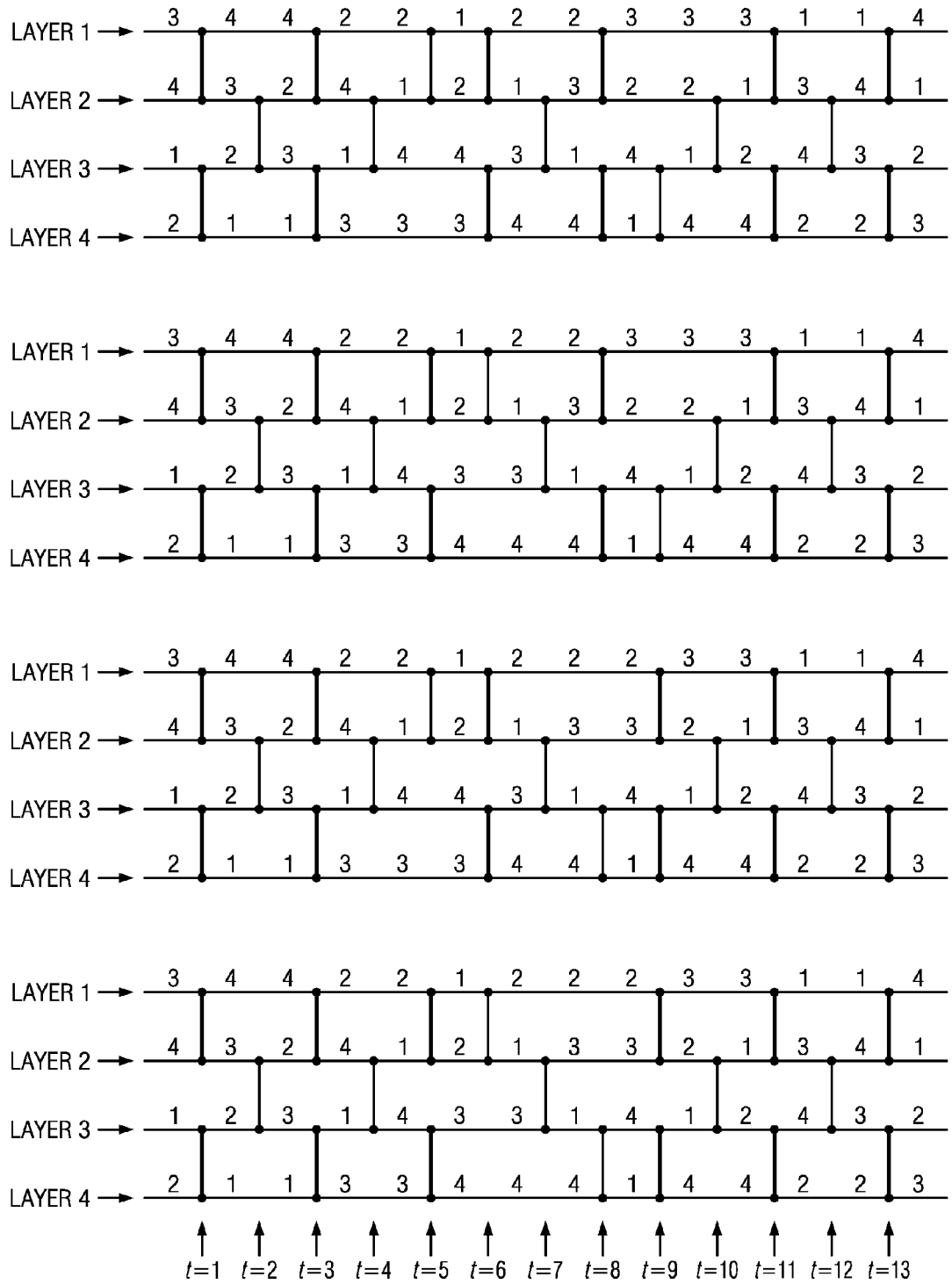
Figure 12Y:
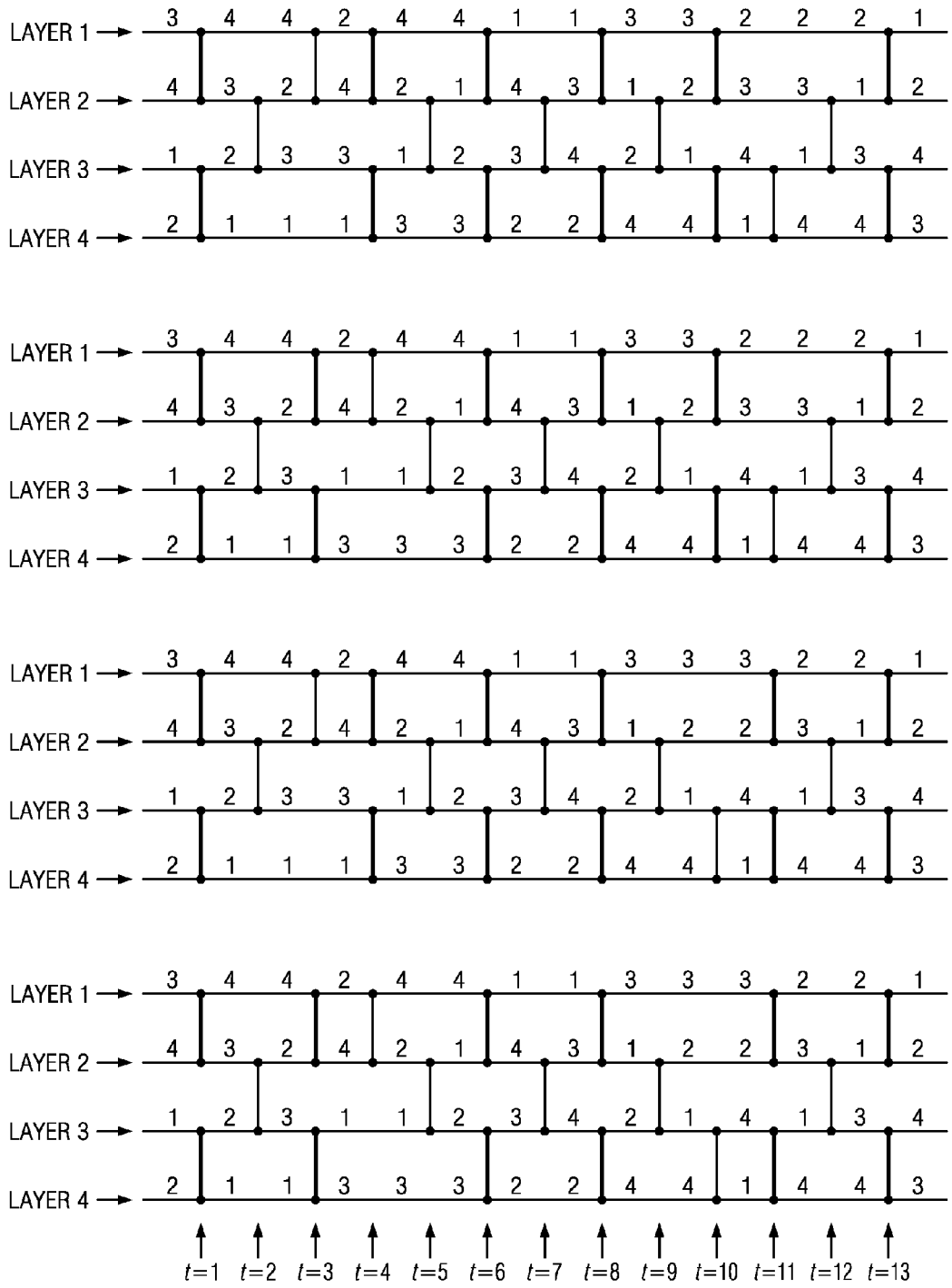

FIGS. 12A-12B illustrate one example of the optimum layer-swapping schedule that requires 19 layer swaps performed during 13 iterations to determine the optimum variable order for a BDD having 4 variables. There are about 60 different optimum layer-swapping schedules that each determine the optimum variable order for a BDD having 4 variables using 19 layers swaps performed during 13 iterations. Similarly to the layer-swapping schedule illustrated in FIGS. 12A-12B, each of the optimum layer-swapping schedules includes 6 enumeration iterations, during which layers 1 and 2 and layers 3 and 4 are swapped in parallel. For each of the 6 enumeration iterations, the sizes of 4 variable orders may be computed based on the implicit enumeration concept. Iterations in between the enumeration iterations reposition the variables. FIG. 12C illustrates the other examples of the optimum layer-swapping schedule. Again, each of these optimum layer-swapping schedules may be used to determine the optimum variable order of a BDD having 4 variables based on the implicit enumeration concept, and the process is similar to that described in connection with FIGS. 12A-12B.

Pair-Wise Grouping of BDD Variables
Assume n=2k (i.e., n is even). There exists $$\frac{n!}{2^k}$$

ways to separate a set of n numbers, {1, ..., n}, into $$\frac{n!}{2^k}$$

groups of k ordered sets of two elements (i.e., there are two elements in each set, and there are k sets in each group). Each particular group may be referred to as a particular separation of the n variables. For example, for the case of n=4 (i.e., k=2), there exists 6 ways to separate {1, 2, 3, 4} into 6 unique groups of 2 ordered sets of two elements. The following illustrates the 4 variables separated into 6 unique groups of 2 ordered sets of 2 variables:
  group 1: {1, 2} {3, 4}
  group 2: {1, 3} {2, 4}
  group 3: {1, 4} {2, 3}
  group 4: {2, 3} {1, 4}
  group 5: {2, 4} {1, 3}
  group 6: {3, 4} {1, 2}

Note that within each group of k sets of two elements, each element only appears once. For example, within each of the 6 types of separation above, if a number appears in the first set, then it does not appear in the second set. Conversely, if a number appears in the second set, then it does not appear in the first set. In particular embodiments, applying this concept to BDD variables, an element is equivalent to a variable. Each two-variable set includes two of the variables of a BDD, and each group includes k ordered sets). Within each two-variable set, the order of the two variables is irrelevant (e.g., {1, 2} is considered the same as {2, 1}). However, for each k ordered sets of two variables, the order matters. Thus, [{1, 2} {3, 4}] is not considered the same as [{3, 4} {1, 2}]. Therefore, there exists $$\frac{n!}{2^k}$$

ways to order the separations themselves. Since each group consists of k ordered sets of two variables, and two variables may be referred to as a pair of variables, this method of separating the BDD variables may be referred to as "pair-wise grouping" of the BDD variables.

For the case of a BDD having 6 variables (i.e., n=6 and k=3), there exist 90 ways to separate the 6 variables into 3 ordered sets of two variables each (i.e., 90 unique groups). The following illustrates a few example groups of the pair-wise separation of the 6 variables:
  group 1: {1, 2} {3, 4} {5, 6}
  group 2: {1, 3} {2, 4} {5, 6}
  group 3: {2, 4} {1, 3} {5, 6}
  group 4: {2, 5} {1, 6} {3, 4}
  group 5: {3, 4} {1, 5} {2, 6}
  group 6: {3, 6} {1, 2} {4, 5}
  group 7: {4, 5} {2, 3} {1, 6}
  group 8: {4, 6} {1, 5} {2, 3}
  group 9: {5, 6} {1, 2} {3, 4}

In particular embodiments, suppose each group of the k ordered sets of two variables is considered a particular variable order of the BDD. For example, in the case of 4 variables, group 1 provides variable order {1, 2, 3, 4} (i.e., variables 1, 2, 3, 4 are at layers 1, 2, 3, 4, respectively). Group 2 provides variable order {1, 3, 2, 4} (i.e., variables 1, 3, 2, 4 are at layers 1, 2, 3, 4, respectively). Group 3 provides variable order {1, 4, 2, 3} (i.e., variables 1, 4, 2, 3 are at layers 1, 2, 3, 4, respectively). And so on. In the case of 6 variables, group 1 provides variable order {1, 2, 3, 4, 5, 6} (i.e., variables 1, 2, 3, 4, 5, 6 are at layers 1, 2, 3, 4, 5, 6, respectively). Group 3 provides variable order {2, 4, 1, 3, 5, 6} (i.e., variables 2, 4, 1, 3, 5, 6 are at layers 1, 2, 3, 4, 5, 6, respectively). Group 5 provides variable order {3, 4, 1, 5, 2, 6} (i.e., variables 3, 4, 1, 5, 2, 6 are at layers 1, 2, 3, 4, 5, 6, respectively). And so on.

Using the case of 4 variables as an example, the BDD has 4 layers. Layers 1 and 2 and layers 3 and 4 form two disjoint pairs of consecutive layers. Therefore, layers 1 and 2 and layers 3 and 4 may be swapped concurrently, as described above in connection with FIG. 9. Considering group 1 of the 4-variable case, [{1, 2,} {3, 4}], which may provide variable order {1, 2, 3, 4}. If layers 1 and 2 and layers 3 and 4 are swapped, then after the layer swapping, the variable order becomes {2, 1, 4, 3}. Using the concept of implicit enumeration as described above in connection with FIG. 10, if the sizes of layers 1 and 2 are determined before and after layers 1 and 2 are swapped, and the sizes of layers 3 and 4 are determined before and after layers 3 and 4 are swapped, then the sizes of 4 variable orders (i.e., {1, 2, 3, 4}, {2, 1, 3, 4}, {1, 2, 4, 3}, and {2, 1, 4, 3}) may be computed by combining of the sizes of layers 1 and 2 and the sizes of layers 3 and 4. The same process may be applied to each of the other 5 groups. For example, for group 2 of the 4-variable case, [{1, 3} {2, 4}], before the layer swapping, the variable order provided by group 2 is {1, 3, 2, 4}. After the layer swapping, the variable order becomes {3, 1, 4, 2}. Again, if the sizes of layers 1 and 2 are determined before and after layers 1 and 2 are swapped, and the sizes of layers 3 and 4 are determined before and after layers 3 and 4 are swapped, then the sizes of 4 variable orders (i.e., {1, 3, 2, 4}, {3, 1, 2, 4}, {1, 3, 4, 2}, and {3, 1, 4, 2}) may be computed. Thus, each unique group may provide the sizes of four different variable orders by swapping layers 1 and 2 and layers 3 and 4. With 6 unique groups, the sizes of all 24 variable orders of a BDD having 4 variables may be computed. The variable order having the smallest size is the optimum variable order of the BDD.

Consider the case of 6 variables, where the BDD has 6 layers. Layers 1 and 2, layers 3 and 4, and layers 5 and 6 form three disjoint pairs of consecutive layers. Therefore, layers 1 and 2, layers 3 and 4, and layers 5 and 6 may be swapped concurrently. Each group may provide a different variable order. For example, group 7 of the 6-variable case provides variable order {4, 5, 2, 3, 1, 6}.

If the sizes of layers 1 and 2 are determined before and after layers 1 and 2 are swapped, the sizes of layers 3 and 4 are determined before and after layers 3 and 4 are swapped, and the sizes of layers 5 and 6 are determined before and after layers 5 and 6 are swapped then the sizes of 8 variable orders of the BDD may be computed by combining of the sizes of layers 1 and 2, the sizes of layers 3 and 4, and the sizes of layers 5 and 6 based on the implicit enumeration concept. In fact, each of the 90 unique groups may provide the sizes of 8 different variable orders by swapping layers 1 and 2, layers 3 and 4, and layers 5 and 6, thus providing the sizes of all 270 possible variable orders of a BDD having 6 variables. Again, the variable order having the smallest size is the optimum variable order of the BDD.

The process may be similarly applied to a BDD having n layers corresponding to n variables, where n is any integer, even or odd, that is greater than or equal to 3. When n is odd, there may be a set in each group that has only 1 variable, instead of 2 variables. For example, if n=5 (i.e., an odd number), then some example groups of the pair-wise separation of the 5 variables may be:

group 1: {1, 2} {3, 4} {5}
group 2: {1, 3} {4, 5} {2}
group 3: {2, 4} {1, 5} {3}
group 4: {1, 5} {3, 4} {2}

Because the variable sets in each group are ordered (i.e., the order of the sets in each group is relevant to the variable reordering algorithms), in particular embodiments, when n is odd so that there is one set in each group that has only one variable, the relative position of this one-variable set, with respect to the other two-variable sets, in each group is relevant and should be the same among all the groups. For example, the one-variable set may be the last set in all the groups, or the first set in all the groups, or the second set in all the groups, and so on. In other words, it is irrelevant which position (e.g., first, second, third, or last) the one-variable set is actually placed, in relation to the other two-variable sets, in each group, but it is necessary that the one-variable set is placed at the same position in relation to the other two-variable sets in all the groups.

Figure 13A:
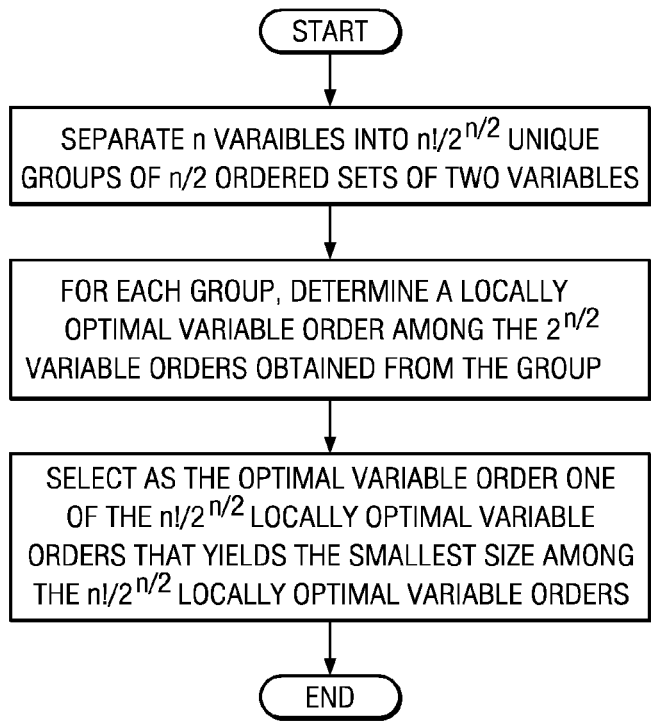
FIG. 13A illustrates an example of the pair-wise grouping of BDD variables.

To generalize, in particular embodiments, the n variables may be separated into $$\frac{n!}{2^{\lfloor n/2 \rfloor}}$$

unique groups, where each group consists of $$\lceil \frac{n}{2} \rceil$$

ordered sets. When n is even, all the sets in each group each have two variables. When n is odd, all the sets except one set in each group each have two variables, and one set in each group has one variable. Each group may provide the sizes of $2^{\lfloor n/2 \rfloor}$ different variable orders of the BDD based on the implicit enumeration concept (i.e., by concurrently swapping $$\lfloor \frac{n}{2} \rfloor$$

disjoint pairs of consecutive layers, determining the sizes of the disjoint pairs of consecutive layers, and combining these sizes). Finally, the variable order having the smallest size among all possible variable orders is the optimum variable order of the BDD In particular embodiments, once the $$\frac{n!}{2^{\lfloor n/2 \rfloor}}$$

unique groups of the $$\lceil \frac{n}{2} \rceil$$

ordered sets of two variables or one variable are formed, for each group, the variable order that yields the smallest size among the $2^{\lfloor n/2 \rfloor}$ different variable orders provided by that group may be determined. This variable order is the locally optimum variable order within that group. Then the $$\frac{n!}{2^{\lfloor n/2 \rfloor}}$$

locally optimum variable orders from the $$\frac{n!}{2^{\lfloor n/2 \rfloor}}$$

groups may be compared to select the variable order that yields the smallest size for the BDD. This is the optimum variable order of the BDD. FIG. 13A illustrates an example of the pair-wise group of the BDD variables.

In particular embodiments, once the $$\frac{n!}{2^{\lfloor n/2 \rfloor}}$$

unique groups of the $$\lceil \frac{n}{2} \rceil$$

ordered sets of two variables or one variable are formed, for each group, it is desirable to determine the locally optimum variable order within that group as efficiently as possible. In the case of a BDD having 4 variables, suppose the 6 groups resulted from separating the 4 variable are as follows:

group 1: {1, 2} {3, 4}
group 2: {2, 4} {1, 3}
group 3: {3, 4} {2, 1}
group 4: {4, 1} {2, 3}
group 5: {1, 3} {4, 2}
group 6: {3, 2} {1, 4}

Note that since within each set of two variables, the order of the two variables is irrelevant, [{4, 1,} {2, 3}] and [{1, 4} {2, 3}] are considered the same group, not two unique groups. Again, each two sets of two variables together may provide a different variable order. The optimum layer-swapping schedules described above in connection with FIGS. 12A-12B may be used to determine the sizes of the different variable orders obtained from the 6 groups efficient. If the 4 variables are separated into the above 6 groups, then the layer-swapping schedule illustrated in FIGS. 12A-12B may be used to determine the sizes of the 24 possible variable orders based on the implicit enumeration concept.

Figure 13B:
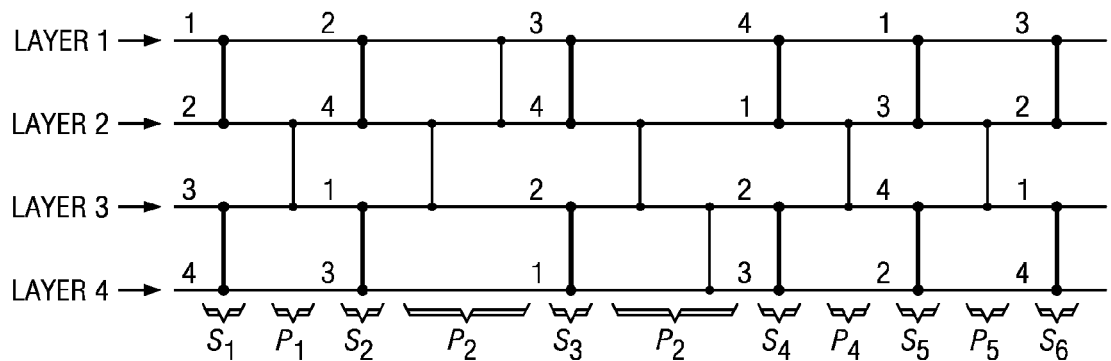
FIG. 13B illustrates the pair-wise grouping of four variables.

In FIG. 13B, the layer-swapping schedule for the four variables is the same as that illustrated in FIG. 12B. However, only the variable orders corresponding to the above 6 groups are marked. As FIG. 13B suggests, the 6 unique groups or 2 ordered sets of 2 variables, as illustrated above, correspond to the 6 variable orders before the 6 iterations during which both layers 1 and 2 and layers 3 and 4 are swapped. In the more general case of n variables separated into $$\frac{n!}{2^{\lfloor n/2 \rfloor}}$$

groups (i.e., separations) of $$\left\lceil \frac{n}{2} \right\rceil$$

ordered sets of two variables or one variable, in particular embodiments, each unique group corresponds to an iteration of the exact layer-swapping schedule during which all layer swaps (1,2), (3,4), ..., (n−1,n) are executed. In between these iterations, particular embodiments utilize the Parallel Permutation Algorithm in order to connect the two variable orders corresponding to two groups. For example, the variable order derived from the first of the two groups may be considered the initial variable order and the variable order derived from the second of the two groups may be considered the ending variable order in connection with the Parallel Permutation Algorithm. In particular embodiments, at most n iterations of layer swaps may need to be performed between two groups.

FIG. 13B thus illustrates the 6 separation stages and the parallel permutation stages for the above particular separation ordering. Each separation stage corresponds to a particular group of $$\frac{n}{2}$$

ordered sets of two variables. The 6 separation stages are marked as $S_1$ to $S_6$. The 5 parallel permutation stages in between the separation stages are marked as $P_1$ to $P_5$. Each separation stage corresponds to a single layer-swapping iteration. However, each of the linking parallel permutation stages may contain from 1 to 4 layer-swapping iterations for the case of 4 variables. Thus, the optimization goal is to detect a separation ordering that minimizes the number of iterations required by the parallel permutation stages, as this corresponds to a parallelly optimum layer-swapping schedule. As described above, the layer-swapping schedule illustrated in FIGS. 12A-12B is the optimum schedule for BDDs with 4 variables. Thus, in particular embodiments, this schedule may be applied to BDDs with 4 variables to determine the separation ordering that minimizes the number of iterations required by the parallel permutation stages.

In particular embodiments, this optimization may be performed offline, once for each specific value of n. Particular embodiments may use an exhaustive approach to detect the optimum separation orderings. Nevertheless, if n is large enough such that an exhaustive approach is not applicable or practical, then alternatively, particular embodiments may start with any separation order and subsequently independently move each separation to the left or to the right until its locally optimum position is detected. Each parallel permutation stage requires at most n iterations. Therefore, each separation ordering corresponds to a layer-swapping schedule that spans at most $$(n+1) \times \frac{n!}{2^{n/2}} \left( \text{i.e.,} \ \frac{(n+1)!}{2^{\lfloor n/2 \rfloor}} \right)$$

iterations. As the Plain Changes Algorithm requires n!−1 iterations, or at least n!−(n−1)! iterations in the parallel case, the process illustrated in FIG. 13A requires exponentially fewer layer-swapping iterations and thus layer swaps. In practice, the optimum separation ordering in fact requires significantly fewer iterations than $$\frac{(n+1)!}{2^{\lfloor n/2 \rfloor}}$$

as may be seen from the example cases.

Recursive Separation of BDD Variables

In particular embodiments, given any BDD having n, where n is any integer, even or odd, that is greater than or equal to 3, the n variables may be separated into $$\frac{n!}{2^{\lfloor n/2 \rfloor}}$$

unique groups, each consisting of $$\left\lceil \frac{n}{2} \right\rceil$$

ordered sets. Again, when n is even, all the sets in each group each have two of the n variables. When n is odd, all the sets except one set in each group each have two of the n variables, and one set in each group has one of the n variables. Again, the variable order within each set is irrelevant, while set order within each group is relevant. In particular embodiments, in the more specific case where n is a power of 2 (i.e., n may is repeatedly divisible by 2), the n variables may be separated into the $$\frac{n!}{2^{n/2}}$$

groups of $$\frac{n}{2}$$

ordered sets of 2 variables using a recursive algorithm. More specifically, given a set of n variables, during the first iteration, particular embodiments may separate the set into unique groups of 2 ordered sets of variables, where each set has $$\frac{n}{2}$$

variables. During the second iteration, particular embodiments may further separate each individual set within each individual group into 2 more ordered sets of variables, thus forming additional groups of 4 ordered sets of variables, where each set has $$\frac{n}{4}$$

variables. And so on. During each iteration, the new groups constructed by separating the individual sets from the existing groups replace the existing groups obtained from the previous iteration. The recursive process may continue until each set within each group has $$\frac{n}{2}$$

ordered sets of 2 variables.

Note that since the optimum variable order of a BDD having 4 variables may be determined efficiently using, for example, the optimum layer-swapping schedules described in FIGS. 12A-12C, in practice, the recursive process may continue until each set within each group has 4 variables. Then, the process described above in connection with FIGS. 12A-12C may be used to determine a locally optimum variable order for each set of 4 variables.

Figures 14A, 14B:
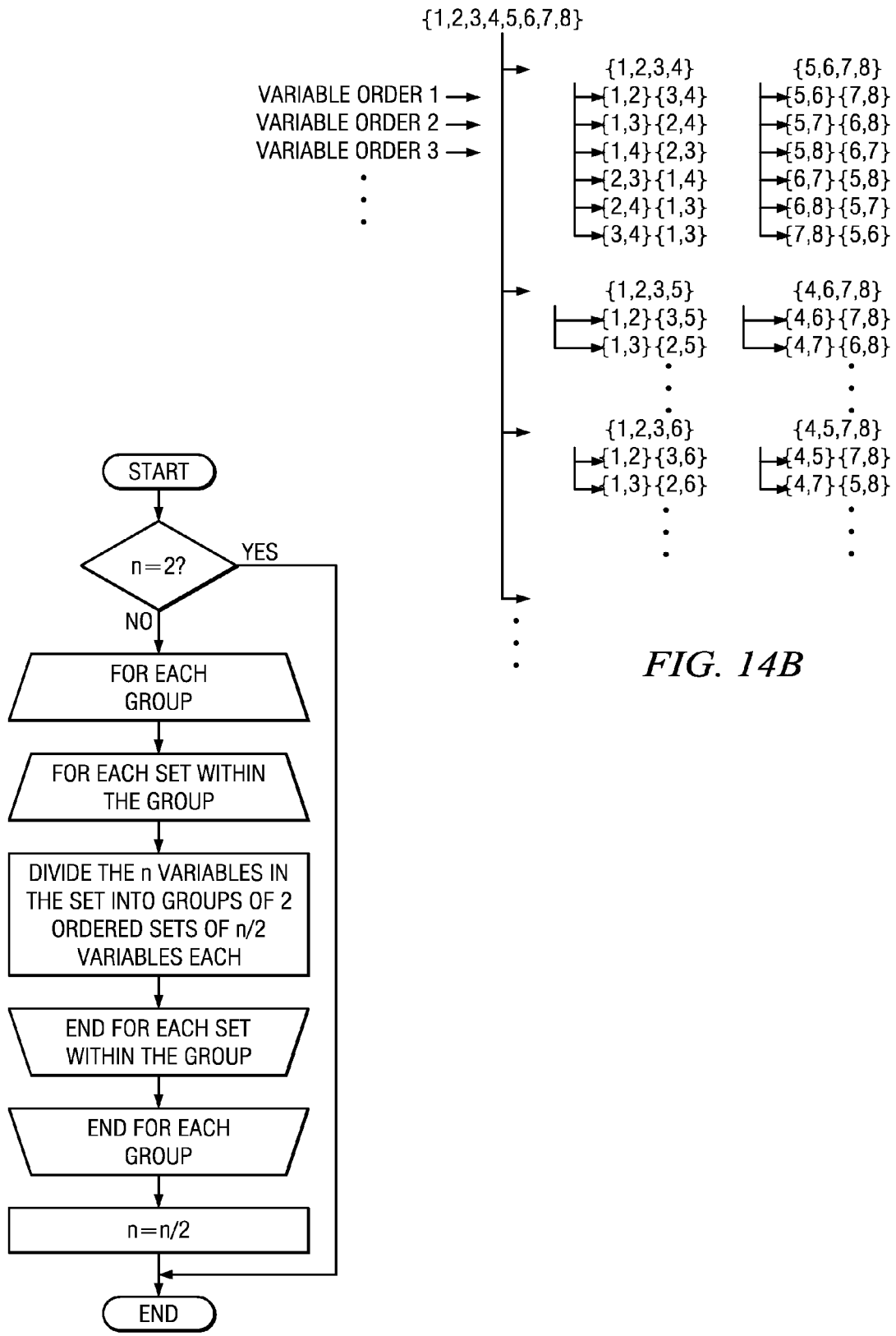
FIG. 14A illustrates an example of the recursive separation of BDD variables.
FIG. 14B illustrates the recursive separation of eight variables.

FIG. 14A illustrates an example of the recursive process used to separate n variables. FIG. 14B illustrates the recursive process as applied to 8 variables. Using n=8 as an example. During the first iteration, the 8 variables may be separated into a number of unique groups, where each group consists of 2 ordered sets, and each set consists of 4 variables. For example, after the first iterations, some of the groups may be:

group 1: {1, 2, 3, 4} {5, 6, 7, 8} group 2: {1, 2, 3, 5} {4, 6, 7, 8} group 3: {1, 2, 3, 6} {4, 5, 7, 8}

. . .

There are two many groups to list all in this disclosure. During the second iteration, within each group, each set of 4 variables are again separated into a number of unique groups, where each group consists of 2 ordered sets, and each set consists of 2 variables. For example, after the second iterations, set {1, 2, 3, 4} may form 6 groups of 2 sets of 2 variables. Similarly set {5, 6, 7, 8} may form another 6 groups of 2 sets of 2 variables each. Set {1, 2, 3, 5} may form yet another 6 groups of 2 sets of 2 variables each. And so on.

After the second iteration, each set within each group has 2 variables. Thus, the recursion may end. If n is a number greater than 8, then more iterations are needed. After the last iteration, in FIG. 14B, the sets of variables along each row form a unique group of 4 ordered sets of 2 variables, and each group may provide a unique variable order for a BDD of 8 variables. The optimum variable order of the BDD may be determined using a process similar to that described in connection with FIG. 13A. More specifically, particular embodiments may determine a locally optimum variable order within each group using the implicit enumeration concept, and then determine the optimum variable order for the BDD by selecting the locally optimum variable order that yields the smallest size among all the locally optimum variables corresponding to all the groups.

To summarize, in particular embodiments, given a set of n variables, where n may be any integer, odd or even, that is greater than 2, the existing set may be separated into two new sets of variables, with one set having $$\left\lfloor \frac{n}{2} \right\rfloor$$

of the n variables and the other set having $$\left\lceil \frac{n}{2} \right\rceil$$

of the n variables. Each of the n variables belongs to either one or the other, but not both, of the two new sets. Note that when n is even, the two new sets have the same number of variables. When n is odd, the two new sets differ by one variable. This method of separating an existing set of variables into two new sets of variables may be similarly applied to each set of variables in each group during each iteration of the recursive process illustrated in FIG. 14A.

In general, to separate n variables into two ordered sets, each having either $$\left\lfloor \frac{n}{2} \right\rfloor \text{ or } \left\lceil \frac{n}{2} \right\rceil$$

variables, there exist $$\binom{n}{n/2} = \frac{n!}{\left(\frac{n}{2}\right)!^2}$$

unique groups (i.e., there are $$\frac{n!}{\left(\frac{n}{2}\right)!^2}$$

different ways to separate the n variables thus), each consisting of 2 ordered sets of $$\left\lfloor \frac{n}{2} \right\rfloor \text{ or } \left\lceil \frac{n}{2} \right\rceil$$

variables. The recursion continues until the n variables are separated into multiple unique groups (i.e. separation), where each group includes $$\left\lceil \frac{n}{2} \right\rceil$$

ordered sets of 2 variables or 1 variable. That is, the algorithm is recursively executed on each subset of $$\left\lfloor \frac{n}{2} \right\rfloor \text{ or } \left\lceil \frac{n}{2} \right\rceil$$

variables until each subset has 2 variables or 1 variable. Within each group, each variable appears only once in one of the sets.

Figure 12Z:
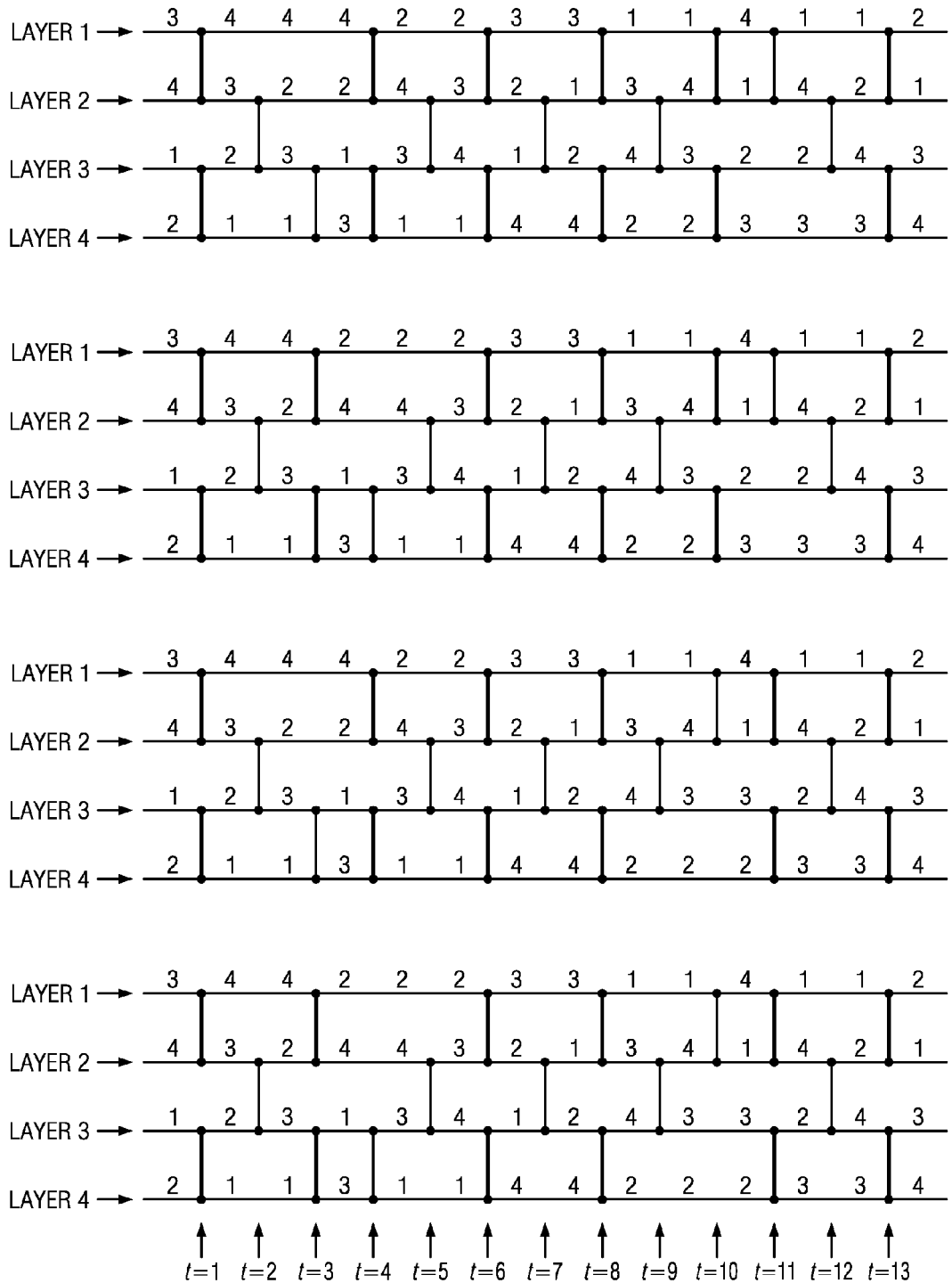

As described above, the optimum variable order of a BDD having 4 variables may be determined using, for example, any of the algorithms illustrated in FIGS. 12A-12Z. Thus, in particular embodiments, the recursion to separate n variables may continue until each set in each group has 4 variables or less. Then the locally optimum variable order of each set in each group may be determined using, for example, any of the algorithms illustrated in FIGS. 12A-12Z. For each group, its locally optimum variable order may be determined using the locally optimum variable orders of the individual sets in that group. Then for the BDD, its optimum variable order may be determined using the locally optimum variable orders of the individual groups.

For the case of n=5 (i.e., 5 variables), based on the method of separating n variables described above, in particular embodiments, the 5 variables may be separated into groups of 2 ordered sets, where within each group, one set has 2 variables and one set has 3 variables. The optimum variable order of 5 variables may then be determined using such groups. However, in particular embodiments, experiments suggest that it may be more efficient to separate the 5 variables into groups of 2 ordered sets, where within each group, one set has 4 variables and one set has 1 variable. The locally optimum variable order of each 4-variable set in each group may be determined using, for example, any of the algorithms illustrated in FIGS. 12A-12Z. For each group, its locally optimum variable order may be determined using the locally optimum variable order of the 4-variable set in that group. The optimum variable order for the case of 5 variables may be determined using the locally optimum variable orders of the individual groups.

In particular embodiments, the recursion to separate n variables may continue until each set in each group has 5 variables or less. Then the locally optimum variable order for each 4-variable set in each group may be determined using, for example, any of the algorithms illustrated in FIGS. 12A-12Z. The locally optimum variable order of each 5-variable set in each group may be determined using the method described above for the 5-variable case. For each group, its locally optimum variable order may be determined using the locally optimum variable orders of the individual sets in that group. Then for the BDD, its optimum variable order may be determined using the locally optimum variable orders of the individual groups.

In particular embodiments, the concept may be further generalized as the following. The recursion to separate n variables may continue until each set in each group has k variables or less, where 1≤k<n. In particular embodiments, k may be predefined (e.g., k may be 2, 3, 4, or 5). The locally optimum variable order of each set in each group may be determined using any appropriate algorithm. The locally optimum variable order of each group may be determined using the locally optimum variable orders of the individual sets in that group. And the optimum variable of the BDD may be determined using the locally optimum variable orders of the individual groups.

In particular embodiments, the separation stages are ordered and linked with parallel permutation stages in a similar fashion as described above in connection with FIGS. 13A-13B for the four-variable case. It may be shown that the required iterations are obtained by the recursion $$L(n) \le \binom{n}{n/2} \times (n + L(n/2)) \le 4^n,$$

which is an improvement upon the required iterations of the existing exact algorithm.

Comparing this recursive algorithm for separating the n variables with the non-recursive algorithm described above in connection with FIGS. 13A-13B, the recursive algorithm requires at most $4^n$ iterations of layer swapping to determine the optimum variable order for a BDD having n variables, while the non-recursive algorithm requires at most $$\frac{(n+1)!}{2^{n/2}}$$

iterations of layer swapping to determine the optimum variable order for a BDD having n variables. For n greater than 4, the recursive algorithm is more efficient.

Parallel Window Algorithm

The Window Algorithm described in connection with FIG. 8 provides that, for a BDD that represents a function having n variables, a "window" of size k may be selected, where 2≤k<n. The algorithm iteratively and sequentially detects the optimum ordering of layers [1 . . . k], [2 . . . k+1], [3 . . . k+2] . . . [n−k+1 . . . n]. The existing Window Algorithm uses the Plain Changes Algorithm to reorder the variables within each window according to its local optimum order.

In particular embodiments, the existing Window Algorithm may be improved with parallelization. Particular embodiments select a window size of k (e.g., k=4). A window then consists of k consecutive layers. Then, within each window, the locally optimum variable order for the k variables at the k consecutive layers may be determined, and the k variables may be reordered according to its locally optimum variable order or locally substantial optimum variable order using any suitable BDD variable reordering algorithm. Furthermore, multiple disjoint windows of k consecutive layers may be processed in parallel. Two windows are disjoint if they do not share a common layer.

In particular embodiments, for a BDD having n layers corresponding to n variables, with a window of size k (e.g., k=4), during each iteration, the n layers may be grouped into at most $$\left\lfloor \frac{n}{k} \right\rfloor$$

disjoint windows (e.g., if k=4, then window 1 includes layers 1 to 4; window 2 includes layers 5 to 8; window 3 includes layers 9 to 12; and so on). The $$\left\lfloor \frac{n}{k} \right\rfloor$$

disjoint windows may be reordered in parallel, each using a suitable BDD variable reordering algorithm (e.g., the Plain Changes Algorithm or any of the algorithms described above that determines the optimum variable order for a set of variables). For example, if k=4, then to find a local optimum variable order for each window, a variable reordering algorithm based the Optimum Layer-Swapping Schedule for BDDs with four variables may be used.

Between different iterations, the n layers may be grouped differently. In particular embodiments, for example, if n is divisible by 4, then during the first iteration, the windows are: layers {1 . . . 4}, layers {5 . . . 8}, . . . , layers {n−3 . . . n}. During the second iteration, the windows are: layers {2 . . . 5}, layers {6 . . . 9}, . . . , layers {n−6 . . . n−3}. During the third iteration, the windows are: layers {3 . . . 6}, layers {7 . . . 10}, . . . , layers {n−5 . . . n−2}. During the fourth iteration, the windows are: layers {4 . . . 7}, layers {8 . . . 11}, . . . , layers {n−4 ... n−1}. The windows of the fifth, sixth, seventh, and eighth iterations are the same as the windows of the first, second, third, and fourth iterations, and so on. The process may continue until convergence (e.g., until the total size of the BDD is smaller than a desired or predefined threshold, or until further adjustment of the variable positions no longer significantly reduces the total size of the BDD).

Figure 15A:
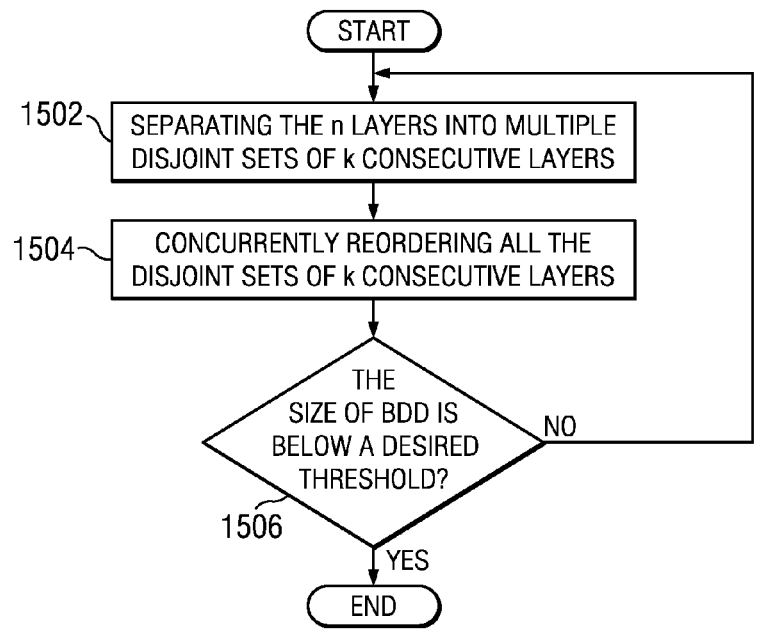
FIG. 15A illustrates an example of the Parallel Window Algorithm

FIG. 15A illustrates an example of the Parallel Window Reordering Algorithm. FIG. 15B illustrates the Parallel Window Reordering Algorithm using an example window of size 4 as applied to an example BDD 1500 having twelve layers corresponding to twelve variables. The steps of FIG. 15A is described using BDD 1500 as an example. During the first iteration (i.e., t=1), the twelve layers are separated into three disjoint sets of four consecutive layers, as illustrated in step 1502 of FIG. 15A. Thus, the windows are: layers {1 ... 4}, layers {5 ... 8}, and layers {9 ... 12}. The three windows may be reordered in parallel, as illustrated in step 1504 of FIG. 15A, each using the Optimum Reordering Algorithm for BDDs with four variables or any other suitable variable reordering algorithms. After all the windows have been reordered, the current size of BDD 1500 is determined. If the current size of BDD 1500 is less than a desired threshold, then the process may end, as illustrated in step 1506 of FIG. 15A. Otherwise, another iteration may be performed. For example, during the second iteration (i.e., t=2), the twelve layers are separated into two disjoint sets of four consecutive layers. Thus, the windows are: layers {2 ... 5}, and layers {6 ... 9}. The two windows may be similarly reordered in parallel. During the third iteration (i.e., t=3), the windows are: layers {3 ... 6}, and layers {7 ... 10}, and the two windows may be similarly reordered in parallel. During the fourth iteration (i.e., t=4), the windows are: layers {4 ... 7}, and layers {8 ... 11}, and the two windows may be similarly reordered in parallel. During fifth iteration, the grouping may move back up starting from layer 1 again, similar as during the first iteration. And so on, until a desired variable order is obtained (e.g., the size of the BDD is sufficient small).

In particular embodiments, during each iteration, the n layers of a BDD are separated into multiple disjoint sets of k consecutive layers. However, the disjoint sets of k consecutive layers constructed during each iteration differ from the disjoint sets of k consecutive layers constructed during a previous iteration that immediately precedes the current iteration. As a result, the n layers are separated and grouped differently during each iterations, as illustrated in FIG. 15B.

In practical applications, windows of size 4 or less are most commonly used. However, the above process illustrated in FIG. 15B may be extended to apply to windows of any size (e.g., size k). In the general case, with a window size of k, particular embodiments may apply the corresponding exact reordering algorithm on layers [a×k+1+b, (a+1)×k+b], alternating between iterating on a where (a+1)×k+b≤n and on b where b∈[0, k−1]. Swaps may again be performed until convergence.

Window Algorithm Using Maximal Parallelization

In addition to reorder the variables within multiple windows in parallel, as described above in connection with FIG. 15B, within each window, the reordering of the k variables at the k consecutive layers may utilize the maximum parallelization concept as described above in connection with FIG. 9.

Figure 16:
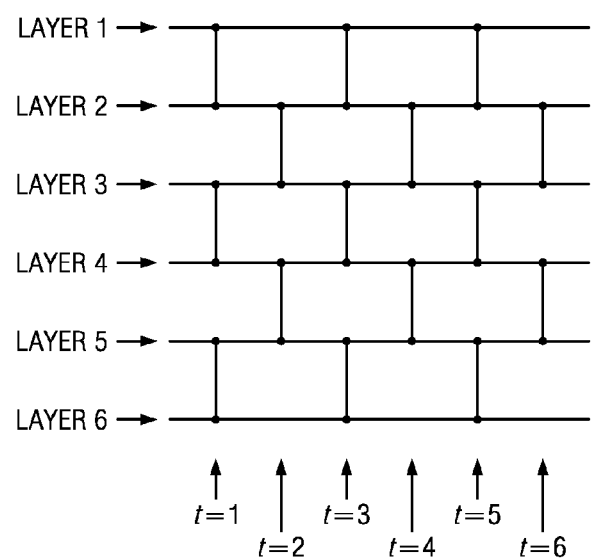
FIG. 16 illustrates an example of the Window Algorithm with maximal parallelization as applied to a BDD having six layers corresponding to six variables.

FIG. 16 illustrates an example of reordering the variables at the k consecutive layers within a single window, using an example window size of 6. In particular embodiments, during each odd iteration, the k layers are grouped into odd-grouping disjoint pairs of consecutive layers and during each even iteration, the k layers are grouped into even-grouping disjoint pairs of consecutive layers, or vice versa. During each iteration, all the disjoint pairs of consecutive layers are swapped concurrently. This algorithm maintains the structure of the Windowing Algorithm. For a given k, the algorithm performs all layer swaps required to move its k inputs in the inverse permutation. Note the structural similarity with the Parallel Permutation Algorithm. In this case, however, all layer swaps are unconditionally executed during each iteration. Moreover, during each iteration, the sizes of all implicitly discovered permutations are computed. The permutation of the smallest size is kept (e.g., recorded). After the completion of all layer swaps on the k layers, the Parallel Permutation Algorithm may be utilized to return the k layers to the permutation of the smallest size. Again, particular embodiments may repeat the process, where the layers are grouped differently during different iterations, until the BDD has reached a desired size.

Parallel Sifting Algorithm

The main disadvantage of the Sifting Algorithm described above in connection with FIG. 7 is that it is inherently sequential. The variables of a BDD are ordered according to the sizes of the layers on which they reside. To alleviate this disadvantage of the Sifting Algorithm, particular embodiments concurrently sift (i.e., moves) k variables, instead of sifting one variable at a time. However, each of the k variables may be sifted in the manner similar to that described in FIG. 7. In particular embodiments, given a BDD having n layers corresponding to n variables, the n variables may be moved to their optimum layers using an iterative process. During each iteration, the k variables at the k layers that currently have the largest sizes during the current iteration may be sifted to their locally optimum layers (i.e., positions). For each set of k variables, sifting is performed on the k variables concurrently. For example, the k variables at the k largest layers are sifted concurrently first, followed by the k variables at the second k largest layers, and so on. After each iteration of concurrent layer swaps, the size of all implicitly the generated permutations is computed. When sifting has been performed for all the variables in a set, the Parallel Permutation Algorithm is utilized to return the ordering to the one that is locally minimum. The algorithm continues for all sets of variables and may be repeated until convergence.

Figure 17A:
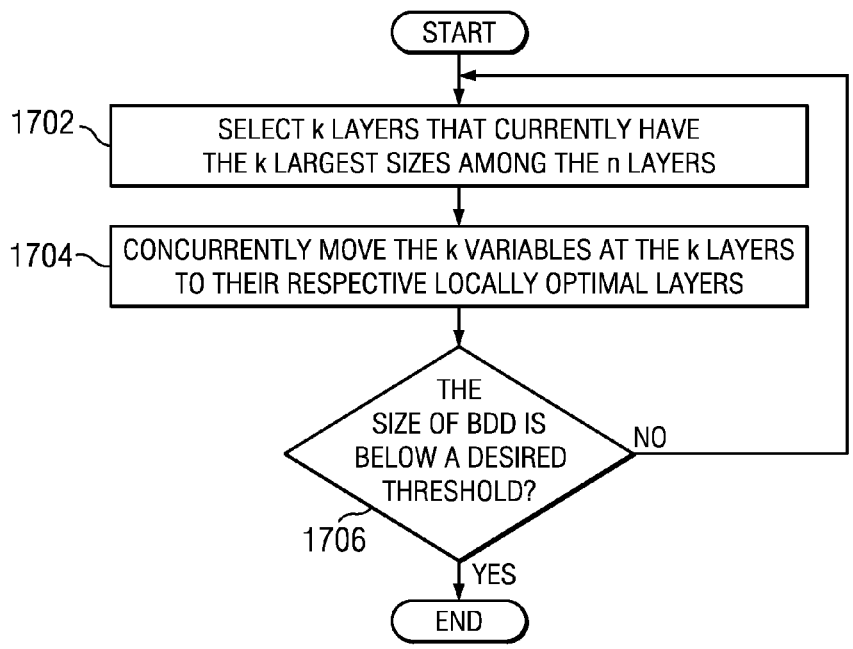
FIG. 17A illustrates an example of the Parallel Sifting Algorithm.

FIG. 17A illustrates an example of the Parallel Sifting Algorithm. In particular embodiments, during the first iteration, k layers that currently have the largest sizes among the n layers of a BDD are selected, as illustrated in step 1702 of FIG. 17A. The k variables currently positioned at the selected k layers are sifted concurrently during this iteration. The k variables are moved to their respective locally optimum layers in parallel, as illustrated in step 1704 of FIG. 17B. To do so, each of the k variables may be sifted to its locally optima layer using the process described above in connection with FIG. 7. For example, each variable may be moved through the n layers in order to determine the layer that currently yields the smallest size among the n layers with the variable. This layer is the locally optimum layer of the variable during the current iteration. However, particular embodiments sift the k variables in parallel. After all k variables are positioned at their locally optimum layer, the current size of the BDD is determined. If the current size of the BDD is less than a desired threshold, then the process may end, as illustrated in step 1706 of FIG. 17A. Otherwise, another iteration may be repeated, which consists of performing steps 1702 and 1704 again.

Figure 17B:
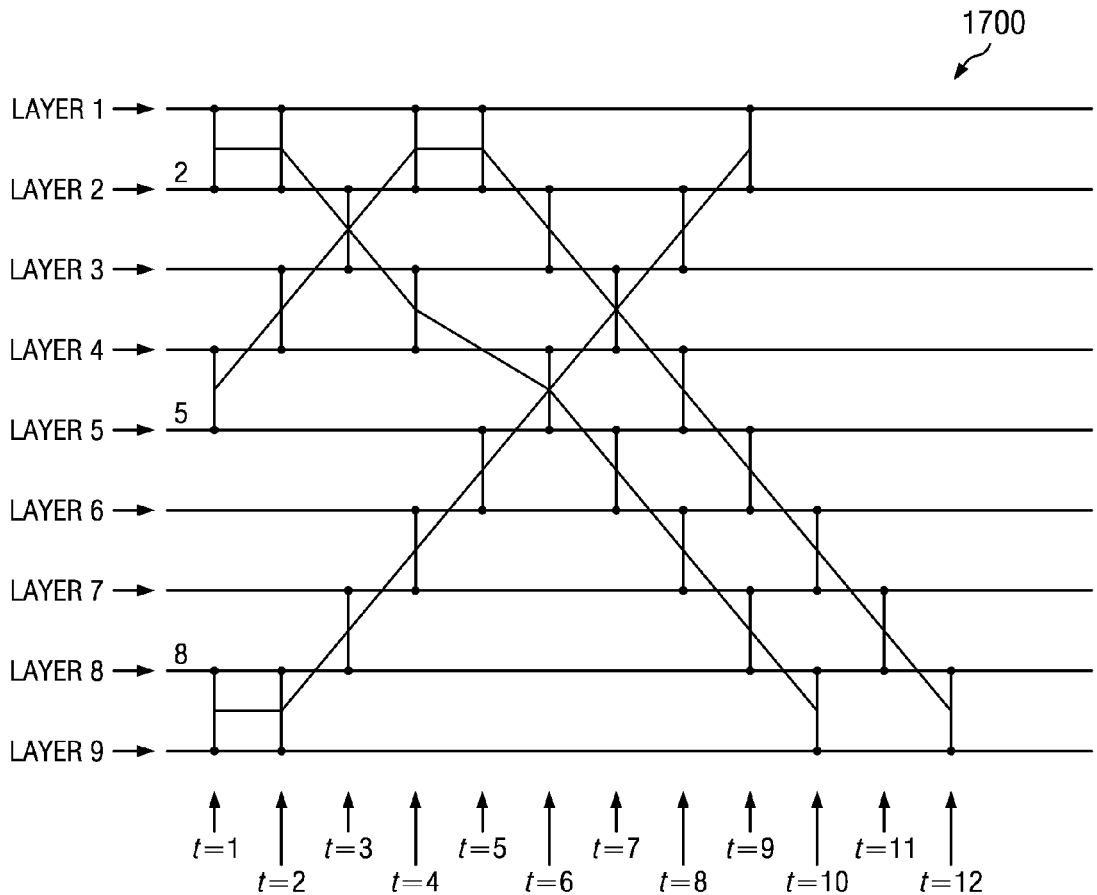
FIG. 17B illustrates the Parallel Sifting Algorithm as applied to a BDD having nine layers corresponding to nine variables.

FIG. 17B illustrates the Parallel Sifting Algorithm as applied to an example BDD 1700 where three variables are sifted in parallel. Suppose there are 9 variables and variables 2, 5, and 8 are the three variables at the three layers that currently have the largest sizes. Variable 2, 5, and 8 may be moved to their locally optimum positions using concurrent layer swapping in an iterative process. During each iteration variables 2, 5, and 8 may be sifted in parallel, as long as swapping the pairs of consecutive layers do not affect each other. More specifically, variable 2 may traverse upward until it reaches layer 1, and then downward until it reaches layer 9, which is the last layer of BDD 1700. Variable 5 may traverse upward first until it reaches layer 1, and then traverse downward until it reaches layer 9. Variable 8 traverses downward until it reaches layer 9, and then upward until it reaches layer 1. Although some of the variables may take more iterations to traverse through all the layers, and during some of the iterations, sifting one variable may affect sifting another variable (e.g., during the sixth iteration, variable 2 cannot be sifted because sifting variable 8 interferes with sifting variable 2), during most of the iterations, the three variables may be effectively parallelized (i.e., sifted concurrently by concurrently swapping three disjoint pairs of consecutive layers).

As each variable traverses among the 9 layers, when the variable is at each layer, the size of that layer may be determined. Thus, for variable 2, there are 9 sizes determined when variable 2 is at the 9 layers respectively. The layer that has the smallest size among the 9 sizes is the locally optimum layer for variable 2. Similarly, for variable 5, there are again 9 sizes determined when variable 5 is at the 9 layers respectively. The layer that has the smallest size among the second 9 sizes is the locally optimum layer for variable 5. Thus, for a given variable, the layer that yields the smallest size among all the layers when the variable is position at each of the layers is the locally optimum layer for that variable during the current iteration.

If the size of the BDD is not sufficiently small, then another three variables positioned at the three layers that currently have the largest sizes may be selected. The three variables may be moved to their locally optimum positions using the same process as described above with variables 2, 5, and 8.

BDDs have many practical applications, and the various algorithms disclosed in the present disclosure may be used with BDDs of any applications. For example, in the field of integrated circuit (IC) design, an IC may be used to implement a function, which may be represented by a BDD. Sometimes, a property that an IC design needs to satisfy may be represented by a BDD, which may then be used in connection with formally verifying the design of the circuit. In the field of healthcare, BDDs may be used to represent data collected by medical sensors. In the field of formal verification, BDDs may be used to model transition relations or reachable state spaces along with their respective properties. In the context of hardware and software systems, formal verification is the act of proving or disproving the correctness of intended algorithms underlying a system with respect to a certain formal specification or property, using formal methods of mathematics. The verification of these hardware and software systems is done by providing a formal proof on an abstract mathematical model of a system, the correspondence between the mathematical model and the nature of the system being otherwise known by construction. Examples of mathematical objects often used to model systems are: finite state machines, labeled transition systems, Petri nets, timed automata, hybrid automata, process algebra, formal semantics of programming languages such as operational semantics, denotation semantics, axiomatic semantics and Hoare logic.

A BDD, or more specifically, the data that form the BDD, may be stored in a computer-readable non-transitory storage medium. When the variables of the BDD are reordered using any of the algorithms described in this disclosure, the data are transformed as embodied by the computer-readable non-transitory storage medium.

In particular embodiments, any set of integers may be represented as a Boolean function, and the Boolean function may be represented by a BDD. Given a set of integers, particular embodiments may determine the minimum number of bits required to represent the largest integer in the set. This number of bits is the number of variables of the Boolean function. Then, for each integer in the set, the Boolean function evaluates to TRUE, and for any integer not in the set, the Boolean function evaluates to FALSE.

For example, consider a set of integers, $\{1, 3, 5, 6\}$. The largest integer in the set is 6, which requires 3 bits. Thus, the Boolean function used to represent this set of integers requires 3 variables, $x_1$, $x_2$, and $x_3$. The following table illustrates the values of the 3 variables and the Boolean function as they are used to represent $\{1, 3, 5, 6\}$:

| Decimal Value | Binary Value $x_1, x_2, x_3$ | $f(x_1, x_2, x_3)$ |
| --- | --- | --- |
| 0 | 0 0 0 | 0 |
| 1 | 0 0 1 | 1 |
| 2 | 0 1 0 | 0 |
| 3 | 0 1 1 | 1 |
| 4 | 1 0 0 | 0 |
| 5 | 1 0 1 | 1 |
| 6 | 1 1 0 | 1 |
| 7 | 1 1 1 | 0 |

Figure 18:
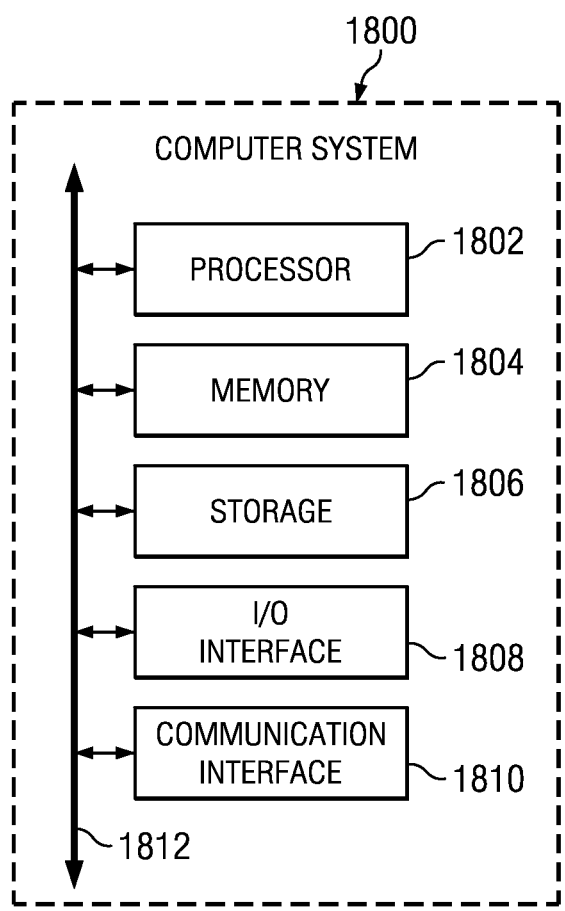
FIG. 18 illustrates an example computing device.

Particular embodiments may be implemented on one or more computer systems. FIG. 18 illustrates an example computer system 1800. In particular embodiments, one or more computer systems 1800 perform one or more steps of one or more methods described or illustrated herein. In particular embodiments, one or more computer systems 1800 provide functionality described or illustrated herein. In particular embodiments, software running on one or more computer systems 1800 performs one or more steps of one or more methods described or illustrated herein or provides functionality described or illustrated herein. Particular embodiments include one or more portions of one or more computer systems 1800.

This disclosure contemplates any suitable number of computer systems 1800. This disclosure contemplates computer system 1800 taking any suitable physical form. As example and not by way of limitation, computer system 1800 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, or a combination of two or more of these. Where appropriate, computer system 1800 may include one or more computer systems 1800; be unitary or distributed; span multiple locations; span multiple machines; or reside in a cloud, which may include one or more cloud components in one or more networks. Where appropriate, one or more computer systems 1800 may perform without substantial spatial or temporal limitation one or more steps of one or more methods described or illustrated herein. As an example and not by way of limitation, one or more computer systems 1800 may perform in real time or in batch mode one or more steps of one or more methods described or illustrated herein. One or more computer systems 1800 may perform at different times or at different locations one or more steps of one or more methods described or illustrated herein, where appropriate.

In particular embodiments, computer system 1800 includes a processor 1802, memory 1804, storage 1806, an input/output (I/O) interface 1808, a communication interface 1810, and a bus 1812. Although this disclosure describes and illustrates a particular computer system having a particular number of particular components in a particular arrangement, this disclosure contemplates any suitable computer system having any suitable number of any suitable components in any suitable arrangement.

In particular embodiments, processor 1802 includes hardware for executing instructions, such as those making up a computer program. As an example and not by way of limitation, to execute instructions, processor 1802 may retrieve (or fetch) the instructions from an internal register, an internal cache, memory 1804, or storage 1806; decode and execute them; and then write one or more results to an internal register, an internal cache, memory 1804, or storage 1806. In particular embodiments, processor 1802 may include one or more internal caches for data, instructions, or addresses. The present disclosure contemplates processor 1802 including any suitable number of any suitable internal caches, where appropriate. As an example and not by way of limitation, processor 1802 may include one or more instruction caches, one or more data caches, and one or more translation lookaside buffers (TLBs). Instructions in the instruction caches may be copies of instructions in memory 1804 or storage 1806, and the instruction caches may speed up retrieval of those instructions by processor 1802. Data in the data caches may be copies of data in memory 1804 or storage 1806 for instructions executing at processor 1802 to operate on; the results of previous instructions executed at processor 1802 for access by subsequent instructions executing at processor 1802 or for writing to memory 1804 or storage 1806; or other suitable data. The data caches may speed up read or write operations by processor 1802. The TLBs may speed up virtual-address translation for processor 1802. In particular embodiments, processor 1802 may include one or more internal registers for data, instructions, or addresses. The present disclosure contemplates processor 1802 including any suitable number of any suitable internal registers, where appropriate. Where appropriate, processor 1802 may include one or more arithmetic logic units (ALUs); be a multi-core processor; or include one or more processors 1802. Although this disclosure describes and illustrates a particular processor, this disclosure contemplates any suitable processor.

In particular embodiments, memory 1804 includes main memory for storing instructions for processor 1802 to execute or data for processor 1802 to operate on. As an example and not by way of limitation, computer system 1800 may load instructions from storage 1806 or another source (such as, for example, another computer system 1800) to memory 1804. Processor 1802 may then load the instructions from memory 1804 to an internal register or internal cache. To execute the instructions, processor 1802 may retrieve the instructions from the internal register or internal cache and decode them. During or after execution of the instructions, processor 1802 may write one or more results (which may be intermediate or final results) to the internal register or internal cache. Processor 1802 may then write one or more of those results to memory 1804. In particular embodiments, processor 1802 executes only instructions in one or more internal registers or internal caches or in memory 1804 (as opposed to storage 1806 or elsewhere) and operates only on data in one or more internal registers or internal caches or in memory 1804 (as opposed to storage 1806 or elsewhere). One or more memory buses (which may each include an address bus and a data bus) may couple processor 1802 to memory 1804. Bus 1812 may include one or more memory buses, as described below. In particular embodiments, one or more memory management units (MMUs) reside between processor 1802 and memory 1804 and facilitate accesses to memory 1804 requested by processor 1802. In particular embodiments, memory 1804 includes random access memory (RAM). This RAM may be volatile memory, where appropriate Where appropriate, this RAM may be dynamic RAM (DRAM) or static RAM (SRAM). Moreover, where appropriate, this RAM may be single-ported or multi-ported RAM. The present disclosure contemplates any suitable RAM. Memory 1804 may include one or more memories 1804, where appropriate. Although this disclosure describes and illustrates particular memory, this disclosure contemplates any suitable memory.

In particular embodiments, storage 1806 includes mass storage for data or instructions. As an example and not by way of limitation, storage 1806 may include an HDD, a floppy disk drive, flash memory, an optical disc, a magneto-optical disc, magnetic tape, or a Universal Serial Bus (USB) drive or a combination of two or more of these. Storage 1806 may include removable or non-removable (or fixed) media, where appropriate. Storage 1806 may be internal or external to computer system 1800, where appropriate. In particular embodiments, storage 1806 is non-volatile, solid-state memory. In particular embodiments, storage 1806 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1806 taking any suitable physical form. Storage 1806 may include one or more storage control units facilitating communication between processor 1802 and storage 1806, where appropriate. Where appropriate, storage 1806 may include one or more storages 1806. Although this disclosure describes and illustrates particular storage, this disclosure contemplates any suitable storage.

In particular embodiments, I/O interface 1808 includes hardware, software, or both providing one or more interfaces for communication between computer system 1800 and one or more I/O devices. Computer system 1800 may include one or more of these I/O devices, where appropriate. One or more of these I/O devices may enable communication between a person and computer system 1800. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1808 for them. Where appropriate, I/O interface 1808 may include one or more device or software drivers enabling processor 1802 to drive one or more of these I/O devices. I/O interface 1808 may include one or more I/O interfaces 1808, where appropriate. Although this disclosure describes and illustrates a particular I/O interface, this disclosure contemplates any suitable I/O interface.

In particular embodiments, communication interface 1810 includes hardware, software, or both providing one or more interfaces for communication (such as, for example, packet-based communication) between computer system 1800 and one or more other computer systems 1800 or one or more networks. As an example and not by way of limitation, communication interface 1810 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1810 for it. As an example and not by way of limitation, computer system 1800 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1800 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 1800 may include any suitable communication interface 1810 for any of these networks, where appropriate. Communication interface 1810 may include one or more communication interfaces 1810, where appropriate. Although this disclosure describes and illustrates a particular communication interface, this disclosure contemplates any suitable communication interface.

In particular embodiments, bus 1812 includes hardware, software, or both coupling components of computer system 1800 to each other. As an example and not by way of limitation, bus 1812 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCI-X) bus, a serial advanced technology attachment (SATA) bus, a Video Electronics Standards Association local (VLB) bus, or another suitable bus or a combination of two or more of these. Bus 1812 may include one or more buses 1812, where appropriate. Although this disclosure describes and illustrates a particular bus, this disclosure contemplates any suitable bus or interconnect.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

This disclosure contemplates one or more computer-readable storage media implementing any suitable storage. In particular embodiments, a computer-readable storage medium implements one or more portions of processor 1802 (such as, for example, one or more internal registers or caches), one or more portions of memory 1804, one or more portions of storage 1806, or a combination of these, where appropriate. In particular embodiments, a computer-readable storage medium implements RAM or ROM. In particular embodiments, a computer-readable storage medium implements volatile or persistent memory. In particular embodiments, one or more computer-readable storage media embody software. Herein, reference to software may encompass one or more applications, bytecode, one or more computer programs, one or more executables, one or more instructions, logic, machine code, one or more scripts, or source code, and vice versa, where appropriate. In particular embodiments, software includes one or more application programming interfaces (APIs). This disclosure contemplates any suitable software written or otherwise expressed in any suitable programming language or combination of programming languages. In particular embodiments, software is expressed as source code or object code. In particular embodiments, software is expressed in a higher-level programming language, such as, for example, C, Perl, or a suitable extension thereof. In particular embodiments, software is expressed in a lower-level programming language, such as assembly language (or machine code). In particular embodiments, software is expressed in JAVA. In particular embodiments, software is expressed in Hyper Text Markup Language (HTML), Extensible Markup Language (XML), or other suitable markup language.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

What is claimed is:

1. A method comprising: by one or more computing devices,
   accessing a binary decision diagram (BDD) representing a function having n variables, where $n \geq 2$, wherein the BDD comprises n layers corresponding to the n variables, respectively; and
   reordering the n variables of the BDD by iteratively and alternating reordering k consecutive layers, where $1 < k \leq n$, until a size of the BDD has reached a desired threshold, wherein each first-level iteration comprises:
   selecting k consecutive layers from the n layers, wherein the k consecutive layers selected during a current first-level iteration differ from the k consecutive layers selected during a previous first-level iteration immediately preceding the current first-level iteration;
   determining a locally optimum variable order of the k consecutive layers, comprising iteratively and alternatingly swapping one or more first disjoint pairs of consecutive layers of the k consecutive layers during each odd second-level iteration and one or more second disjoint pairs of consecutive layers of the k consecutive layers during each even second-level iteration, until the locally optimum variable order of the k consecutive layers is determined; and reordering the k consecutive layers according to the locally optimum variable order of the k consecutive layers.

2. The method of claim 1, wherein during each first-level iteration, when determining the locally optimum variable order of the k consecutive layers starting at layer j of the n layers,
swapping the one or more first disjoint pairs of consecutive layers during each odd second-level iteration comprises, for each first disjoint pair of consecutive layers comprising layer $j_1$ and layer $j_1+1$, where $j_1$ is odd and $j \le j_1 \le j+k-2$, swapping the layer $j_1$ and the layer $j_1+1$; and
swapping the one or more second disjoint pairs of consecutive layers during each even second-level iteration comprises, for each second disjoint pair of consecutive layers comprising layer $j_2$ and layer $j_2+1$, where $j_2$ is even and $j \le j_2 \le j+k-2$, swapping the layer $j_2$ and the layer $j_2+1$.

3. The method of claim 1, wherein during each first-level iteration, when determining the locally optimum variable order of the k consecutive layers starting at layer j of the n layers,
swapping the one or more first disjoint pairs of consecutive layers during each odd second-level iteration comprises, for each first disjoint pair of consecutive layers comprising layer $j_1$ and layer $j_1+1$, where $j_1$ is even and $j < j_1 \le j+k-2$, swapping the layer $j_1$ and the layer $j_1+1$; and
swapping the one or more second disjoint pairs of consecutive layers during each even second-level iteration comprises, for each second disjoint pair of consecutive layers comprising layer $j_2$ and layer $j_2+1$, where $j_2$ is odd and $j \le j_2 \le j+k-2$, swapping the layer $j_2$ and the layer $j_2+1$.

4. The method of claim 1, wherein, during each first-level iteration, the one or more first disjoint pairs of consecutive layers are swapped concurrently during each odd second-level iteration, and the one or more second disjoint pairs of consecutive layers are swapped concurrently during each even second-level iteration.

5. The method of claim 1, wherein:
the BDD is data embodied by a computer-readable non-transitory storage medium; and
reordering the n variables of the BDD transforms one or more data of the BDD as embodied by the computer-readable non-transitory storage medium.

6. The method of claim 1, wherein the function represented by the BDD represents data collected by a medical sensor.

7. The method of claim 1, wherein a design of an electronic circuit embodies the function represented by the BDD.

8. The method of claim 1, wherein the function represented by the BDD defines a property of an electronic circuit that the electronic circuit should satisfy.

9. The method of claim 1, wherein the function represented by the BDD defines one or more transition relations or one or more reachable state spaces used in a formal verification of a system.

10. A system comprising:
a memory comprising instructions executable by one or more processors; and
the one or more processors coupled to the memory and operable to execute the instructions, the one or more processors being operable when executing the instructions to:
access a binary decision diagram (BDD) representing a function having n variables, where $n \ge 2$, wherein the BDD comprises n layers corresponding to the n variables, respectively; and
reorder the n variables of the BDD by iteratively and alternating reordering k consecutive layers, where $1 < k \le n$, until a size of the BDD has reached a desired threshold, wherein each first-level iteration comprises:
select k consecutive layers from the n layers, wherein the k consecutive layers selected during a current first-level iteration differ from the k consecutive layers selected during a previous first-level iteration immediately preceding the current first-level iteration;
determine a locally optimum variable order of the k consecutive layers, comprising iteratively and alternatingly swap one or more first disjoint pairs of consecutive layers of the k consecutive layers during each odd second-level iteration and one or more second disjoint pairs of consecutive layers of the k consecutive layers during each even second-level iteration, until the locally optimum variable order of the k consecutive layers is determined; and
reorder the k consecutive layers according to the locally optimum variable order of the k consecutive layers.

11. The system of claim 10, wherein during each first-level iteration, when determining the locally optimum variable order of the k consecutive layers starting at layer j of the n layers,
swapping the one or more first disjoint pairs of consecutive layers during each odd second-level iteration comprises, for each first disjoint pair of consecutive layers comprising layer $j_1$ and layer $j_1+1$, where $j_1$ is odd and $j \le j_1 \le j+k-2$, swap the layer $j_1$ and the layer $j_1+1$; and
swapping the one or more second disjoint pairs of consecutive layers during each even second-level iteration comprises, for each second disjoint pair of consecutive layers comprising layer $j_2$ and layer $j_2+1$, where $j_2$ is even and $j \le j_2 \le j+k-2$, swap the layer $j_2$ and the layer $j_2+1$.

12. The system of claim 10, wherein during each first-level iteration, when determining the locally optimum variable order of the k consecutive layers starting at layer j of the n layers,
swapping the one or more first disjoint pairs of consecutive layers during each odd second-level iteration comprises, for each first disjoint pair of consecutive layers comprising layer $j_1$ and layer $j_1+1$, where $j_1$ is even and $j \le j_1 \le j+k-2$, swap the layer $j_1$ and the layer $j_1+1$; and
swapping the one or more second disjoint pairs of consecutive layers during each even second-level iteration comprises, for each second disjoint pair of consecutive layers comprising layer $j_2$ and layer $j_2+1$, where $j_2$ is odd and $j \le j_2 \le j+k-2$, swap the layer $j_2$ and the layer $j_2+1$.

13. The system of claim 10, wherein, during each first-level iteration, the one or more first disjoint pairs of consecutive layers are swapped concurrently during each odd second-level iteration, and the one or more second disjoint pairs of consecutive layers are swapped concurrently during each even second-level iteration.

14. The system of claim 10, wherein:
the BDD is data embodied by a computer-readable non-transitory storage medium; and
reordering the n variables of the BDD transforms one or more data of the BDD as embodied by the computer-readable non-transitory storage medium.

15. The system of claim 10, wherein the function represented by the BDD represents data collected by a medical sensor.

16. The system of claim 10, wherein a design of an electronic circuit embodies the function represented by the BDD.

17. The system of claim 10, wherein the function represented by the BDD defines a property of an electronic circuit that the electronic circuit should satisfy.

18. The system of claim 10, wherein the function represented by the BDD defines one or more transition relations or one or more reachable state spaces used in a formal verification of a system.

19. One or more computer-readable non-transitory storage media embodying software operable when executed by one or more computer systems to:
  access a binary decision diagram (BDD) representing a function having n variables, where n≥2, wherein the BDD comprises n layers corresponding to the n variables, respectively; and
  reorder the n variables of the BDD by iteratively and alternating reordering k consecutive layers, where 1<k≤n, until a size of the BDD has reached a desired threshold, wherein each first-level iteration comprises:
    select k consecutive layers from the n layers, wherein the k consecutive layers selected during a current first-level iteration differ from the k consecutive layers selected during a previous first-level iteration immediately preceding the current first-level iteration;
    determine a locally optimum variable order of the k consecutive layers, comprising iteratively and alternatingly swap one or more first disjoint pairs of consecutive layers of the k consecutive layers during each odd second-level iteration and one or more second disjoint pairs of consecutive layers of the k consecutive layers during each even second-level iteration, until the locally optimum variable order of the k consecutive layers is determined; and
    reorder the k consecutive layers according to the locally optimum variable order of the k consecutive layers.

20. The media of claim 19, wherein during each first-level iteration, when determining the locally optimum variable order of the k consecutive layers starting at layer j of the n layers,
  swapping the one or more first disjoint pairs of consecutive layers during each odd second-level iteration comprises, for each first disjoint pair of consecutive layers comprising layer $j_1$ and layer $j_1+1$, where $j_1$ is odd and $j \le j_1 \le j+k-2$, swap the layer $j_1$ and the layer $j_1+1$; and
  swapping the one or more second disjoint pairs of consecutive layers during each even second-level iteration comprises, for each second disjoint pair of consecutive layers comprising layer $j_2$ and layer $j_2+1$, where $j_2$ is even and $j \le j_2 \le j+k-2$, swap the layer $j_2$ and the layer $j_2+1$.

21. The media of claim 19, wherein during each first-level iteration, when determining the locally optimum variable order of the k consecutive layers starting at layer j of the n layers,
  swapping the one or more first disjoint pairs of consecutive layers during each odd second-level iteration comprises, for each first disjoint pair of consecutive layers comprising layer $j_1$ and layer $j_1+1$, where $j_1$ is even and $j \le j_1 \le j+k-2$, swap the layer $j_1$ and the layer $j_1+1$; and
  swapping the one or more second disjoint pairs of consecutive layers during each even second-level iteration comprises, for each second disjoint pair of consecutive layers comprising layer $j_2$ and layer $j_2+1$, where $j_2$ is odd and $j<j_2$ $j+k-2$, swap the layer $j_2$ and the layer $j_2+1$.

22. The media of claim 19, wherein, during each first-level iteration, the one or more first disjoint pairs of consecutive layers are swapped concurrently during each odd second-level iteration, and the one or more second disjoint pairs of consecutive layers are swapped concurrently during each even second-level iteration.

23. The media of claim 19, wherein:
  the BDD is data embodied by a computer-readable non-transitory storage medium; and
  reordering the n variables of the BDD transforms one or more data of the BDD as embodied by the computer-readable non-transitory storage medium.

24. The media of claim 19, wherein the function represented by the BDD represents data collected by a medical sensor.

25. The media of claim 19, wherein a design of an electronic circuit embodies the function represented by the BDD.

26. The media of claim 19, wherein the function represented by the BDD defines a property of an electronic circuit that the electronic circuit should satisfy.

27. The media of claim 19, wherein the function represented by the BDD defines one or more transition relations or one or more reachable state spaces used in a formal verification of a system.

28. A system comprising:
  means for accessing a binary decision diagram (BDD) representing a function having n variables, where n≥2, wherein the BDD comprises n layers corresponding to the n variables, respectively; and
  means for reordering the n variables of the BDD by iteratively and alternating reordering k consecutive layers, where 1<k≤n, until a size of the BDD has reached a desired threshold, wherein each first-level iteration comprises:
    means for selecting k consecutive layers from the n layers, wherein the k consecutive layers selected during a current first-level iteration differ from the k consecutive layers selected during a previous first-level iteration immediately preceding the current first-level iteration;
    means for determining a locally optimum variable order of the k consecutive layers, comprising means for iteratively and alternatingly swapping one or more first disjoint pairs of consecutive layers of the k consecutive layers during each odd second-level iteration and one or more second disjoint pairs of consecutive layers of the k consecutive layers during each even second-level iteration, until the locally optimum variable order of the k consecutive layers is determined; and
    means for reordering the k consecutive layers according to the locally optimum variable order of the k consecutive layers.

* * * * *

UNITED STATES PATENT AND TRADEMARK OFFICE
CERTIFICATE OF CORRECTION

PATENT NO. : 8,600,927 B2  
APPLICATION NO. : 12/901983  
DATED : December 3, 2013  
INVENTOR(S) : Stergios Stergiou et al.

Page 1 of 1

It is certified that error appears in the above-identified patent and that said Letters Patent is hereby corrected as shown below:

In the Claims

Col. 37, Ln. 25-26: After "is even and" and before "swapping" delete "$j < j_1\ j + k - 2$," and insert --$j \leq j_1 \leq j + k - 2$,--.

Col. 40, Ln. 3: After "and" and before "swap" delete "$j < j_2\ j + k - 2$," and insert --$j \leq j_2 \leq j + k - 2$,--.

Signed and Sealed this  
Seventh Day of October, 2014

Michelle K. Lee  
*Deputy Director of the United States Patent and Trademark Office*